US011193992B2

(12) United States Patent
Yang et al.

(10) Patent No.: US 11,193,992 B2
(45) Date of Patent: Dec. 7, 2021

(54) SINGLE LAYER MAGNETIC RESONANCE IMAGING (MRI) TRANSMIT/RECEIVE (TX/RX) RADIO FREQUENCY (RF) COIL WITH INDUCED CURRENT FAILSAFE PROTECTION

(71) Applicant: Quality Electrodynamics, LLC, Mayfield Village, OH (US)

(72) Inventors: Xiaoyu Yang, Indiana, PA (US); Haoqin Zhu, Mayfield Village, OH (US); Tsinghua Zheng, Chesterland, OH (US)

(73) Assignee: Quality Electrodynamics, LLC, Mayfield Village, OH (US)

(*) Notice: Subject to any disclaimer, the term of this patent is extended or adjusted under 35 U.S.C. 154(b) by 591 days.

(21) Appl. No.: 15/971,075

(22) Filed: May 4, 2018

(65) Prior Publication Data
US 2018/0321339 A1 Nov. 8, 2018

Related U.S. Application Data

(60) Provisional application No. 62/502,074, filed on May 5, 2017.

(51) Int. Cl.
*G01R 33/34* (2006.01)
*G01R 33/36* (2006.01)
*G01R 33/3415* (2006.01)

(52) U.S. Cl.
CPC ... *G01R 33/34084* (2013.01); *G01R 33/3415* (2013.01); *G01R 33/34076* (2013.01);
(Continued)

(58) Field of Classification Search
CPC ........ G01R 33/34076; G01R 33/34084; G01R 33/3415; G01R 33/36; G01R 33/3614;
(Continued)

(56) References Cited

U.S. PATENT DOCUMENTS

| 4,680,549 A | 7/1987 | Tanttu |
| 4,825,162 A | 4/1989 | Roemer et al. |

(Continued)

FOREIGN PATENT DOCUMENTS

WO 20150043612 A1 4/2015

OTHER PUBLICATIONS

W. Wang, et al., "Inductive Coupled Local TX Coil Design", Proc. Intl. Soc. Mag. Reson. Med. 18 (2010).
(Continued)

*Primary Examiner* — Rishi R Patel
(74) *Attorney, Agent, or Firm* — Eschweiler & Potashnik, LLC

(57) ABSTRACT

A single-layer magnetic resonance imaging (MRI) radio frequency (RF) coil element configured to operate in a transmit (Tx) mode and a receive (Rx) mode, the coil element comprising: an LC coil and a failsafe circuit electrically connected with the LC coil, where the LC coil, upon resonating with a primary coil of an MRI system, generates a local amplified Tx field based on an induced current generated in the LC coil by inductive coupling between the LC coil and the primary coil, where the failsafe circuit provides, upon injection of a forward DC bias current into the failsafe circuit, a first impedance, and upon the absence of the forward DC bias current, a second, higher impedance; where the failsafe circuit, upon the single-layer MRI RF coil array element being disconnected from an MRI system, provides the second, higher impedance, and reduces the magnitude of the induced current.

23 Claims, 30 Drawing Sheets

(52) U.S. Cl.
CPC ......... *G01R 33/36* (2013.01); *G01R 33/3614* (2013.01); *G01R 33/3628* (2013.01); *G01R 33/3642* (2013.01); *G01R 33/3657* (2013.01)

(58) Field of Classification Search
CPC ............ G01R 33/3628; G01R 33/3642; G01R 33/3657
See application file for complete search history.

(56) References Cited

U.S. PATENT DOCUMENTS

| | | | |
|---|---|---|---|
| 4,987,370 | A | 1/1991 | Leussler et al. |
| 5,355,087 | A | 10/1994 | Claiborne |
| 5,386,191 | A | 1/1995 | McCarten |
| 5,455,595 | A | 10/1995 | Yokoyama |
| 5,777,474 | A | 7/1998 | Srinivasan |
| 5,903,150 | A | 5/1999 | Roznitsky |
| 5,910,728 | A | 6/1999 | Sodickson |
| 6,177,797 | B1 | 1/2001 | Srinivasan |
| 6,249,121 | B1 | 6/2001 | Boskamp |
| 6,323,648 | B1 | 11/2001 | Belt |
| 6,529,005 | B1 | 3/2003 | Kasten |
| 6,791,328 | B1 | 9/2004 | Nabetani |
| 6,982,554 | B2 | 1/2006 | Kurpad et al. |
| 7,180,296 | B2 | 2/2007 | Gross |
| 7,663,367 | B2 | 2/2010 | Wiggins |
| 8,269,499 | B2 | 9/2012 | Hamamura et al. |
| 9,097,769 | B2 | 8/2015 | Schillak |
| 9,274,189 | B2 | 1/2016 | Soutome |
| 9,459,331 | B2 | 10/2016 | Otake |
| 9,541,614 | B2 | 1/2017 | Soutome |
| 9,638,771 | B2 | 5/2017 | Soutome |
| 9,880,242 | B2 | 1/2018 | Darnell |
| 10,168,402 | B2 | 1/2019 | Gunamony |
| 10,261,145 | B2 | 4/2019 | Wald |
| 10,324,147 | B2 | 6/2019 | McNulty |
| 2002/0169374 | A1 | 11/2002 | Jevtic |
| 2004/0100260 | A1* | 5/2004 | Jevtic ................. G01R 33/3657 324/311 |
| 2006/0071661 | A1 | 4/2006 | Ong |
| 2009/0121482 | A1 | 5/2009 | Rickard |
| 2010/0213941 | A1 | 8/2010 | Driesel et al. |
| 2011/0118723 | A1 | 5/2011 | Turner |
| 2012/0223709 | A1 | 9/2012 | Schillak et al. |
| 2012/0262173 | A1 | 10/2012 | Soutome et al. |
| 2012/0326515 | A1 | 12/2012 | Murai |
| 2013/0063147 | A1 | 3/2013 | Findeklee |
| 2013/0119991 | A1 | 5/2013 | Soutome et al. |
| 2013/0314091 | A1 | 11/2013 | Otake et al. |
| 2015/0260821 | A1 | 9/2015 | Biber |
| 2015/0323628 | A1 | 11/2015 | Wald et al. |
| 2015/0338478 | A1 | 11/2015 | Schillak et al. |
| 2016/0033594 | A1* | 2/2016 | Yang .................. G01R 33/3657 324/322 |
| 2016/0033598 | A1* | 2/2016 | Hamamura ........ G01R 33/3642 324/307 |
| 2016/0116556 | A1 | 4/2016 | Darnell et al. |
| 2016/0131728 | A1* | 5/2016 | Biber ................. G01R 33/3642 324/309 |
| 2016/0209481 | A1 | 7/2016 | Gunamony et al. |
| 2016/0231400 | A1 | 8/2016 | Fath et al. |
| 2016/0254705 | A1 | 9/2016 | Jung |
| 2016/0334479 | A1 | 11/2016 | Poole et al. |
| 2017/0146622 | A1 | 5/2017 | Yang et al. |
| 2018/0081008 | A1 | 3/2018 | Yang |
| 2018/0275226 | A1 | 9/2018 | Yang |
| 2018/0275233 | A1 | 9/2018 | Yang |
| 2018/0275234 | A1 | 9/2018 | Han et al. |
| 2018/0313918 | A1 | 11/2018 | Yang |
| 2018/0321339 | A1 | 11/2018 | Yang |
| 2018/0364318 | A1 | 12/2018 | Yang |
| 2020/0065020 | A1 | 2/2020 | Tai |

OTHER PUBLICATIONS

International Search Report and Written Opinion dated Nov. 9, 2017 in connection with International Patent Application No. PCT/US2017/042590.
U.S. Appl. No. 15/706,005, filed Sep. 15, 2017.
U.S. Appl. No. 15/583,345, filed May 1, 2017.
U.S. Appl. No. 15/933,860, filed Mar. 23, 2018.
U.S. Appl. No. 15/923,437, filed Mar. 16, 2018.
U.S. Appl. No. 15/964,390, filed Apr. 27, 2018.
Non-Final Office Action dated Nov. 18, 2019 in connection with U.S. Appl. No. 15/706,005.
Notice of Allowance dated Jan. 10, 2020 in connection with U.S. Appl. No. 15/964,390.
Non-Final Office Action dated Nov. 8, 2018 in connection with U.S. Appl. No. 15/583,345.
Wang J., "A Novel Method to Reduce the Signal Coupling of Surface Coils for MRI", Proc. ISMRM 4:1434 (1996).
Jovan Jevtic, "Ladder Networks for Capacitive Decoupling in Phased-Array Coils", Proc. Intl. Soc. Mag. Reson. Med 9 (2001).
Klaas P. Pruessmann et al., "SENSE: Sensitivity Encoding for Fast MRI", Magnetic Resonance in Medicine 42:952-962 (1999).
Ulrich Katscher et al, "Transmit SENSE", Magnetic Resonance in Medicine 49:144-150 (2003).
U.S. Appl. No. 16/009,546, filed Jun. 15, 2018.
Notice of Allowance dated Jul. 31, 2020 in connection with U.S. Appl. No. 15/706,005.
Notice of Allowance dated Apr. 10, 2019 in connection with U.S. Appl. No. 15/583,345.
Non-Final Office Action dated Aug. 13, 2020 in connection with U.S. Appl. No. 15/923,437.

\* cited by examiner

SINGLE LAYER MAGNETIC RESONANCE IMAGING (MRI) TRANSMIT/RECEIVE (TX/RX) RADIO FREQUENCY (RF) COIL WITH INDUCED CURRENT FAILSAFE PROTECTION

RELATED APPLICATIONS

This application claims priority to and the benefit of U.S. Provisional Patent Application 62/502,074 filed May 5, 2017.

BACKGROUND

A magnetic resonance imaging (MRI) radio frequency (RF) coil may experience an induced current when operating in a transmit (Tx) mode. For example, an MRI RF coil may experience large induced currents when the MRI RF coil is within an area subject to a whole body coil's (WBC) or other primary coil's transmitting field (Tx field) coverage. This is, in most situations, expected and safe behavior. Safety regulations may require that an MRI coil be safe even if the coil is not connected to an MRI system. For example, a disconnected MRI coil may be left in the vicinity of an MRI system due to operator error. If the disconnected MRI coil does not have Tx decoupling means, large induced currents may be caused to flow within the disconnected MRI coil by a Tx field. These unintended large induced currents may damage the disconnected MRI coil, or may be dangerous to a person or other subject that comes into contact with the disconnected MRI coil that is subjected to the large induced currents. For example, the unintended large current may excessively heat the disconnected MRI coil or associated components, presenting a health risk to people who may come into contact with the disconnected MRI coil.

An MRI system may include two kinds of MRI RF coils. The first kind of MRI RF coil is a Tx coil. A Tx coil, while operating in Tx mode, transmits high power RF energy into the anatomy of the subject being imaged to excite nuclei spins in the tissue being imaged. The second kind of MRI RF coil is a receive (Rx) coil. An Rx coil, while operating in Rx mode, detects weak signals from nuclei spins of the anatomy being imaged. A conventional MRI system uses a built-in WBC as a Tx coil. In a conventional MRI system, due to the geometric size of the WBC, the WBC applies RF energy to a much larger region of tissue than is required to image a given region of interest. For example, when a head scan is performed and a WBC is used, not only the head, but also the shoulders and chest also receive a high level of RF energy. This creates a high level specific absorption rate (SAR) issue which limits the clinical utility of MRI systems that use a conventional WBC/Rx coil approach. As a result, a local Tx coil is frequently used to mitigate the SAR problem.

A local Tx coil is designed to apply RF energy into only the anatomy being imaged. There are two conventional approaches to transmitting energy from a power source to a local Tx coil. A first conventional approach is to use a direct connection between the power source to the Tx coil using wires. A direct connection using wires is energy efficient because the energy loss in the connection wires is trivial. A disadvantage of direct connection using wires is that dedicated wiring is required, which increases the cost and complexity of the coil.

A second conventional approach to transmitting energy from a power source to a local Tx coil is to use inductive coupling. For the inductive coupling approach, a primary coil is used to directly connect to a power source. The primary coil may be a WBC or another large coil. The primary coil is a resonant LC circuit. A second coil is also used. The second coil is another resonant circuit and is inductively coupled to the primary coil. Thus, energy can be transferred from the primary coil to the second coil. The second coil can be used to excite nearby anatomy more efficiently than the WBC because the second coil is smaller and closer to the nearby anatomy than the WBC. Compared to the first approach using a direct connection with wires, the inductive coupling approach may be less efficient than direct wiring but is still more efficient than a conventional WBC. One benefit of the inductive coupling approach is that no special wiring is required. However, conventional inductive coupling approaches require the use of multiple coils. For example, a conventional inductively coupled knee coil uses two layers of RF coils. The first (inner) layer includes a plurality of Rx coil elements which detect signals from the anatomy while operating in Rx mode, and which are decoupled from the transmitting field while operating in Tx mode. The second (outer) layer may be a standard birdcage coil which inductively couples to a WBC to create a local amplified transmitting field in Tx mode and which is disabled in Rx mode. However, this conventional inductively coupled dual layer coil has drawbacks. For example, all the individual Rx coil elements in a conventional dual layer coil need associated circuits for decoupling the Rx coil and the local Tx coil while operating in Tx mode. Conventional inductively coupled dual layer coils also require circuits for switching off the Tx coil while operating in Rx mode, which require complex and expensive control circuits. This leads to complex and expensive coils. These multiple decoupling circuits and complex control circuits can also decrease the signal to noise ratio (SNR), thereby reducing image quality. Furthermore, the outer layer, by its proximity to the inner layer, will create additional noise when the inner layer is operating in Rx mode.

DETAILED DESCRIPTION

Figure 1:
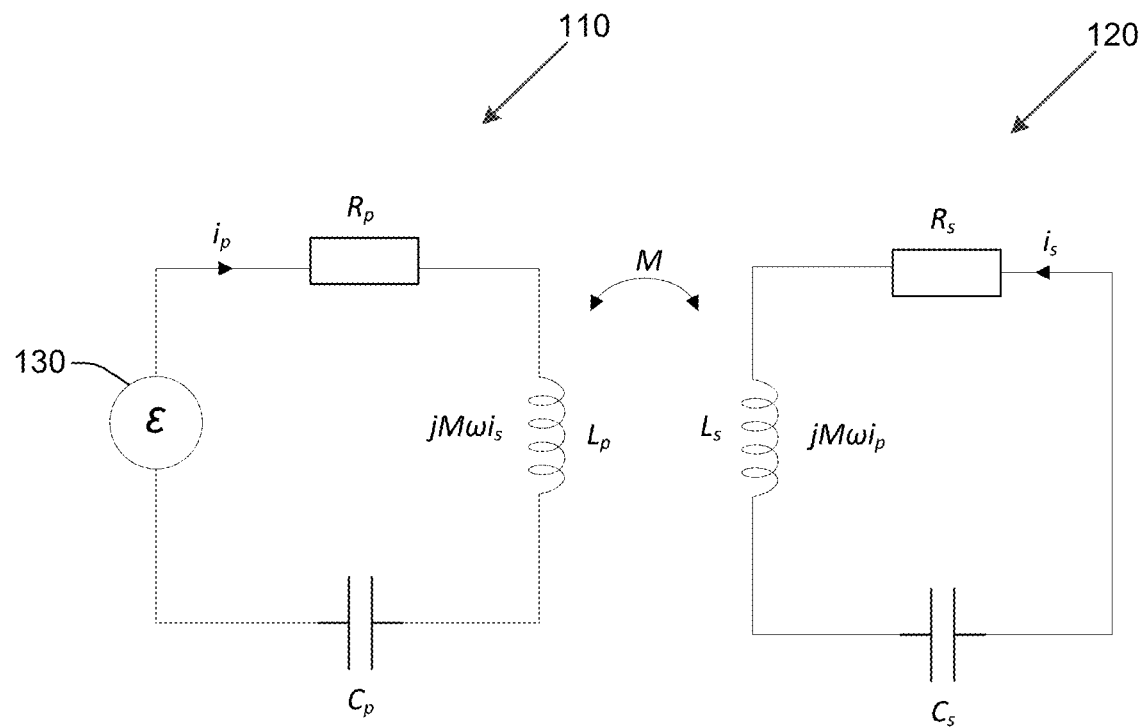
FIG. 1 illustrates inductively coupled resonant RF coils.

Embodiments described herein include a single-layer MRI RF coil element, or single-layer MRI RF coil array configured to be disabled upon a current induced in the MRI RF coil exceeding a threshold current magnitude. Exemplary single-layer MRI RF coils and coil arrays, when the single-layer MRI RF coil or coil array is not connected to an associated MRI system while the single-layer MRI RF coil or coil array is within an area subject to a WBC's or other primary coil's transmitting field coverage, may experience an induced current. A single-layer MRI RF coil resonates with a WBC or other primary coil during Tx mode. The magnitude of the induced current may be monitored by an MRI system to which the single-layer MRI RF coil is connected, if the single-layer MRI coil is actually connected to the MRI system and the MRI system is in use. However, if the single-layer MRI RF coil is not connected to the MRI system, or the MRI system does not know of the presence of the coil, then the MRI system conventionally cannot monitor the induced current experienced by the single-layer MRI RF coil. For example, a single-layer MRI RF coil may be unplugged (i.e., disconnected from the MRI system) and left in the bore of an MRI system, through user error or other circumstance, or the single-layer MRI RF coil may be disconnected from the MRI system due to a damaged cable, contact, or other hardware problem. In a situation in which the single-layer MRI RF coil is not connected to the MRI system, or where the current magnitude experienced by the single-layer MRI RF coil is not monitored, a large induced current may be induced in the single-layer MRI RF coil, which may cause an unsafe situation for a person or other subject interacting with the single-layer MRI RF coil, or may damage the coil.

In one embodiment of a single-layer MRI RF Tx/Rx coil that includes an LC circuit, a fuse is connected as part of the LC circuit. For example, an MRI RF Tx/Rx coil may include an LC coil, a transmit/receive switch circuit, and other Rx electronics. The LC circuit may include at least one capacitor, at least one inductor electrically connected with the at least one capacitor, and a fuse connected with the at least one capacitor or the at least one inductor. The LC circuit may resonate with a primary coil, and experience an induced current. The fuse is rated at a safety related threshold. The safety related threshold may be based on a root mean square (RMS) current. Upon the fuse experiencing an induced current that meets or exceeds the safety related threshold current, the fuse opens, thus preventing the LC circuit from resonating with the primary coil, and thus preventing damage to the MRI RF Tx/Rx coil and facilitating the prevention of injury to patients or other subjects who may be in proximity with the MRI RF Tx/Rx coil. In one embodiment, the fuse is an auto-resettable fuse that is re-usable and that permits the MRI RF Tx/Rx coil to resume functioning upon the fuse cooling to a threshold level.

When the fuse is open, it provides high resistance, which may be in the mega Ohms range. Therefore, the induced voltage of the coil will be almost fully applied to the fuse. Because of the high impedance of the fuse, the current through the coil may be zero, or may approach zero. Thus, the open fuse will prevent the resonance of the coil, reduce or eliminate induced current in the coil, and protect the coil or people who may come into contact with the coil.

In embodiments described herein, a single-layer MRI RF Tx/Rx coil element may include a failsafe circuit. The failsafe circuit includes circuitry configured to prevent the single-layer MRI RF Tx/Rx coil from resonating with a WBC upon the single-layer MRI RF Tx/Rx coil being disconnected from an MRI system while subjected to the Tx field of the MRI system's primary coil. In some embodiments, the failsafe circuit may be part of a matching and Tx/Rx switch circuit. In one embodiment, the failsafe circuit is configured to operate in part as a capacitive matching and Tx/Rx switch circuit. In another embodiment, the failsafe component is circuit to operate in part as an inductive matching and Tx/Rx switch circuit. In a "connected" state, when the single-layer MRI RF Tx/Rx coil or coil array is operably connected to the MRI system, a forward DC bias is applied to the failsafe circuit such that the induced current in the single-layer MRI RF Tx/Rx coil is permitted to flow when operating in a Tx mode. When the single-layer MRI RF Tx/Rx coil is in a "disconnected" state, the DC bias is not available to the failsafe component, and therefore the DC bias is not applied. The DC bias controls elements of the failsafe circuit, including PIN diodes, to prevent the single-layer MRI RF Tx/Rx coil from resonating with a primary coil, thus preventing or reducing induced current in the single layer MRI RF Tx/Rx coil, as will be discussed herein. Since the DC bias is not provided to the failsafe circuit when the single layer MRI RF Tx/Rx coil is disconnected, the failsafe circuit presents a higher impedance, thus preventing the single-layer MRI RF Tx/Rx coil from resonating with the Tx field when disconnected.

In one embodiment, a single-layer MRI RF Tx/Rx coil or coil array includes an identification circuit configured to interact with an MRI system to detect if the single-layer MRI RF Tx/Rx coil is within the range of the WBC's Tx field. Upon detecting that the MRI RF Tx/Rx coil is within range of the WBC's Tx field, and upon determining that the MRI RF Tx/Rx coil is not connected with the MRI system, the MRI system is controlled to shut down, or to terminate a Tx mode. By shutting down the MRI system or terminating the Tx mode, the MRI RF Tx/Rx coil will stop resonating with the WBC coil, and damage or further damage to the MRI RF Tx/Rx coil may be prevented. The identification circuit may be configured to provide a signal containing location information to the MRI system. In one embodiment, the identification circuit is an RFID tag, and the MRI system includes at least one sensor configured to detect the location of the RFID tag or receive a signal from the RFID tag.

In another embodiment, a single-layer MRI RF Tx/Rx coil includes both a failsafe circuit and a fuse. In another embodiment, a single-layer MRI RF Tx/Rx coil includes a failsafe circuit, a fuse, and an identification circuit (e.g., RFID tag).

FIG. 1 illustrates an RF coil 110 and an RF coil 120. Coil 110 and coil 120 are resonant RF coils and are inductively coupled to each other. Coil 110 and coil 120 may be part of an MRI system. In this example, coil 110 operates as a primary coil and is driven by RF amplifier ε 130. Coil 120 operates as a secondary coil. Secondary coil 120 is inductively coupled to the primary coil 110 by mutual inductance M. Secondary coil 120 is driven by the mutual inductively coupled RF power from the primary coil 110. The primary coil 110 is, in this example, a WBC, while the secondary coil 120 is a local inductively coupled smaller coil. For the primary coil 110, $R_p$, $C_p$, and $L_p$ are defined as the coil loss resistance, the equivalent coil breaking point capacitance, and the equivalent total coil inductance respectively. The RF amplifier ε 130 is defined as an equivalent RF voltage source from an RF power amplifier through a matching circuit, which is not illustrated for clarity. The resistive loss from the RF amplifier ε 130 is absorbed by $R_p$, which may be pre-defined for simplicity of calculation. The mutual inductance between primary coil 110 and secondary coil 120 is defined as M. The resistive loss, the equivalent breaking point capacitance, and the total inductance of secondary RF coil 120 are defined as $R_s$, $C_s$, and $L_s$ respectively. The RF current through primary coil 110 is defined as $i_p$, and the RF current through secondary coil 120 is defined as $i_s$. Mutual inductance between primary RF coil 110 (e.g. $L_p$) and secondary RF coil 120 (e.g. $L_s$) generates an induced voltage on primary coil 110 $L_p$, which may be expressed as $+/-j\omega M i_s$. The sign of $j\omega M i_s$ is determined by the polarity between primary coil 110 and secondary coil 120. For clarity of exposition, the positive sign is used in this example. Similarly, the mutual inductance between secondary coil 120 and primary coil 110 generates an induced voltage on secondary coil 120, which may be expressed as $+/-j\omega M i_p$. The sign is the same for both primary coil 110 and secondary coil 120.

Using Kirchhoff's law, primary coil 110 and secondary coil 120 represented in FIG. 1 may be described by equation 1 below:

for primary coil 110: $Z_p i_p + j\omega M i_s = \varepsilon$ for secondary coil 120: $j\omega M i_p + Z_s i_s = 0$ (Eq. 1), where $$Z_p = R_p + j\left(\omega L_p - \frac{1}{\omega C_p}\right) \text{ and } Z_s = R_s + j\left(\omega L_s - \frac{1}{\omega C_s}\right),$$

where Z represents impedance.

Equation 1 may be re-written in matrix format, resulting in:

$$\begin{pmatrix} Z_p & j\omega M \\ j\omega M & Z_s \end{pmatrix} \begin{pmatrix} i_p \\ i_s \end{pmatrix} = \begin{pmatrix} \varepsilon \\ 0 \end{pmatrix}$$ (Eq. 2)

Thus, the solution to equation 2 is:

$$\begin{pmatrix} i_p \\ i_s \end{pmatrix} = \frac{1}{Z_p Z_s + \omega^2 M^2} \begin{pmatrix} Z_s \varepsilon \\ -j\omega M \varepsilon \end{pmatrix}$$ (Eq. 3)

where $$i_p = \frac{Z_s \varepsilon}{(Z_p Z_s + \omega^2 M^2)} \text{ and } i_s = \frac{-j\omega M \varepsilon}{(Z_p Z_s + \omega^2 M^2)}.$$

If both the primary coil 110 and the secondary coil 120 resonate at the same frequency, then $Z_p = R_p$ and $Z_s = R_s$. Thus $$i_p = \frac{R_s \varepsilon}{(R_p R_s + \omega^2 M^2)} \text{ and } i_s = \frac{-j\omega M \varepsilon}{(R_p R_s + \omega^2 M^2)}.$$

Recall that the phase of $i_s$ is opposite to the phase of $i_p$, per Lenz's Law. The ratio between $i_s$ and $i_p$ is $-j\omega M/R_s$. The secondary coil 120's quality factor (Q) may be high, i.e., the value of $R_s$ may be small. Therefore the ratio between current $i_s$ and $i_p$ may be large. Furthermore, because secondary coil 120 is smaller than primary coil 110 and is also closer to the imaging area than primary coil 110, the same magnitude of RF current generates a larger magnetic transmitting field at the area being imaged. Thus, a local inductive coil is significantly more power efficient than a large WBC coil and the local inductive coil's current is dominant compared to the primary coil's current even though their phases are opposite to each other. Furthermore, if a local inductive coil such as secondary coil 120 does not resonate at the frequency of primary coil 110, then the induced current $i_s$ in secondary coil 120 can be written as:

$$i_s = \frac{-j\omega M \varepsilon}{\left(R_p R_s + \omega^2 M^2 + jR_p\left(\omega L_s - \frac{1}{\omega C_s}\right)\right)}$$ (Eq. 4)

As shown in Eq. 4, the frequency deviation of secondary coil 120 from primary coil 110 can reduce the magnitude of $i_s$ and change the phase of $i_s$. This approach may be used by embodiments described herein to reduce the local coil 120's RF power efficiency if a particular MRI application requires it. For example, as demonstrated by Eq. 4, the induced current $i_s$ is a function of a coil loss resistance of primary coil 110, a coil loss resistance of secondary coil 120, or a difference between a working frequency of primary coil 110 and a resonant frequency of secondary coil 120. Thus, embodiments described herein may independently adjust a magnitude of the induced current in a local coil (e.g. secondary coil 120), or a phase of the induced current in a local coil (e.g. secondary coil 120) by adjusting the coil loss resistance of the primary coil (e.g. primary coil 110), the coil loss resistance of the secondary coil (e.g. secondary coil 120), or the difference between the working frequency and the resonant frequency. Embodiments described herein may therefore also adjust the magnitude of local Tx field generated by a single layer MRI RF coil operating in Tx mode.

Embodiments described herein include a single-layer MRI RF coil array that employs a single-layer approach to achieve a local inductively coupled Tx transmitter from a plurality of Rx receivers. An example single-layer MRI RF coil array may operate in a Tx mode or an Rx mode. In Rx mode the single-layer MRI RF coil array functions as a plurality of Rx receivers. In Tx mode multiple PIN diodes may be used to re-configure all or less than all the plurality of Rx receivers so that either all or less than all of the plurality of Rx receivers may inductively couple to the WBC and amplify the transmit field. Under this single-layer approach there are multiple approaches that may be employed by embodiments described herein to create a Tx field with a local inductively coupled coil.

Figure 2:
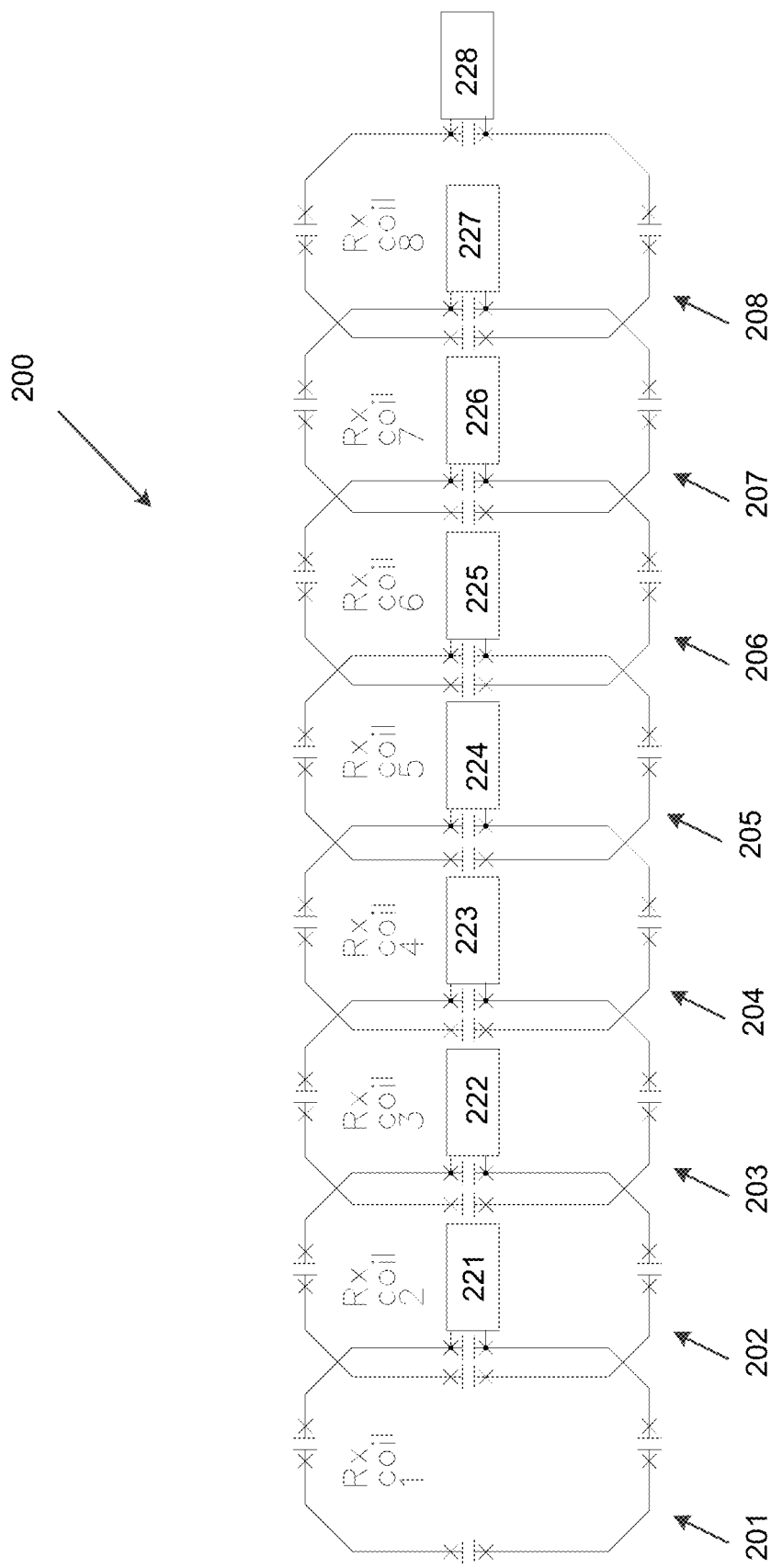
FIG. 2 is a circuit diagram of an eight-rung birdcage coil.

A first single-layer approach is to use PIN diodes to configure a plurality of Rx coils together to create a local volume coil, such as a birdcage coil, and to inductively couple the local volume coil to a larger WBC. This first approach may be demonstrated by an example Rx coil that includes 8 loops configured as independent receivers on a cylindrical former. In examples described herein, a loop is considered to be an RF coil element, or RF coil array element. FIG. 2 is a diagram of an example 8-loop coil 200 in Rx mode. 8-loop coil 200 includes loops 201-208. In this example, a loop serves as an independent receiver, and includes receive electronics 221-228 respectively. Between directly neighboring loops (e.g. loops 202, 203, 204), the directly neighboring loops overlap each other to achieve good isolation, i.e., minimum mutual inductance. Good isolation between loops can also be achieved by using capacitors.

Figure 3:
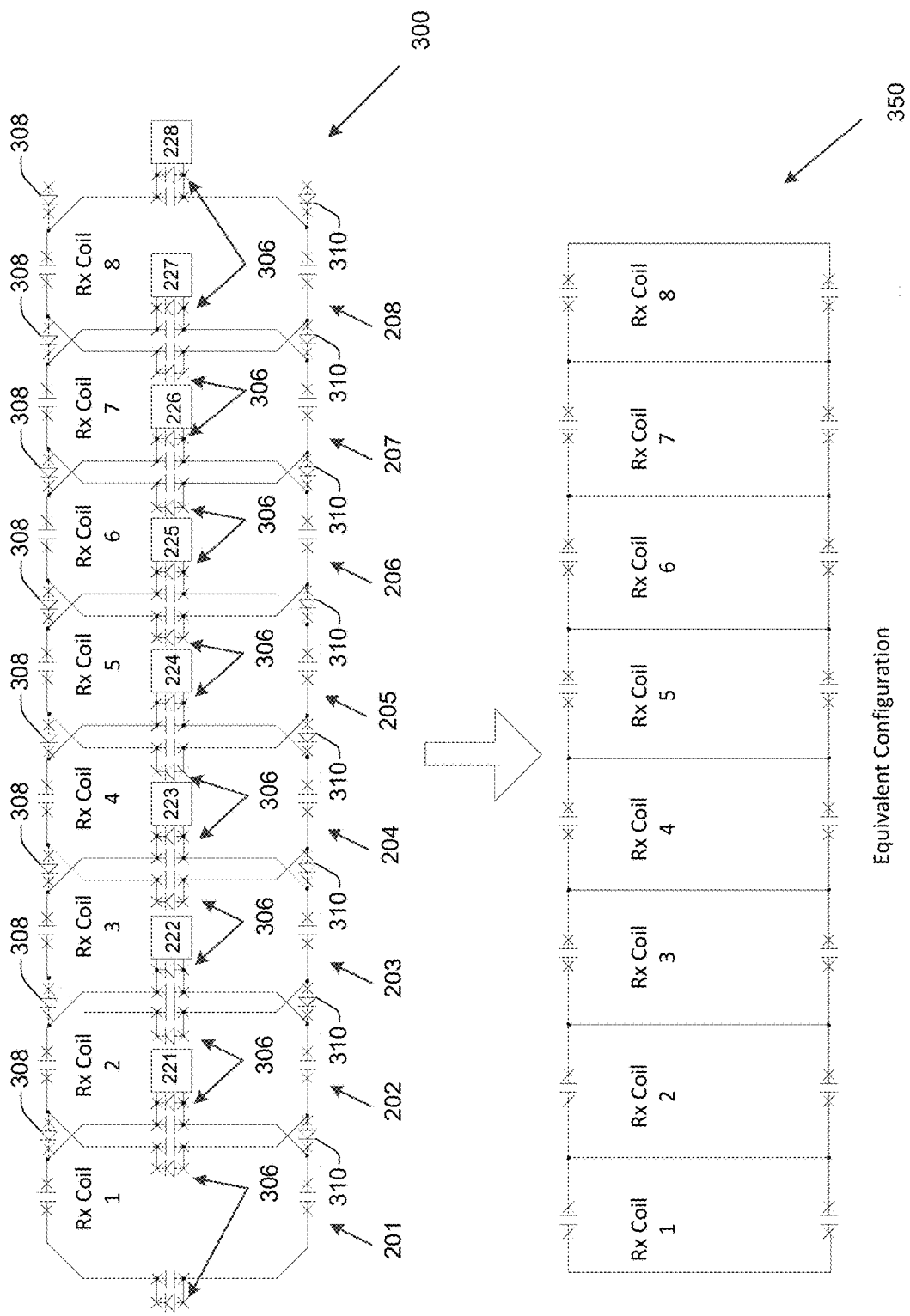
FIG. 3 is a circuit diagram of an eight-rung birdcage coil and equivalent circuit.

FIG. 3 illustrates an Rx coil 300 that is similar to Rx 8-loop coil 200 illustrated in FIG. 2, but with additional elements and details. Rx coil 300 includes multiple PIN diodes 306, 308, and 310. A PIN diode has low impedance (e.g. is shorted) when it is forward biased by a DC power supply. In Tx mode the PIN diodes 306, 308, and 310 are forward biased. The circuitry supporting the PIN diodes 306, 308, and 310, such as RF chokes, is not illustrated in FIG. 3 for clarity. If all PIN diodes 306, 308, and 310 are shorted due to the application of a forward bias, then the circuit of the coil 300 is changed to the equivalent circuit 350. The equivalent circuit 350 illustrates an 8-rung birdcage coil that will inductively couple to a WBC in Tx mode and amplify the transmitting field and increase the efficiency of the WBC. In summary, the first approach of single-layer technology uses PIN diodes to reconfigure all or some of the Rx coil elements in a plurality of Rx coil elements into a local volume coil to increase WBC efficiency using inductive coupling, and to electrically link Rx coil elements together as one larger inductively coupled Tx coil. This first, conventional approach may be sub-optimal for two reasons. A first reason is that many diodes are required to link different Rx coils together. This increases the complexity of the coils. Therefore, this first, conventional approach may be expensive. The other reason is that even though PIN diodes are considered to be shorted when a forward bias is applied to the PIN diodes, the resistive losses of the PIN diodes are not trivial. A typical value of a forward biased PIN diode is 0.5 Ohm. This 0.5 Ohm could be larger than the coil loss itself for some high Q coils. This additional PIN diode resistive loss reduces the local inductively coupled RF coil's power efficiency.

Example embodiments described herein employ a second, different single-layer approach that uses PIN diodes to facilitate switching an Rx coil element into Tx mode so that all or part of all the Rx elements in a plurality of Rx elements can inductively couple to a WBC individually. In this approach, unlike in the first conventional approach, there are no PIN diodes between Rx elements (e.g., loops, RF coil elements) to link the Rx elements together. When forward-biased, a PIN diode may produce a negligible resistance (e.g., ~0.1Ω), which is essentially a short-circuit. When reverse-biased, a PIN diode may produce a high resistance (e.g., ~200 kΩ) in parallel with a low capacitance (e.g., ~2 pF), which is essentially an open-circuit.

An analysis of the induced current in the Rx elements of an array when operating in Tx mode illustrates the operation of the second approach employed by embodiments described herein. In this analysis it is assumed that the couplings among Rx elements are small and can be ignored. The couplings between Rx elements and the WBC are dominant. For example, the WBC field will induce voltage in one element and generate current flow in that element. That current flow will generate its own field. This additional field will induce voltage on this element's neighbors, including direct or indirect neighbors. This additional induced voltage is ignored in this analysis for clarity of exposition because of the assumption that the couplings among Rx elements are small.

Figure 4:
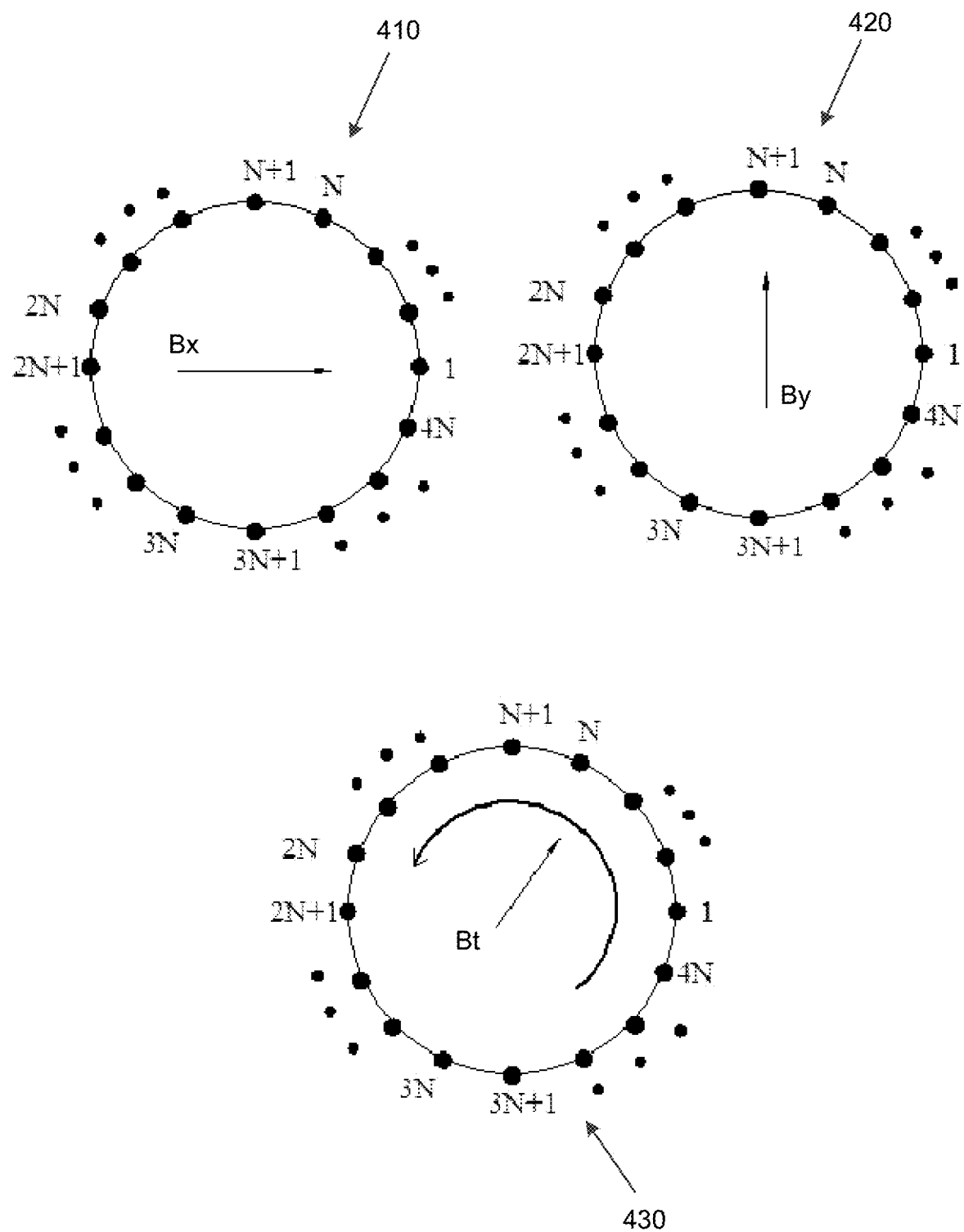
FIG. 4 illustrates current distribution through a birdcage coil.

FIG. 4 illustrates current distribution through rungs of a 4N-rung birdcage coil in circular polarized (CP) mode. Current distribution for a B field in the horizontal direction ($B_x$) is illustrated at 410. For a B field in the horizontal direction ($B_x$) the current through a rung k can be written as:

$$I_{kx} = I_0 \sin\left(\frac{2\pi}{4N}k\right)\sin(\omega_0 t) \quad \text{(Eq. 5)}$$

where k is the rung number (k=1, . . . , 4N) and $\omega_0$ is the working frequency.

Current distribution for a B field in the vertical direction ($B_y$) is illustrated at 420. For a B field in the vertical direction ($B_y$) the current through a rung k can be written as $$I_{ky} = \pm I_0 \cos\left(\frac{2\pi}{4N}k\right)\cos(\omega_0 t) \quad \text{(Eq. 6)}$$

For current distribution for a B field in the vertical direction ($B_y$), the time domain function is cosine instead of sine due to the circular polarized mode requirement. Furthermore, the "±" symbol indicates that the direction of $B_y$ may be upward or downward. This affects the rotational direction of the final circular polarized B field, illustrated at 430, by making the final circular polarized B field rotate either clockwise or counterclockwise. The total current through a rung k is the sum of the two currents described in equation 5 and equation 6. Therefore:

$$I_k = \quad \text{(Eq. 7)}$$
$$I_0\sin\left(\frac{2\pi}{4N}k\right)\sin(\omega_0 t) \pm I_0\cos\left(\frac{2\pi}{4N}k\right)\cos(\omega_0 t) = I_0\cos\left(\omega_0 t \pm \frac{2\pi}{4N}k\right)$$

In this example, a first rung has the same current magnitude $I_0$ and angular frequency $\omega_0$ as another, different rung. The currents in different rungs differ with respect to phase. Thus, a typical high pass, low pass, or bandpass WBC's current distribution in its rungs can be described by Eq. 7.

Consider a 4N loops Rx coil that is put inside this circular polarized uniform B field, where the circular polarized uniform B field is generated by a birdcage coil or WBC. FIG. 4, element 430 illustrates current distribution for a B field generated from a birdcage coil or WBC in this situation. In this example, good isolation among all loops is assumed.

Figure 5:
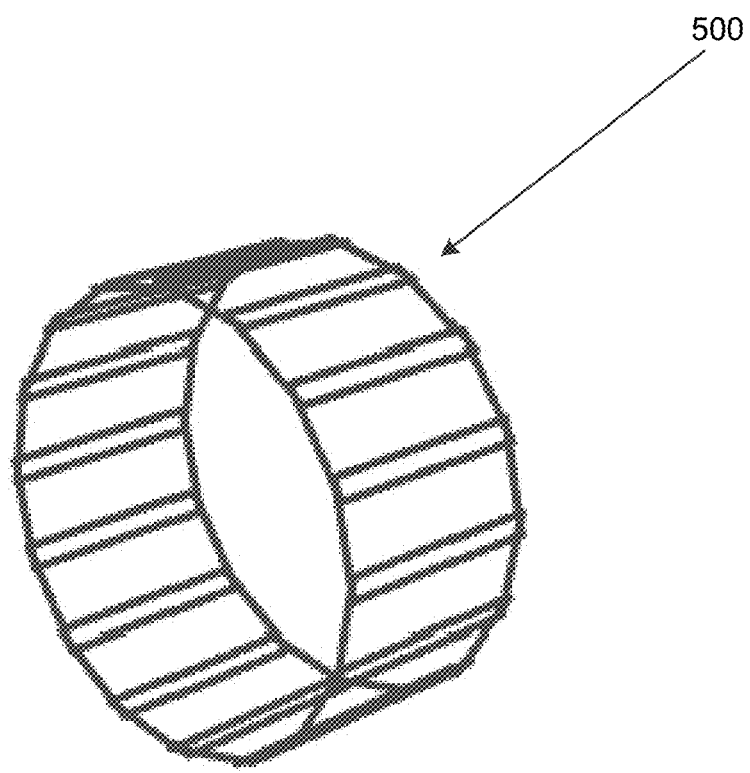
FIG. 5 illustrates an example birdcage coil.

Furthermore, in this example, each loop is identical, the loops use overlap to isolate the directly neighboring elements, all loops are in the same row, and the loops are wrapped around a cylindrical former. FIG. 5 illustrates an example 16 loop coil 500 configured as a birdcage coil.

In transmit mode the CP $B_1$ field from a birdcage coil (e.g. a WBC) induces voltage in each loop. The induced voltage for a loop can be written as $$V_{induced} = \frac{d(\vec{B_1} \cdot \vec{A_k})}{dt} \quad \text{(Eq. 8)}$$

where $\vec{A_k}$ is the area vector, where the magnitude is the area of the $k_{th}$ loop and the direction is the direction perpendicular to the area towards the outside of the coil.

The $B_1$ field and area vector $\vec{A_k}$ can be written as:

$$\vec{B_1} = B_1(\cos(\omega_0 t)\hat{x} + \sin(\omega_0 t)\hat{y}) \quad \text{(Eq. 9)}$$

$$\vec{A_k} = A_0\left(\cos\left(\frac{2\pi}{8N} + (k-1)*\frac{2\pi}{4N}\right)\hat{x} + \sin\left(\frac{2\pi}{8N} + (k-1)*\frac{2\pi}{4N}\right)\hat{y}\right) \quad \text{(Eq. 9a)}$$

where $A_0$ is the area of a loop. Loops in this example have identical dimensions and thus have the same areas. In particular embodiments, loops may have different areas, and calculations may be adjusted accordingly.

Then, equation 8 can be re-written as:

$$V_{induced} = A_0 B_1 \omega_0 \left(-\sin(\omega_0 t)\cos\left(\frac{2\pi}{8N} + (k-1)*\frac{2\pi}{4N}\right) + \cos(\omega_0 t)\sin\left(\frac{2\pi}{8N} + (k-1)*\frac{2\pi}{4N}\right)\right) = \quad \text{(Eq. 10)}$$

$$A_0 B_1 \omega_0 \sin\left(\frac{2\pi}{8N} + (k-1)*\frac{2\pi}{4N} - \omega_0 t\right)$$

Therefore, the current through the equivalent $k_{th}$ rung position is $$I_{induced\ no\ coupling\_k} = \quad \text{(Eq. 11)}$$
$$\frac{V_k - V_{k-1}}{R} = \frac{A_0 B_1 \omega_0}{R} * 2 * \sin\left(\frac{2\pi}{8N}\right) * \cos\left((k-1)*\frac{2\pi}{4N} - \omega_0 t\right)$$

where R is the impedance of a loop. At the resonant frequency the reactive part of the impedance is self-cancelled and only the real part is left. As demonstrated by both equation 11 and equation 7, a uniform circular $B_1$ field results. The final $B_1$ field $B_t$ inside the loops is the sum of both. As a result the final $B_1$ field $B_t$ inside a small cylinder may be uniform.

In one embodiment, the isolations between coil elements are very small. If the isolations are not small and the mutual inductance is defined as $M_{kj}$ between the $k_{th}$ and $j_{th}$ elements, high order coupling among elements may be ignored, and thus:

$$V_{kj} = M_{kj}\frac{d(I_j)}{dt} \quad \text{(Eq. 12)}$$

Therefore, the $k_{th}$ element will see additional coupled voltage from the $j_{th}$ element.

Summing all of the coupled voltages of the $k_{th}$ element results in:

$$V_k = A_0 B_1 \omega_0 \sin\left(\frac{2\pi}{8N} + (k-1)*\frac{2\pi}{4N} - \omega_0 t\right) - \quad \text{(Eq. 13)}$$
$$\sum_{j=1\ and\ j\neq k}^{4N}\left(M_{kj}* A_0 B_1 \omega_0^2 \cos\left(\frac{2\pi}{8N} + (j-1)*\frac{2\pi}{4N} - \omega_0 t\right)\right)$$

Taking the same approach as illustrated in equation 11, then the induced current at the kth rung position can be written as $$I_{induced\ coupled\_k} = \quad \text{(Eq. 14)}$$
$$I_{induced\ no\ coupling\_k} - \sum_{j=1\ and\ j\neq k\ or\ j\neq k-1}^{4N}\left((M_{kj} - M_{(k-1)j})*\right.$$
$$\left. A_0 B_1 \omega_0^2 \cos\left(\frac{2\pi}{8N} + (j-1)*\frac{2\pi}{4N} - \omega_0 t\right)\right)/R$$

As demonstrated by equation 14 above, the second term in the right side of equation 14 still creates a uniform $B_1$ field. Therefore, compared to the non-coupled case described in equation 11, the coupled case still creates a uniform $B_1$ field. The difference here is that the couplings create the coupled $B_1$ field which makes the whole coil array less power efficient than the non-coupled case. However, as long as this uniform coupled field is still more efficient than the primary coil, (i.e., the WBC) the coil elements may still be used to resonate to improve RF power efficiency and reduce SAR.

Figure 6:
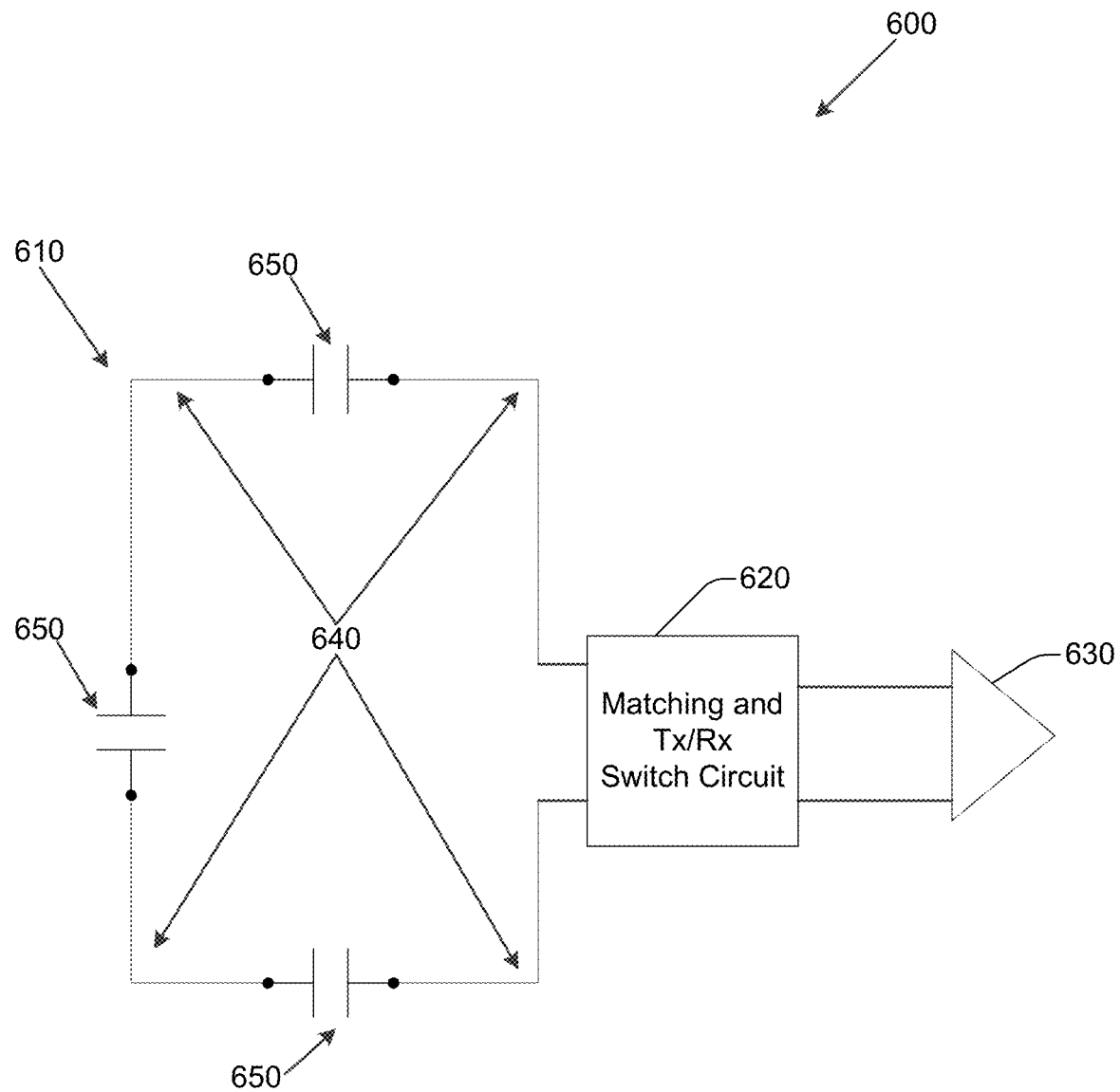
FIG. 6 illustrates an example single-layer MRI RF coil element.

FIG. 6 illustrates an example embodiment of an MRI RF coil element 600 that may be part of a single-layer MRI RF coil array. MRI RF coil element 600 employs the second approach to generate a local Tx field. In FIG. 6, the configuration illustrated includes one Rx element only, for clarity. Employing a MRI RF coil element 600 as part of a single-layer MRI RF coil array using the second approach is simpler than the first approach because fewer PIN diodes are required to switch between Tx mode and Rx mode. Example embodiments thus improve on conventional approaches by saving space within the bore of an MRI apparatus because less hardware is used to construct example embodiments, by avoiding electromagnetic (EM) interference that may be caused by unnecessary hardware, and by reducing manufacturing costs by requiring less hardware, including PIN diodes, than conventional approaches. Example embodiments therefore offer at least one measurable improvement on conventional approaches in addition to providing improved SNR and more uniform fields.

FIG. 6 illustrates an MRI RF coil element 600 configured to operate in a transmit (Tx) mode or in a receive (Rx) mode. In one embodiment, MRI RF coil element 600 may be part of a single-layer MRI RF coil array. A single-layer MRI RF coil array comprises at least one RF coil element (e.g., MRI RF coil element 600). The single-layer MRI RF coil array may be arranged in an anatomy-specific shape or configuration, including a closed-shape configuration (e.g. a birdcage coil), or arranged in an open-shape configuration (e.g. in a "C" or "U" shape), or other shaped configuration. In one embodiment, the single-layer MRI RF coil array may be a birdcage coil array. For example, FIG. 5 illustrates an example birdcage coil array 500. Birdcage coil array 500 is a sixteen loop, single-row coil array comprising sixteen MRI RF coils. A member of the sixteen MRI RF coils may be, for example, MRI RF coil element 600. In another embodiment, an element of the single-layer MRI RF coil array is configured in a saddle-like configuration. In another embodiment, a first element of the single-layer MRI RF coil array is configured in a saddle-like configuration, while a second, different element of the single-layer MRI RF coil array is configured as a loop.

The at least one RF coil element 600 includes an LC coil 610, a matching and Tx/Rx switch circuit 620, and a preamplifier 630. LC coil 610 includes at least one inductor 640 and at least one capacitor 650. The at least one inductor 640 and the at least one capacitor 650 resonate at a first frequency (i.e., a resonant frequency). The at least one inductor 640 may be, for example, a co-axial cable, a copper wire, a copper foil soldered to a circuit board, or other conductor.

RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

The matching and Tx/Rx switch circuit 620, when operating in Tx mode, electrically isolates the LC coil 610 from the preamplifier 630 upon the LC coil 610 resonating with a primary coil (not illustrated) at a working frequency of the primary coil. The matching and Tx/Rx switch circuit 620 electrically isolates the LC coil 610 from the preamplifier 630 by providing a threshold level of impedance between the LC coil 610 and the preamplifier 630. The primary coil may be, for example, a WBC or other primary coil that is larger than RF coil element 600. The LC coil 610, upon resonating with the primary coil at the working frequency, generates a local amplified Tx field based on an induced current in the LC coil 610. The induced current has a magnitude and a phase. The magnitude of the induced current or the phase of the induced current may be independently adjustable. For example, the induced current is a function of at least a coil loss resistance of the WBC, a coil loss resistance of the LC coil 610, or a difference between a working frequency of the WBC and a resonant frequency of the LC coil 610. In this embodiment, the frequency of the induced current is the same as the working frequency of the current in the primary coil or WBC, even though the resonant frequency of the LC coil 610 may be different. Embodiments described herein facilitate adjusting the coil loss resistance of the WBC, the coil loss resistance of the LC coil 610, or the difference between the working frequency of the WBC and the resonant frequency of the LC coil 610. The magnitude of the induced current or the phase of the induced current are configured to be varied over a range of magnitudes or phases respectively. Example embodiments thus facilitate independently adjusting the magnitude of an induced current in LC coil 610, or a phase of the induced current.

Matching and Tx/Rx switch circuit 620, when operating in Rx mode, electrically connects the LC coil 610 with the preamplifier 630 by providing low impedance between the LC coil 610 and the preamplifier 630. Preamplifier 630 may be a low input impedance low noise amplifier (LNA). In one embodiment, matching and Tx/Rx switch circuit 620 may be a capacitive matching and Tx/Rx switch circuit. In another embodiment, matching and Tx/Rx switch circuit 620 may be an inductive matching and Tx/Rx switch circuit.

Figure 7:
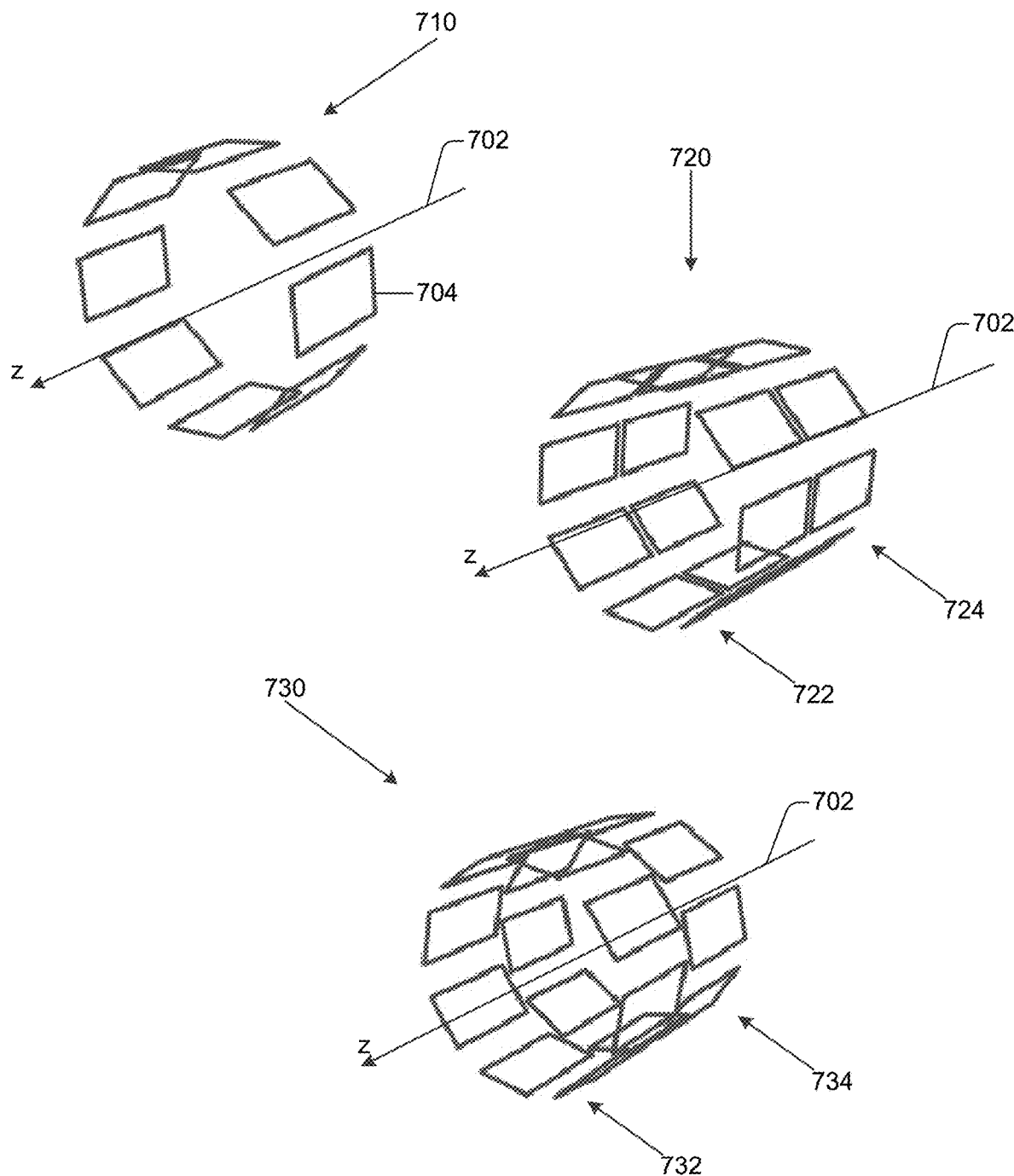
FIG. 7 illustrates example single-layer MRI RF coil arrays.

Example single-layer MRI RF coil elements, MRI RF coil arrays, MRI RF coils, apparatus, and other embodiments, may be configured, for example, as bird cage coils. FIG. 7 illustrates one embodiment of a single-layer MRI RF coil array 710 that includes at least one MRI RF coil elements 704 arranged in a single-row birdcage configuration. The at least one MRI RF coil elements may include, for example, MRI RF coil element 600, 800, 900, 1000, 1100, 1200, 1500, or 2000-2700. FIG. 7 also illustrates an example embodiment of a single-layer MRI RF coil array 720 that includes at least one example single-layer MRI RF coil elements arranged in a two-row configuration. Single-layer MRI RF coil array 720 includes a first row 722 aligned with a second row 724. First row 722 includes at least four RF coil elements. Second row 724 includes at least four RF coil elements. FIG. 7 further illustrates another, single-layer MRI RF coil array 730. Single layer MRI coil array 730 is similar to single-layer MRI RF coil array 720, except the first row 732 is not aligned with second row 734. For example, first row 732 may be rotated a number of degrees around a central axis (e.g. z axis) shared with second row 734, while 734 is not rotated, or is rotated a different number of degrees. In different embodiments, first row 732 may be aligned to within a threshold level of alignment with second row 734.

In one embodiment, MRI RF coil array 720 includes a first plurality of RF coil elements (e.g. first row 722) and a second plurality of RF coil elements (e.g. second row 724). The first plurality of RF coil elements and the second plurality of RF coil elements are radially disposed about a longitudinal axis 702. The first plurality and the second plurality may be longitudinally offset a threshold distance greater than zero along the longitudinal axis 702. In one embodiment, an element of the first plurality of RF coil elements is axially offset a threshold amount from a respective element of the second plurality of RF coil elements. For example, an element of the first plurality of RF coil elements may be axially offset 15 degrees, 30 degrees, or another, different number of degrees, from a respective element of the second plurality of RF coil elements. The first plurality and the second plurality may include the same number of RF coil elements, or may include different numbers of RF coil elements. For example, in one embodiment, the first plurality may include eight RF coil elements, while the second plurality may include nine RF coil elements. Other, different numbers of RF coil elements may be employed.

In another embodiment, the at least one RF coil elements is arranged in a three-row configuration. For example, a three-row single layer MRI RF coil array may include a first row that includes at least five RF coil elements, a second row that includes at least five RF coil elements, and a third row that includes at least five RF coil elements. In this embodiment, the first row, second row, and third row may be aligned axially, or may be unaligned axially. In another embodiment, other different numbers of rows, number of RF coil elements, or combinations of alignments may be employed.

For example, in one embodiment, MRI RF coil array 720 includes a first plurality of RF coil elements 722, a second plurality of RF coil elements 724, and a third plurality of RF coil elements (not illustrated). In this embodiment, the first plurality of RF coil elements 722, the second plurality of RF coil elements 724, and the third plurality of RF coil elements are radially disposed about a longitudinal axis. The first plurality 722, the second plurality 724, and the third plurality are longitudinally offset a threshold amount along the longitudinal axis. In one embodiment, an element of the first plurality 722 of RF coil elements is axially offset a threshold amount from a respective element of the second plurality 724 of RF coil elements or the third plurality of RF coil elements. The first plurality 722, the second plurality 724, and the third plurality may include the same number of RF coil elements, or may include different numbers of RF coil elements. For example, in one embodiment, the first plurality 722 may include eight RF coil elements, the second plurality 724 may include nine RF coil elements, and the third plurality may include seven RF coil elements. In another embodiment, the first plurality 722, the second plurality 724, or the third plurality may include other, different numbers of RF coil elements.

Figure 8:
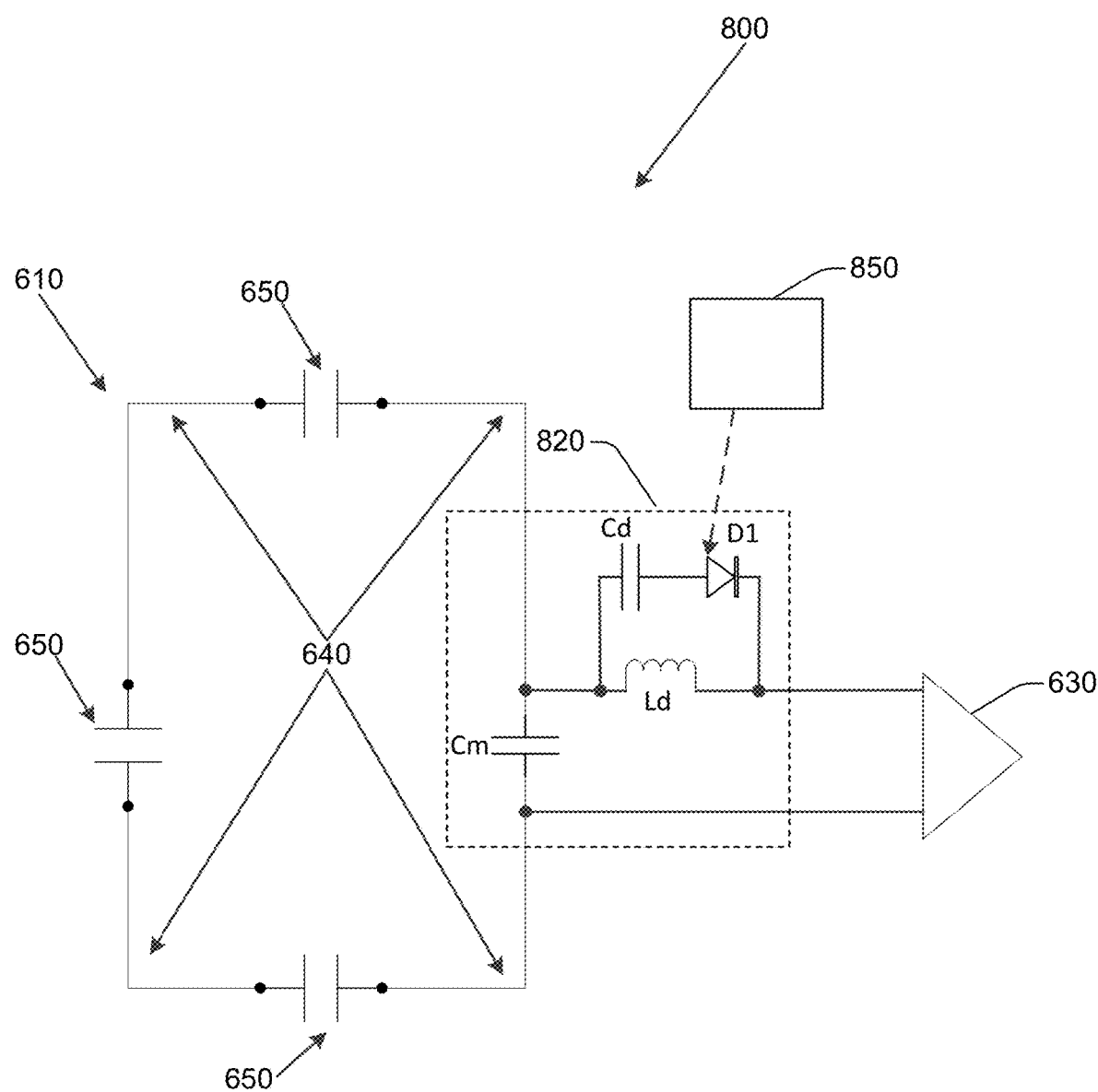
FIG. 8 illustrates an example single-layer MRI RF coil element.

FIG. 8 illustrates an MRI RF coil element 800. MRI RF coil element 800 is similar to MRI RF coil element 600, but includes additional elements and details. MRI RF coil element 800 may be part of a single-layer MRI RF coil array. The single-layer MRI RF coil array comprises at least one RF coil element 800. In one embodiment, MRI RF coil element 800 includes a matching and Tx/Rx switch circuit 820 configured to operate as a capacitive matching and Tx/Rx circuit. In this embodiment, matching and Tx/Rx switch circuit 820 includes a matching capacitor Cm, a first diode D1, a capacitor Cd, and a first inductor Ld. First diode D1 may be a PIN diode. The first diode D1, capacitor Cd, and first inductor Ld create a resonant tank circuit in Tx mode when first diode D1 is forward biased. This resonant tank circuit isolates input to the LNA preamplifier 630 from an induced high current or voltage in LC coil 610. The resonant tank circuit further facilitates LC coil 610, including capacitors 650, inductors 640, and matching capacitor Cm, to resonate at a high Q without preamplifier 630 being electrically connected to the RF coil.

In this embodiment, matching capacitor Cm has a first terminal and a second terminal. Matching capacitor Cm is connected, at a first terminal, to a first terminal of first inductor Ld. First inductor Ld is connected at a first terminal, to a capacitor Cd, at a first terminal. Capacitor Cd is connected, at a second terminal, to first diode D1, at a first terminal. First diode D1 is connected, at a second terminal to first inductor Ld, at a second terminal. First inductor Ld is connected, at a second terminal, to a first input terminal of preamplifier 630. Preamplifier 630 is connected, at a second input terminal, to the second terminal of matching capacitor Cm. In Rx mode, first diode D1 is backward biased (i.e., first diode D1 has a high impedance in Rx mode), so that effectively only Ld is presented between Cm and Preamplifier 630. While in this example first inductor Ld, first diode D1, and capacitor Cd are illustrated on a connection path between the first terminal of matching capacitor Cm and a first input terminal of preamplifier 630, in another embodiment, first inductor Ld, first diode D1, and capacitor Cd may be connected instead between the second terminal of matching capacitor Cm and the second input terminal of preamplifier 630.

In one embodiment, MRI RF coil element 800 further includes a PIN diode control circuit 850. PIN diode control circuit 850 facilitates selective control of first diode D1. For example, PIN diode control circuit 850 controls a forward bias applied to first diode D1. PIN diode control circuit 850 may be operably connected to, for example, first diode D1. In another embodiment, PIN diode control circuit 850 facilitates selective control of other, different diodes, including shunt diodes, or PIN diodes that comprise a magnitude/phase control component.

Figure 9:
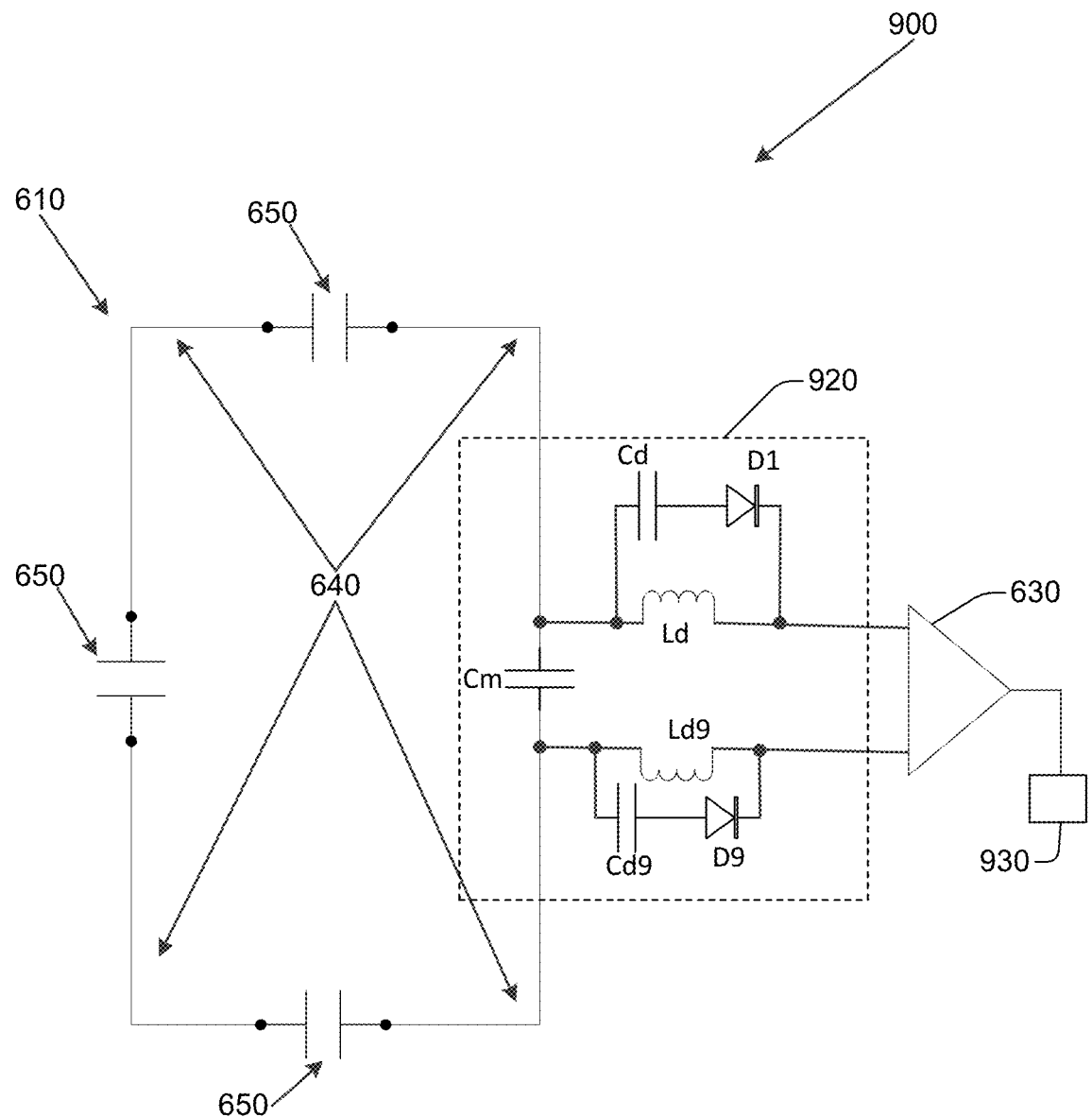
FIG. 9 illustrates an example single-layer MRI RF coil element.

FIG. 9 illustrates an MRI RF coil element 900. MRI RF coil element 900 is similar to MRI RF coil element 800, but includes additional elements and details. MRI RF coil element 900 includes matching and Tx/Rx switch circuit 920. In this embodiment, matching and Tx/Rx switch circuit 920 includes matching capacitor Cm, first diode D1, first capacitor Cd, and first inductor Ld. Matching and Tx/Rx switch 920 also includes second diode D9, second capacitor Cd9, and second inductor Ld9. Second diode D9 may be a PIN diode. The first diode D1, first capacitor Cd first inductor Ld, and second diode D9, second capacitor Cd9, and second inductor Ld9 create a resonant tank circuit in Tx mode when first diode D1 or second diode D14 is forward biased. This resonant tank circuit isolates input to preamplifier 630 from an induced high current or voltage in LC coil 610. The resonant tank circuit further facilitates LC coil 610, including capacitors 650, inductors 640, and matching capacitor Cm, resonating at a high Q without preamplifier 630 being electrically connected to the RF coil.

In this embodiment, matching capacitor Cm has a first terminal and a second terminal. Matching capacitor Cm is connected, at a first terminal, to a first terminal of first inductor Ld. First inductor Ld is attached at a first terminal, to first capacitor Cd, at a first terminal. First capacitor Cd is attached, at a second terminal, to first diode D1, at a first terminal. First diode D1 is attached, at a second terminal to a second terminal of first inductor Ld. First inductor Ld is connected, at a second terminal, to a first input terminal of preamplifier 630. Matching capacitor Cm is connected, at a second terminal, to a first terminal of second inductor Ld9. Second inductor Ld9 is connected, at a first terminal, to second capacitor Cd9, at a first terminal. Second capacitor Cd9 is connected, at a second terminal, to second diode D9, at a first terminal. Second diode D9 is connected, at a second terminal, to a second terminal of second inductor Ld9. Second inductor Ld9 is connected, at a second terminal, to a second input terminal of preamplifier 630.

In one embodiment, MR RF coil element 900 further includes a balun 930. In this embodiment, balun 930 is connected, at a first coaxial or two-connection terminal, to a first coaxial or two-connection output terminal of preamplifier 630. In another embodiment, balun 930 is connected between matching and Tx/Rx switch 920 and preamplifier 630. Balun 930 reduces a common mode current flowing in transmission lines that may connect MRI RF coil element 900 with an MRI system (not illustrated).

Figure 10:
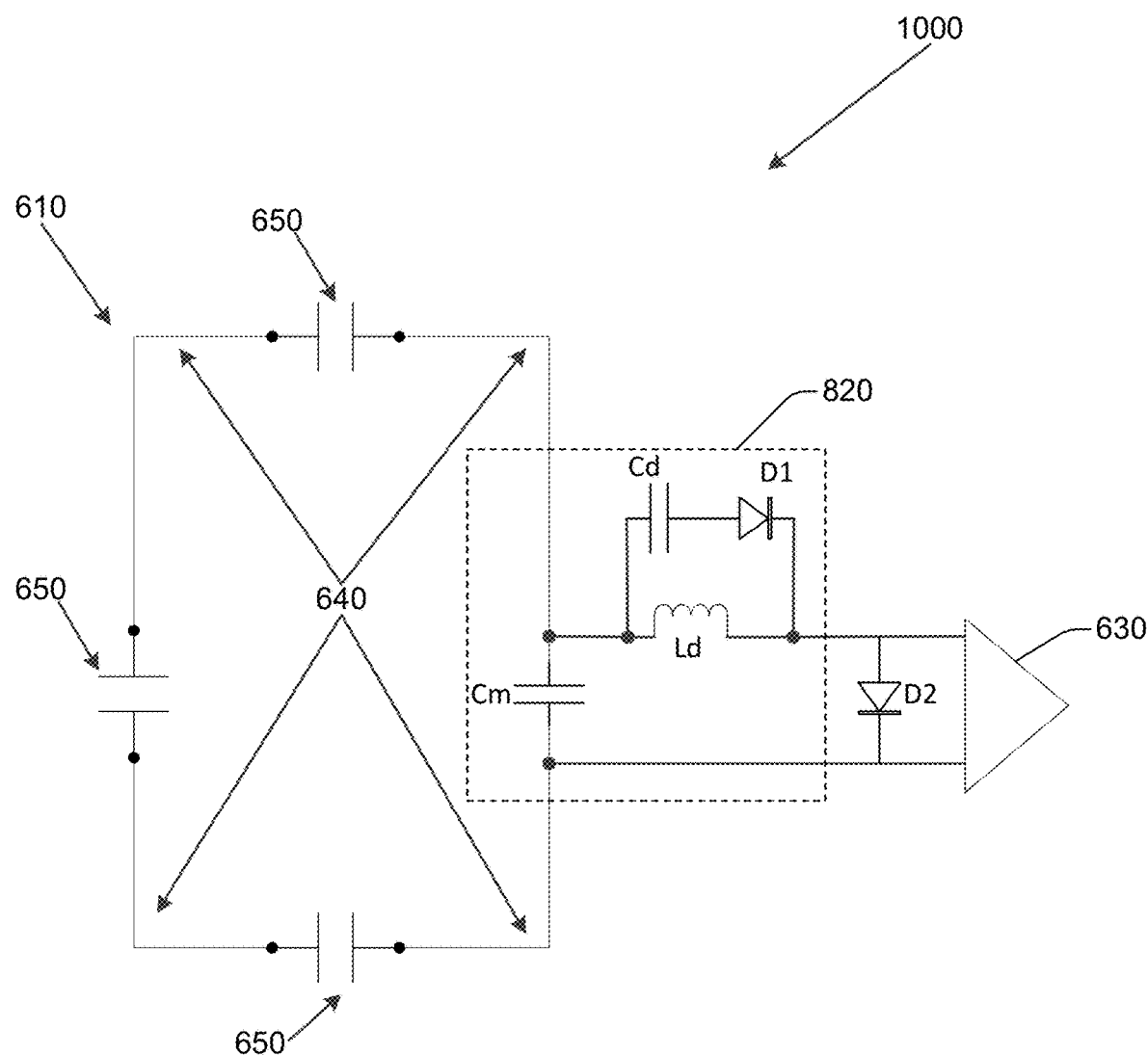
FIG. 10 illustrates an example single-layer MRI RF coil element.

FIG. 10 illustrates an MRI RF coil element 1000. MRI RF coil element 1000 is similar to MRI RF coil element 800, but includes additional elements and details. MRI RF coil element 1000 may be part of a single-layer MRI RF coil array. The single-layer MRI RF coil array comprises at least one RF coil element 1000. MRI RF coil element 1000 includes shunt diode D2. Shunt diode D2 may be a PIN diode. Shunt diode D2 has a first terminal and second terminal. Shunt diode D2 is connected, at a first terminal, to the first input terminal of preamplifier 630. Shunt diode D2 is connected, at a second terminal, to the second input terminal of preamplifier 630. To further improve isolation between high induced current in LC coil 610 and LNA preamplifier 630, shunt diode D2 provides additional shunt protection for the LNA preamplifier 630.

Figure 11:
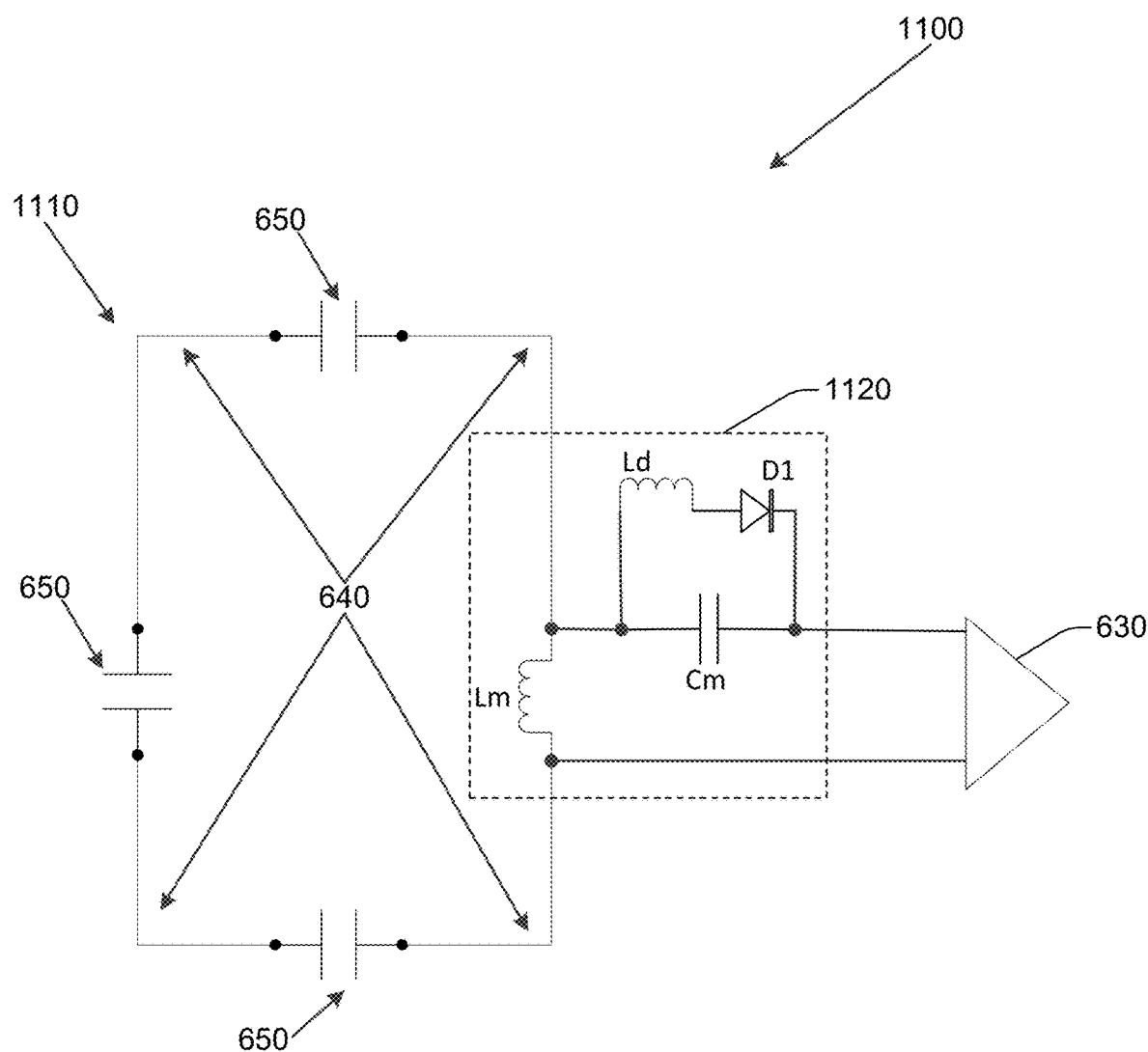
FIG. 11 illustrates an example single-layer MRI RF coil element.

FIG. 11 illustrates an MRI RF coil element 1100. MRI RF coil element 1100 is similar to MRI RF coil element 600, but includes additional elements and details. MRI RF coil element 1100 may be part of a single-layer MRI RF coil array. The single-layer MRI RF coil array comprises at least one RF coil element 1100. RF coil element 1100 includes an LC coil 1110. LC coil 1110 is similar to LC coil 610 but includes a matching inductor Lm having a first terminal and a second terminal. LC coil 1110 also includes at least one conductor 640 having a first end connected to the first terminal of the matching inductor Lm, and a second end connected to the second terminal of the matching inductor Lm.

In this embodiment, matching and Tx/Rx switch 1120 operates as an inductive matching circuit. Matching and Tx/Rx switch 1120 is connected to matching inductor Lm. Matching and Tx/Rx switch 1120 includes first inductor Ld having a first terminal and a second terminal, first diode D1 having a first terminal and a second terminal, and matching capacitor Cm having a first terminal and a second terminal. Matching inductor Lm is connected at a first terminal with the first terminal of matching capacitor Cm. Matching capacitor Cm is connected at a first terminal with the first terminal of first inductor Ld. First inductor Ld is connected at a second terminal with the first terminal of first diode D1. First diode D1 is connected at a second terminal with the second terminal of matching capacitor Cm. Matching capacitor Cm is connected at a second terminal with a first input terminal of pre-amplifier 630. Matching inductor Lm is connected, at a second terminal, with a second input terminal of pre-amplifier 630. The first diode D1, matching capacitor Cm, and first inductor Ld isolate input to the preamplifier 630 from an induced high current or voltage in LC circuit 1110 when first diode D1 is forward biased. While in this example first inductor Ld, first diode D1, and matching capacitor Cm are illustrated on a connection path between the first terminal of matching inductor Lm and a first input terminal of preamplifier 630, in another embodiment, first inductor Ld, first diode D1, and matching capacitor Cm may be connected instead between the second terminal of matching inductor Lm and the second input terminal of preamplifier 630.

Figure 12:
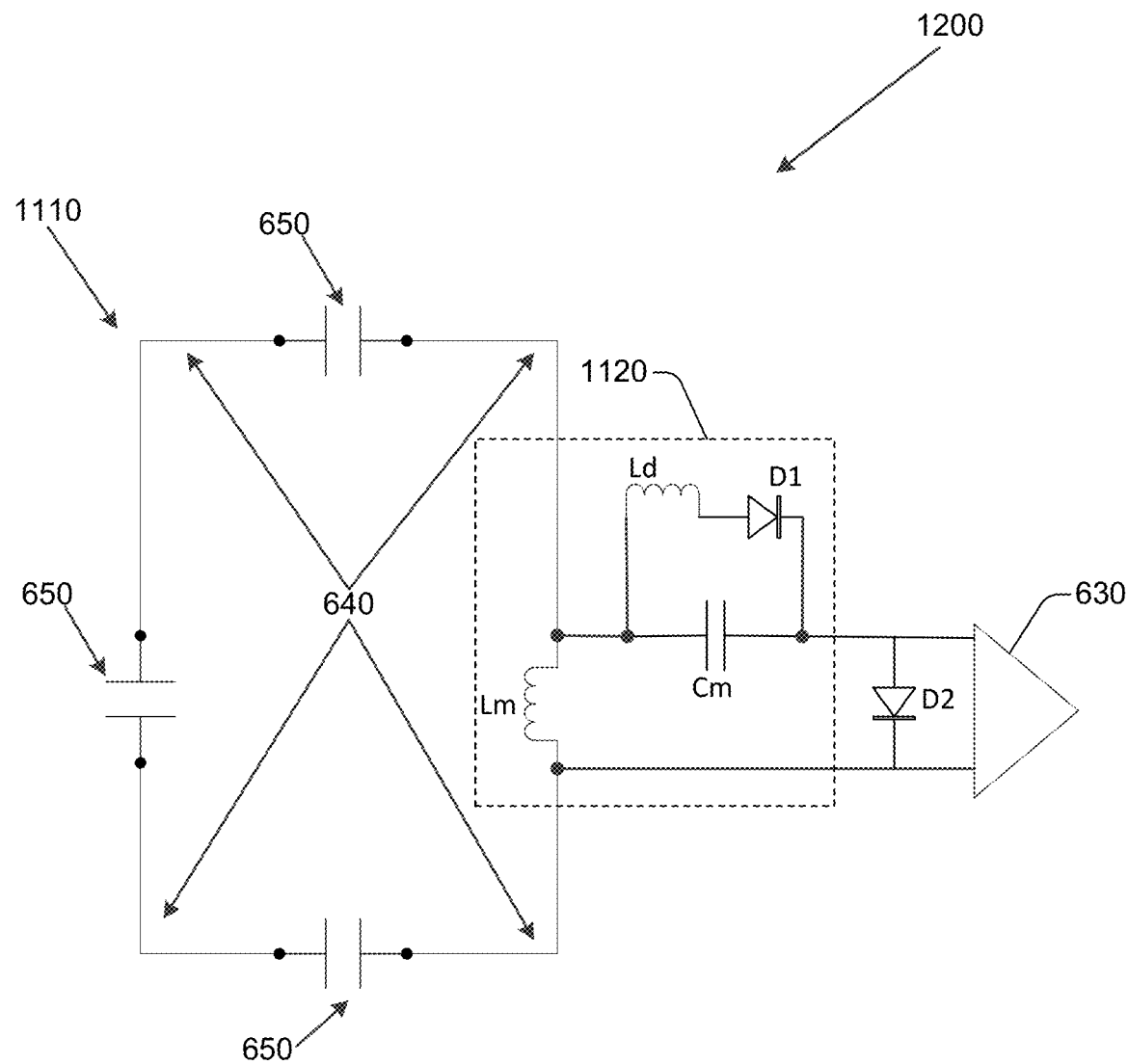
FIG. 12 illustrates an example single-layer MRI RF coil element.

FIG. 12 illustrates an MRI RF coil element 1200. MRI RF coil element 1200 is similar to MRI RF coil element 1100, but includes additional elements and details. MRI RF coil element 1200 may be part of a single-layer MRI RF coil array. The single-layer MRI RF coil array comprises at least one RF coil element 1200. MRI RF coil element 1200 includes shunt diode D2. Shunt diode D2 has a first terminal and second terminal. Shunt diode D2 is connected, at a first terminal, to a first input terminal of preamplifier 630. Shunt diode D2 is connected, at a second terminal, to a second input terminal of preamplifier 630. To further improve isolation between high current induced in LC coil 1110 and LNA preamplifier 630, shunt diode D2 provides additional shunt protection.

Embodiments described herein may include single-layer MRI RF coil arrays configured in shapes other than the cylindrical shape described above. For example, other shapes, including elliptical, rectangular, square, or other different shapes, may be used to build an Rx coil or single-layer MRI RF coil array for particular applications. For those shapes the concepts of the cylindrical case describe above are still applicable. Non-cylindrical shaped single-layer MRI RF coils may differ from cylindrical single-layer MRI RF coils in that the induced $B_1$ field of the other, non-cylindrical shapes is not as uniform as the induced $B_1$ field of the cylindrical case, but is still more than uniform enough for a Tx field in a clinical environment. The non-cylindrical shapes or cross sections discussed above are enclosed shapes or closed-shape configurations. Embodiments are not only applicable to an enclosed shape but may also be implemented as opened shapes, including MRI RF coil elements arranged on a single plane, on two parallel planes, on two planes that are within a threshold of parallel, or MRI RF coil elements arranged in an enclosed shape with a side not present, for example, a "C" shape or a "U" shape.

One embodiment of a single-layer MRI RF coil array that employs an opened shape includes a plurality of loops, saddles, or other MRI RF coil elements arranged on two parallel planes, or on non-parallel planes that are within a threshold tolerance of being parallel to each other, located at least a threshold distance apart, and that face each other directly. A threshold tolerance of being parallel may be, for example, a 1% tolerance, a 10% tolerance, or other, different tolerance. For example, a first point on a first MRI RF coil element may be located 20 cm from a corresponding first point on a facing, second MRI RF coil element, while a second point on the first MRI RF coil element may be located 22 cm from a corresponding second point on the second MRI RF coil element. In this embodiment, the size of the loops may be identical, or may be within a threshold margin of difference. For example, a first loop may describe an area of x cm$^2$, while a second loop may describe an area of 0.9x cm$^2$. In one embodiment, a plurality of different sized loops may be located on a first plane, while a second plurality of different sized loops may be located on a second, parallel plane, or on a second plane that is within a threshold tolerance of being parallel with the first plane.

Figure 13:
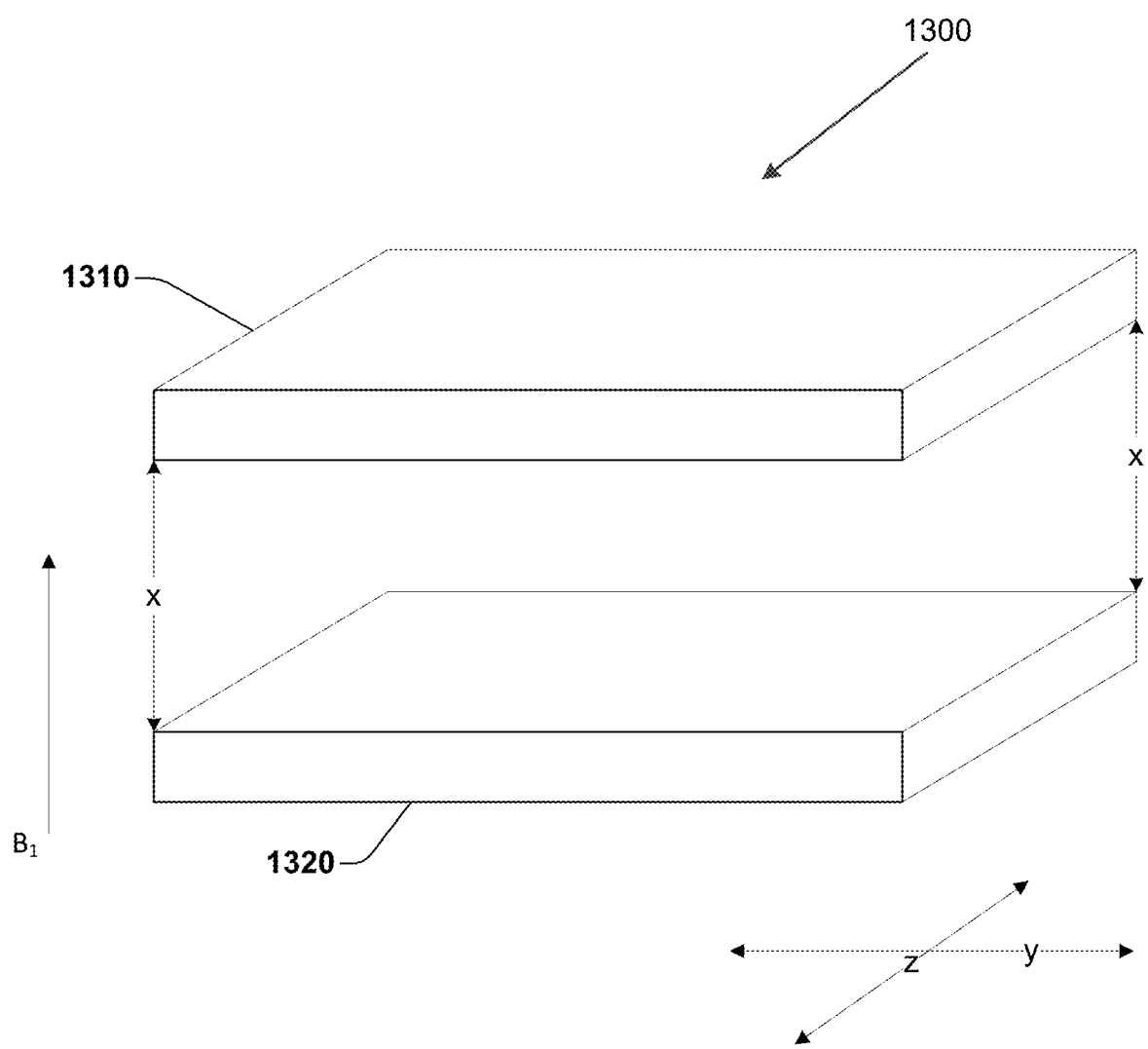
FIG. 13 illustrates an example open shape configuration single-layer MRI RF coil array.

FIG. 13 illustrates one embodiment of a single layer MRI RF coil array 1300 that includes at least two RF coil elements. While in this embodiment, only two RF coil loops are illustrated, in another embodiment, other, different numbers of RF coil loops may be employed. The at least two RF coil elements includes a first RF coil element 1310 and a second RF coil element 1320. First RF coil element 1310 and second RF coil element 1320 may include a single layer MRI RF coil element, including MRI RF coil element 600, 800, 900, 1000, 1100, 1200, 1500, or 2000-2700, or other single-layer MRI RF coil elements described herein. First RF coil element 1310 is arranged on a first plane, while second RF coil element 1320 is arranged on a second, different plane parallel to the first plane. FIG. 13 illustrates an example open shape configuration. The first plane and the second plane may be parallel to each other, and are located at least a threshold distance from each other. The threshold distance is a distance greater than zero. The threshold distance may be a function of a volume to be imaged, for example, the size or shape of a human knee, wrist, or head. In this example, the at least a threshold distance is indicated by "x" in FIG. 13. The first plane and the second plane may, in another embodiment, be within threshold of parallel from each other. The first RF coil element 1310 and the second RF coil element 1320 may be offset laterally from each other a distance greater than zero, or may be directly aligned. For example, the first RF coil element 1310 and second RF coil element 1320 may be located 30 cm from each other in the x axis, and laterally offset 3 cm in the y axis or z axis. In other embodiments, other offsets may be employed.

First RF coil element 1310 and second RF coil element 1320 inductively couple to each other since they face each other. If both first RF coil element 1310 and second RF coil element 1320 are tuned independently to the same frequency without the presence of the other coil, their resonant frequency will split into two frequencies: a lower frequency and a higher frequency. The lower frequency is for the current of both RF coil element 1310 and RF coil element 1320 flowing in the same direction. The higher frequency is for the current of both RF coil element 1310 and RF coil element 1320 flowing in opposite directions. The frequencies may be written as $$f = \frac{1}{2\pi\sqrt{(L \pm M)C}},$$

where L is the inductance of the coil, C is the capacitance, and M is the mutual inductance between RF coil element 1310 and RF coil element 1320.

When both first RF coil element 1310 and second RF coil element 1320 are placed inside a WBC and the WBC generates a circular polarized (CP) uniform or a uniform $B_1$ field perpendicular to the planes of the coils, then the current induced in one of first RF coil element 1310 or second RF coil element 1320 by the WBC directly may be expressed as $$i_{1\_WBC} = \frac{\omega_0 A * B_1}{R} \quad \text{(Eq. 15)}$$

where A is the area of the loop, $B_1$ is the magnitude of WBC field, and R is the coil loss. In an example embodiment in which first RF coil element 1310 or second RF coil element 1320 includes RF coil element 600, 800, 900, 1000, 1100, 1200, 1500, or 2000-2700, then the area A of the loop corresponds to the area of LC coil 610 or LC coil 1110. Here, R is the only term in the denominator of Eq. 15 because $$j\omega_0 L - j\frac{1}{\omega_0 C} = 0$$

at the resonant frequency $\omega_0$. The same current is also true for the other coil. For clarity, herein only the $B_1$ field perpendicular to the first plane and second plane is described. However, a $B_1$ field that is not perpendicular to the first plane and second plane may be described similarly. This is shown in equation 16 below.

$$i_{2\_WBC} = \frac{\omega_0 A * B_1}{R} \quad \text{(Eq. 16)}$$

Recall that both currents are flowing in the same direction. Because there is mutual inductance between first RF coil element 1310 and second RF coil element 1320, the final current $i_1$ of the first RF coil element 1310 includes the additional current caused by mutual inductance coupling. The final currents $i_1$ and $i_2$ can be written as:

$$i_1 = \frac{\omega_0 A * B_1}{R} - \frac{M\frac{d(i_{2\_WBC})}{dt}}{R} = \frac{\omega_0 A * B_1}{R} - M\frac{j(\omega_0^2 A * B_1)}{R^2} \quad \text{(Eq. 17)}$$

$$i_2 = \frac{\omega_0 A * B_1}{R} - \frac{M\frac{d(i_{1\_WBC})}{dt}}{R} = \frac{\omega_0 A * B_1}{R} - M\frac{j(\omega_0^2 A * B_1)}{R^2} \quad \text{(Eq. 18)}$$

Both $i_1$ and $i_2$ flow in the same direction and have the same current magnitude. In this example, the coupling or mutual inductance between the first loop or first RF coil element 1310 and the second loop or second RF coil element 1320 causes a Tx efficiency loss. Thus, the sign before M in equation 17 and equation 18 is "−", (i.e., negative sign). This embodiment thus may function as the equivalent of a two-turn solenoid or a saddle coil which generates a transmitting field that has a uniformity suitable for clinical use. The Tx efficiency loss may be minimized by shifting the tuning frequency of both coils such that the two-turn solenoid mode frequency is close to or the same as the working frequency in Tx mode only. In another embodiment, other, different configurations of coils may be employed.

In one embodiment of single-layer MRI RF coil array 1300, a member of the at least two RF coil elements (e.g. first RF coil element 1310, second RF coil element 1320) includes an LC coil, a matching and Tx/Rx switch circuit, and a preamplifier. In this embodiment, the LC coil includes at least one inductor and at least one capacitor. The at least one inductor and the at least one capacitor resonate at a first frequency. The LC coil is connected with the matching and transmit Tx/Rx switch circuit. The matching and transmit Tx/Rx switch circuit is connected to the preamplifier. The matching and Tx/Rx switch circuit, when operating in Tx mode, electrically isolates the LC coil from the preamplifier upon the LC coil resonating with a primary coil at the first frequency. The LC coil, upon resonating with the primary coil at the first frequency, generates a local amplified Tx field based on an induced current in the LC coil. A magnitude of the induced current or a phase of the induced current is independently adjustable. For example, the magnitude or phase of the induced current may be variable over a range of magnitudes or phases respectively, by varying the coil loss resistance of the primary coil, the coil loss resistance of first RF coil element 1310 or second RF coil element 1320, or the difference between the working frequency of the primary coil and the resonant frequency of first RF coil element 1310 or second RF coil element 1320. The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit. In one embodiment, the LC coil includes a shunt PIN diode or protection PIN diode that provides further shunt protection to the preamplifier.

Figure 14:
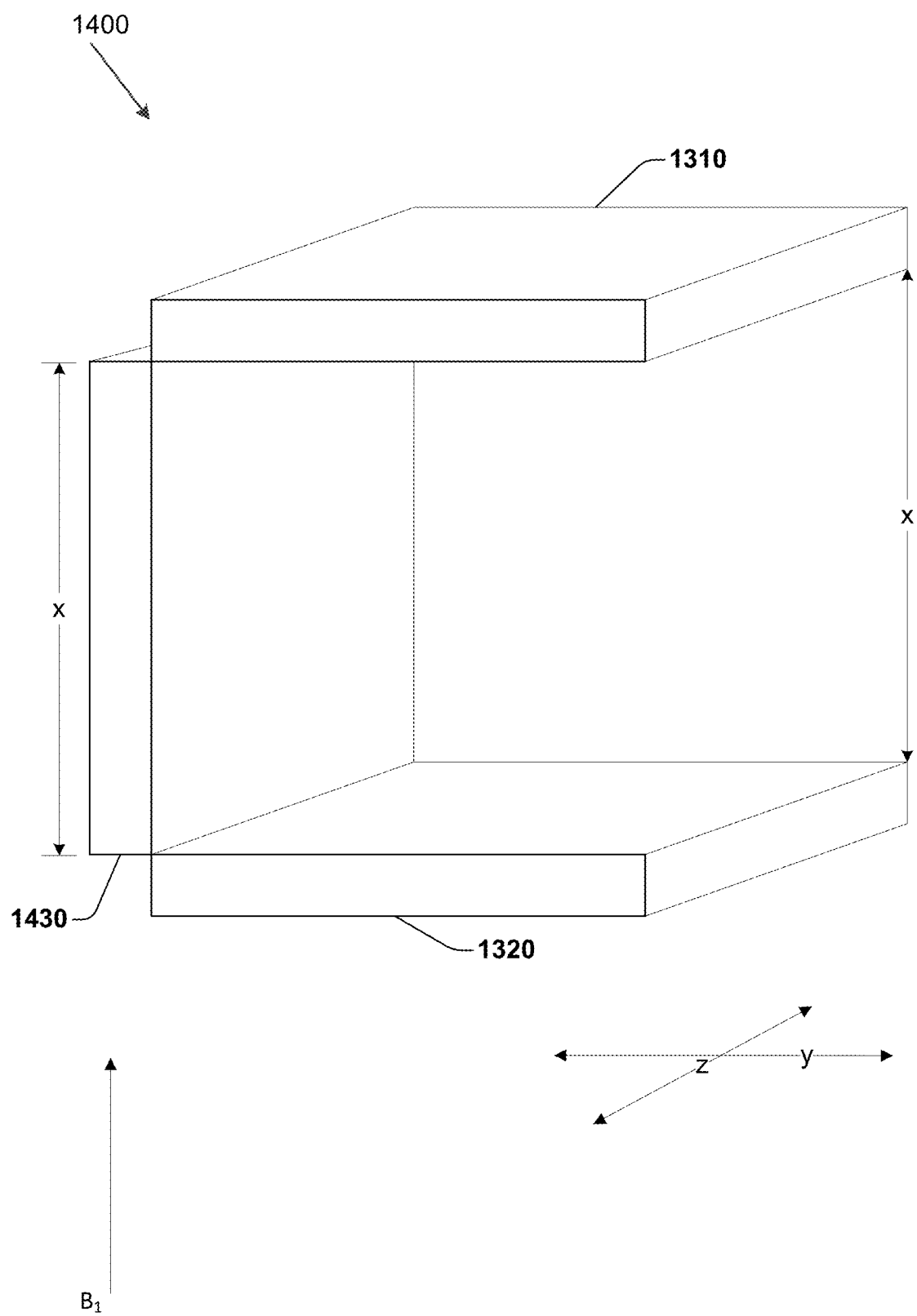
FIG. 14 illustrates an example open shape configuration single-layer MRI RF coil array.

FIG. 14 illustrates a single-layer MRI RF coil array 1400 that is similar to single-layer MRI RF coil array 1300 but that includes additional details and elements. Single-layer MRI RF coil array 1400 includes first RF coil element 1310, second RF coil element 1320, and also includes a third RF coil element 1430. FIG. 14 illustrates first RF coil element 1310, second RF coil element 1320, and third RF coil element 1430 disposed in an open shape configuration. In this embodiment, the RF coil elements 1310, 1320, and 1430 of MRI RF coil array 1400 are arranged approximately in the shape of a "C" or "U". First loop or RF coil element 1310 is arranged on a first plane, while second loop or RF coil element 1320 is arranged on a second, different plane. The first plane and the second plane may be parallel or slightly non-parallel to each other, and are located at least a threshold distance from each other. The threshold distance is a non-zero distance greater than zero. In this example, the at least a threshold distance is indicated by "x" in FIG. 14. In one embodiment, third RF coil element 1430 is arranged on a third plane that is perpendicular to the first plane and the second plane. In another embodiment, third RF coil element 1430 is arranged on a third plane that is within a threshold degree of parallel with the first plane or the second plane. For example, in one embodiment configured for a first anatomy to be imaged, the third RF coil element 1430 is arranged on a third plane that is perpendicular with the first plane and the second plane. In another embodiment configured for a second, different anatomy, the third RF coil element 1430 is arranged on a third plane that is not perpendicular with the first plane and the second plane. In one embodiment, an angle formed by the intersection of the third plane with the first plane or the second plane is user adjustable.

In one embodiment, third RF coil element 1430 is offset from the first RF coil element 1310 or the second RF coil element 1320 a non-zero amount along a y axis or a z axis. For example, the first RF coil element 1310 and second RF coil element 1320 may be located 30 cm from each other in the x axis, and laterally offset 3 cm in the y axis. The third RF coil element 1430 may be laterally offset 2 cm in the z axis from the first RF coil element 1310 and the second RF coil element 1320. In other embodiments, other offsets may be employed.

Third RF coil element 1430, like first RF coil element 1310 and second RF coil element 1320, may include an MRI RF coil element described herein, including single-layer MRI RF coil elements 600, 800, 900, 1000, 1100, 1200, 1500, or 2000-2700. While three RF coil elements are illustrated, in another embodiment, other, different numbers of RF coil elements may be employed.

In one embodiment of single-layer MRI RF array coil 1400, a member of the at least three RF coil elements (e.g. first RF coil element 1310, second RF coil element 1320, third RF coil element 1430) includes an LC coil, a matching and transmit (Tx)/receive (Rx) switch circuit, and a preamplifier. In this embodiment, the LC coil includes at least one inductor and at least one capacitor. The at least one inductor and the at least one capacitor resonate at a first frequency. The matching and Tx/Rx switch circuit, when operating in Tx mode, electrically isolates the LC coil from the preamplifier upon the LC coil resonating with a primary coil at the first frequency. The LC coil, upon resonating with the primary coil at the first frequency, generates a local amplified Tx field based on an induced current in the LC coil. A magnitude of the induced current or a phase of the induced current is independently adjustable. The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit. In one embodiment, the LC coil includes a shunt PIN diode or protection PIN diode that provides further shunt protection to the preamplifier.

Embodiments described herein may also be described using a mode approach. For example, two identical coils facing each other may both resonate at the same frequency if the other coil does not exist. Due to mutual inductance the two coils create two intrinsic resonant modes. The first mode is the lower frequency mode which is called saddle mode or corotation mode, where both coils' currents flow in the same direction. The other mode has a higher frequency and is called anti-saddle mode or counter-rotation mode in which the currents of the coils flow in opposite directions. If a uniform external field or a circular polarized uniform external field is applied to the coils, only the saddle mode configuration will have induced voltage because its net flux is non-zero while the anti-saddle mode's net flux is zero. As a result two identical coils, or coils having sufficient similarity, facing each other will generate an amplified $B_1$ field by the local saddle mode which has a level of uniformity suitable for clinical use. The external uniform field serves as a selector for modes. The larger the net magnetic flux the mode has, the more energy from the external field is coupled. The frequency of a mode determines the Tx efficiency of the mode. The closer the frequency of the mode is to the working frequency, the more efficient the coupling between the WBC and the mode.

This discussion can also be extended to embodiments that employ a plurality of MRI RF coil elements. For example, in an embodiment with N coil elements in which some or all of the N coil elements' isolations may not be good (i.e., the isolation may not be within a threshold tolerance), the N coil elements will couple to each other and create M Eigen-resonant modes in which a mode is a sum of some or all coil elements with different weighting coefficients and phases, where N and M are integers. In this embodiment, a mode is excited proportionally by the net magnetic flux of each mode from the WBC. The most uniform mode among all modes has the largest net magnetic flux from the WBC. For example, a two-element embodiment will be more uniform among modes. Therefore, the most uniform mode among the modes is the strongest mode excited by the WBC. If other less uniform modes' net magnetic fluxes from the WBC are not zero, they will be also excited but the induced fields from them are weaker than the most uniform mode, on average. The other less uniform modes make the final combined induced field more uniform than the induced field from the most uniform mode only. Thus, the final combined induced field is sufficiently uniform for use in clinical MRI applications. To achieve a higher Tx efficiency the most uniform mode frequency should be close to the WBC frequency in Tx mode only.

In summary, a plurality of single-layer MRI RF coils or MRI RF coil array elements configured as a single-layer MRI RF coil array, resonating with a WBC coil in Tx mode will induce a local amplified Tx field. A single-layer MRI RF coil array element may have the magnitude and phase of an induced current adjusted independently of another, different coil array element. The local amplified Tx field has a threshold level of uniformity and the single-layer MRI RF coil array is used as a transmitter coil. This amplified Tx field improves the WBC power efficiency and reduces the SAR compared to conventional approaches because non-related anatomy areas will not experience a high Tx field from the WBC. Because the Tx field is adjustable via independent phase or magnitude control, a region of tissue being imaged may be subjected to a more uniform Tx field at different locations within the region of tissue. In one embodiment, MRI RF array coils that connect to an MRI system can be connected through cables or may be connected wirelessly with no cables.

Embodiments described herein are configured such that the magnitude of the induced current or the phase of the induced current is variable over a range of magnitudes or phases respectively. Example embodiments adjust the magnitude and phase of the induced current $i_s$ of a coil in Tx mode such that the image quality is still acceptable for clinical MRI. When a single-layer MRI RF coil array operates in Rx mode, it operates as a phased array receiving coil with a frequency tuned to the working frequency for optimum SNR. Embodiments described herein provide magnitude and phase adjustment for an RF coil operating in Tx mode. Different approaches to adjust a coil's magnitude and phase are now described herein.

Recall from equation 3 that the local inductively coupled coil current can be written as:

$$i_s = \frac{-j\omega M \varepsilon}{(R_p R_s + \omega^2 M^2)} \quad \text{(Eq. 3.1)}$$

where $i_s$ is the induced current of local RF coil, $R_p$ is the coil loss resistance of the WBC, $R_s$ is the coil loss resistance of the local RF coil, M is the mutual inductance between the WBC and the local RF coil and $\varepsilon$ is the driving voltage of the WBC. The Eq. 3.1 immediately above assumes that both the WBC and the local RF coil resonate at the same working frequency. Because the local coil is smaller than the WBC, the magnetic field generated by $i_s$ is significantly larger than the magnetic field generated from the WBC. Therefore the Tx field is dominated by the local coil. The WBC is part of the MRI system and its frequency is fixed at the nominal working frequency. Typically, the working frequency of the WBC cannot be changed, and typically, a WBC cannot be removed from an MRI system in normal clinical practice.

Embodiments are configured to adjust the magnitude and phase of the induced $i_s$ of a coil (e.g., a loop, a coil array element) in a single-layer MRI RF coil array while operating in Tx mode. When a coil in a single-layer MRI RF coil array is operating in Rx mode, the single-layer MRI RF coil array operates as a phased array Rx coil where a coil's frequency is tuned to the working frequency for optimum SNR.

Figure 15:
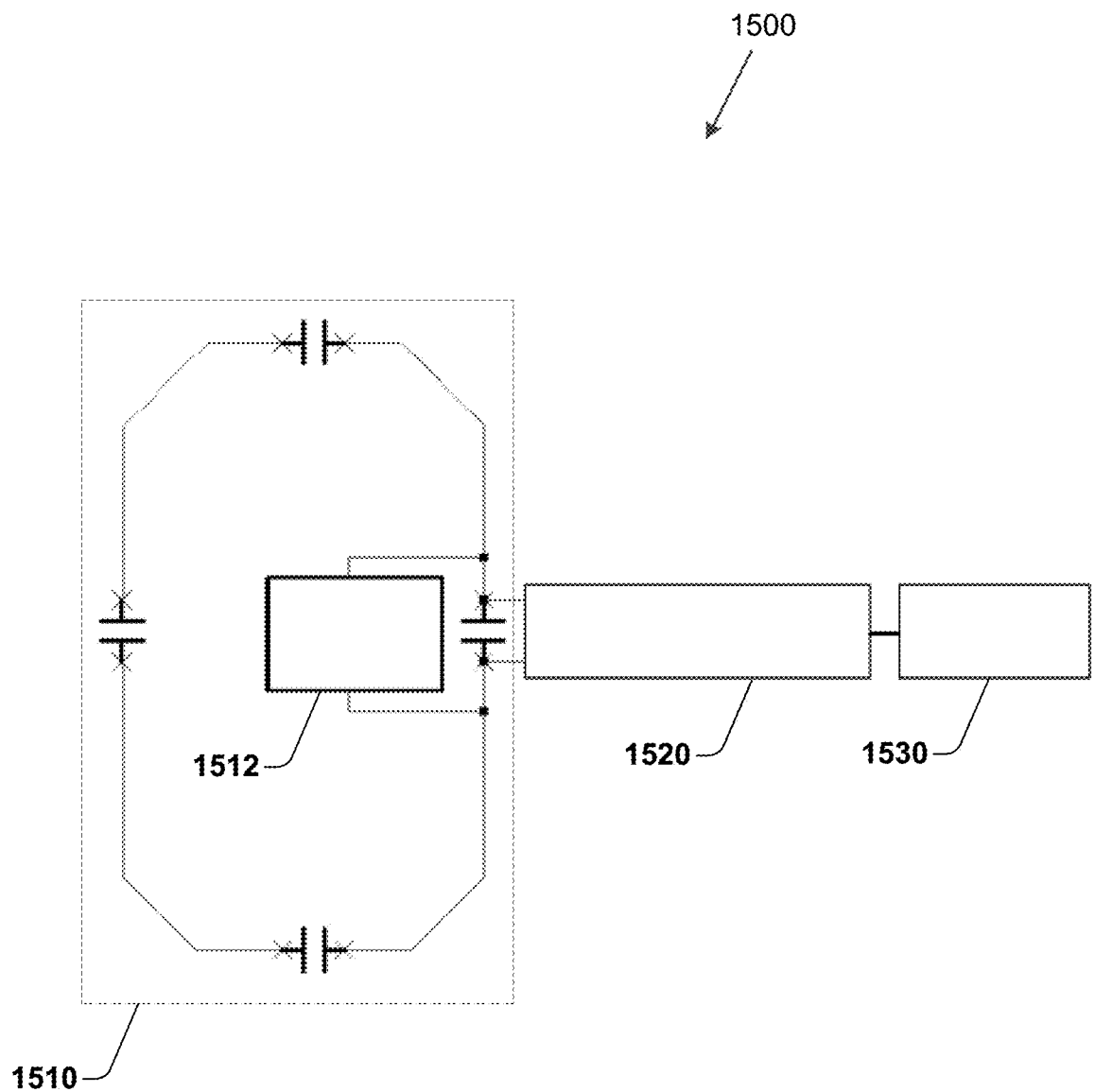
FIG. 15 illustrates an example single-layer MRI RF coil element.

FIG. 15 illustrates an example single-layer MRI RF coil array element 1500 configured to operate in a Tx mode and an Rx mode. Single-layer MRI RF coil array element 1500 includes an LC coil 1510, a matching and Tx/Rx switch circuit 1520 operably connected to the LC coil 1510, and a preamplifier or other Rx electronics 1530 operably connected to the matching and Tx/Rx circuit 1520. LC coil 1510 further includes a magnitude/phase control circuit 1512 operably connected to LC coil 1510.

LC coil 1510 includes at least one inductor and at least one capacitor, where the at least one inductor and the at least one capacitor resonate at a first frequency. The first frequency may be, for example, the working frequency. In one embodiment, LC coil 1510 may be configured as LC coil 610 illustrated in FIG. 6, 8, 9, or 10. In another embodiment, LC coil 1510 may be configured as LC coil 1110 as illustrated in FIG. 11 or 12.

In one embodiment, LC coil 1510 includes at least one conductor. The at least one conductor may be a flexible co-axial cable. Thus, LC coil 1510 may be configured as a flexible LC coil, and single-layer MRI RF coil array element 1500 may be configured as a flexible single-layer MRI RF coil array element.

The matching and Tx/Rx switch circuit 1520, when operating in Tx mode, electrically isolates LC coil 1510 from preamplifier 1530 upon LC coil 1510 resonating with a primary coil (not illustrated). The primary coil has a working frequency.

In one embodiment, the matching and Tx/Rx switch circuit 1520 is a capacitive matching and Tx/Rx switch circuit. For example, matching and Tx/Rx switch circuit 1520 may be configured as matching and Tx/Rx switch circuit 820 illustrated in FIG. 8. In another embodiment, matching and Tx/Rx switch circuit 1520 may be configured as matching and Tx/Rx switch circuit 920 illustrated in FIG. 9. In another embodiment, matching and Tx/Rx switch circuit 1520 may be configured using other, different matching and Tx/Rx switch circuitry configurations.

LC coil 1510, upon resonating with the primary coil, generates a local amplified Tx field based on an induced current in LC coil 1510. The induced current is generated by inductive coupling between LC coil 1510 and the primary coil. A magnitude of the induced current or a phase of the induced current is independently adjustable. The magnitude of the induced current or the phase of the induced current is configured to be varied over a range of magnitudes or phases respectively.

The matching and Tx/Rx switch circuit 1520, when operating in Rx mode, electrically connects LC coil 1510 with preamplifier 1530.

Magnitude/phase control circuit 1512 is configured to adjust the magnitude of the induced current or the phase of the induced current. In one embodiment, magnitude/phase control circuit 1512 is configured to, upon single-layer MRI RF coil array element 1500 operating in Tx mode, adjust the magnitude of the induced current or the phase of the induced current by shifting the first frequency of LC coil 1510 relative to the working frequency of the primary coil. For example, in one embodiment, magnitude/phase control component 1512 is configured to use a first approach to adjust a magnitude of the induced current or the phase of the induced current by shifting the MR coil's (e.g., LC coil 1510) resonant frequency from the working frequency of the WBC. Recall that the induced current $i_s$ may be expressed as:

$$i_s = \frac{-j\omega M \varepsilon}{\left(R_p R_s + \omega^2 M^2 + jR_p\left(\omega L_s - \frac{1}{\omega C_s}\right)\right)} \quad \text{(Eq. 4)}$$

where there is an additional term $$jR_p\left(\omega L_s - \frac{1}{\omega C_s}\right)$$

in the denominator.

If the coil frequency is same as the working frequency, this additional term is zero. Example embodiments adjust this new term by changing the frequency to either higher than the working frequency or lower than the working frequency. This facilitates adjusting the magnitude and phase of the induced current $i_s$ simultaneously. If the magnitude and phase of $i_s$ are changed, the magnitude and phase of the induced field is also changed. Thus we have a coil that is a pTx-equivalent coil. Eq. 4 changes magnitude and phase simultaneously. In some situations, it may be desirable to have additional freedom to control magnitude and phase independently. Embodiments facilitate controlling the magnitude and phase of the induced current independently.

In another embodiment, magnitude/phase control circuit 1512 is configured to use a second approach to adjust a coil's magnitude and phase by independently adding additional coil loss (i.e., resistance) when operating in Tx mode. For example, in one embodiment, the magnitude/phase control circuit 1512 is configured to, upon the single-layer MRI RF coil array element 1500 operating in Tx mode, adjust the magnitude of the induced current or the phase of the induced current by adding coil loss to the LC coil 1510. In this embodiment, the magnitude/phase control circuit 1512 comprises a resistor and a PIN diode connected in parallel with the at least one capacitor, where the single-layer MRI RF coil array element 1500 operates in Tx mode upon the injection of a DC bias into the PIN diode, where the DC bias forward biases the PIN diode.

Figure 16:
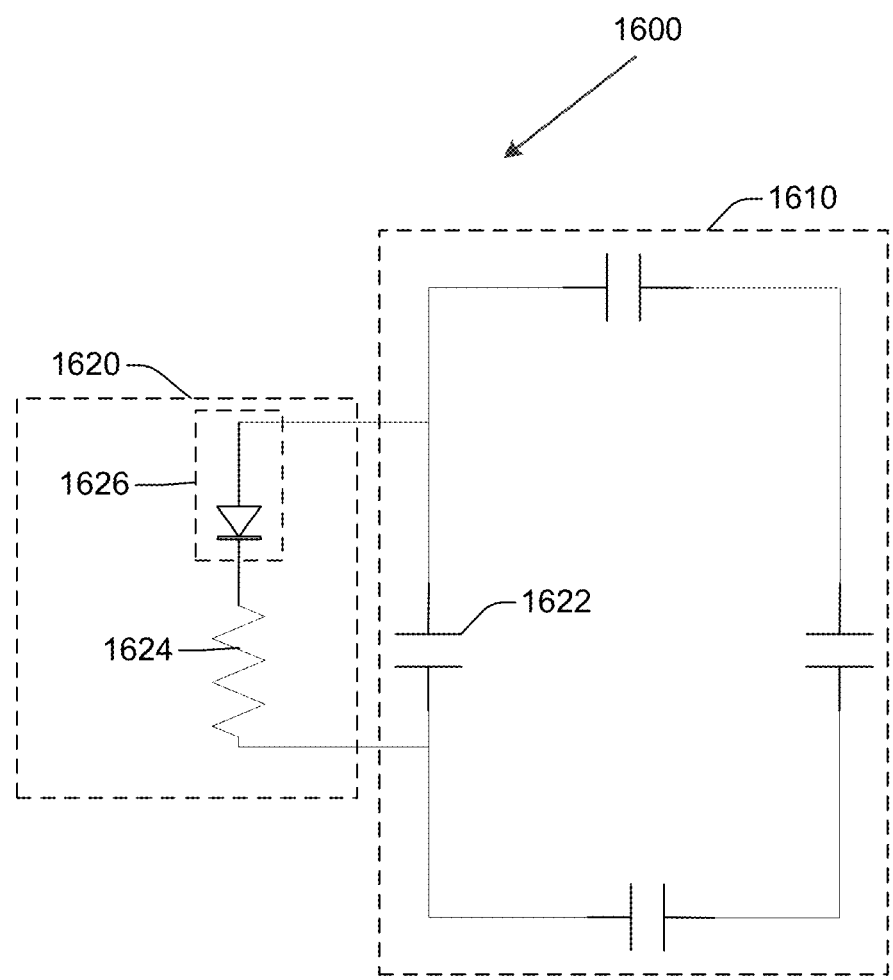
FIG. 16 illustrates an example single-layer MRI RF coil element.

This second approach includes increasing $R_s$ when operating in Tx mode. Increasing $R_s$ reduces the magnitude alone if the coil's resonant frequency is the same as the working frequency. Increasing $R_s$ reduces both magnitude and phase if the coil's resonant frequency and the working frequency are different. One example implementation of this second approach is illustrated in FIG. 16, which includes adding coil loss. In this embodiment, the single-layer MRI RF coil array element 1600 includes a magnitude/phase control circuit 1620, and LC coil 1610 that includes one or more breaking point capacitors 1622. A resistor 1624 is added in parallel to the capacitor 1622 through a PIN diode 1626. Matching and Rx/Tx switch circuit 1520 and preamplifier 1530 are not illustrated for clarity. The breaking point can also be a feeding point, i.e., a matching capacitor. In Tx mode the PIN diode 1626 is shorted and the resistor 1624 is in parallel with capacitor 1622, which causes $R_s$ to increase. The value of $R_s$ may be chosen to meet particular magnitude and phase requirements for imaging different anatomical regions. The resistor 1624 is configured to be powerful enough to take a high current in Tx mode. For example, resistors having resistance within the kilo-Ohms range may be employed to reduce current magnitude significantly. The smaller the resistor value, the lesser the current magnitude, and the lower the coil Q in Tx mode. In Rx mode the PIN diode 1626 is open, and the resistor 1624 is therefore not part of the coil resistance. This still results in a high Q receiving coil.

In another embodiment, the magnitude/phase control component 1512 is configured to, upon the single-layer MRI RF coil array element 1500 operating in Tx mode, adjust the magnitude of the induced current or the phase of the induced current by decreasing the induced current. In this embodiment, the magnitude/phase control circuit 1512 is configured to decrease the induced current by operating as a parallel resonant circuit when in Tx mode. In this embodiment, the magnitude/phase control circuit 1512 comprises an inductor and a PIN diode connected in parallel with a first member of the at least one capacitor, where the first member of the at least one capacitor has a higher capacitance than a second, different member of the at least one capacitor, where the single-layer MRI RF coil array element operates in Tx mode upon the injection of a DC bias into the PIN diode, where the DC bias forward biases the PIN diode. In one embodiment, the magnitude/phase control circuit 1512 introduces a blocking impedance of less than one-hundred Ohms to the LC coil when operating in Tx mode.

Figure 17:
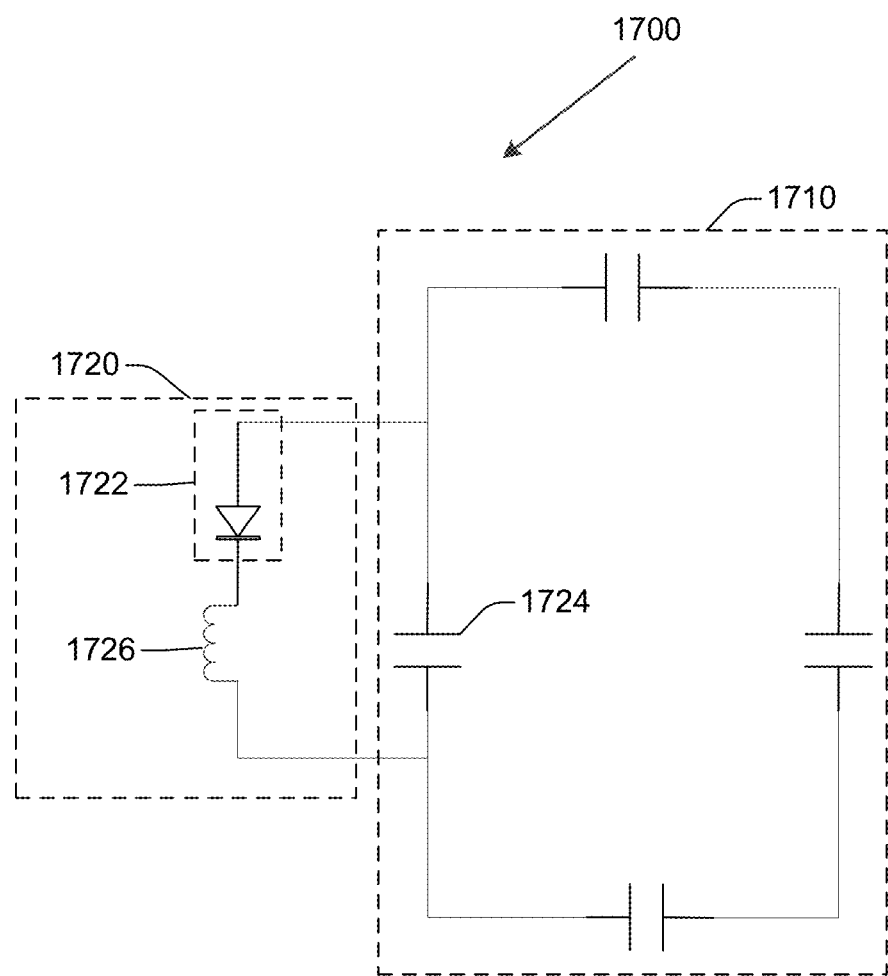
FIG. 17 illustrates an example single-layer MRI RF coil element.

For example, in one embodiment, magnitude/phase control circuit 1512 is configured to use a third approach that includes introducing a parallel resonant circuit in the coil when operating in Tx mode only. One example implementation of this third approach is illustrated in FIG. 17. FIG. 17 illustrates a single-layer MRI RF coil array element 1700 that includes LC coil 1710, and magnitude/phase control circuit 1720. Magnitude/phase control circuit 1720 is configured as an LC parallel resonant circuit. Magnitude/phase control circuit 1720 includes a PIN diode 1722 that controls magnitude/phase control component 1720 to minimize the induced current in a coil 1710 when operating in Tx mode. Typically, the blocking impedance of magnitude/phase control circuit 1720 when operating in Tx mode as an LC parallel resonant circuit is very large, e.g., several kOhm. This impedance almost completely eliminates the induced current in coil 1710. Example embodiments may still need to use the induced current. Thus, example embodiments may reduce current magnitude, but do not need to almost completely eliminate the current. Therefore example embodiments may employ a weak blocking impedance of several Ohms to tens of Ohms, instead of a strong blocking impedance of several kOhms. Example embodiments may use a capacitor 1724 having a large value of capacitance and inductor 1726 having a small value of inductance to resonate. This parallel resonant circuit 1720 can be installed anywhere in the coil 1710 to reduce the induced current in Tx mode only. Recalling that $$i_s = \frac{-j\omega M \varepsilon}{(R_p R_s + \omega^2 M^2)}$$

and Eq. 4, example embodiments thus facilitate controlling current magnitude by changing the value of R. In Rx mode the PIN diode 1722 is open. In one embodiment, example embodiments may reduce the current magnitude such that the single-layer MRI RF coil is operating in a non-amplified Tx mode.

Figure 18:
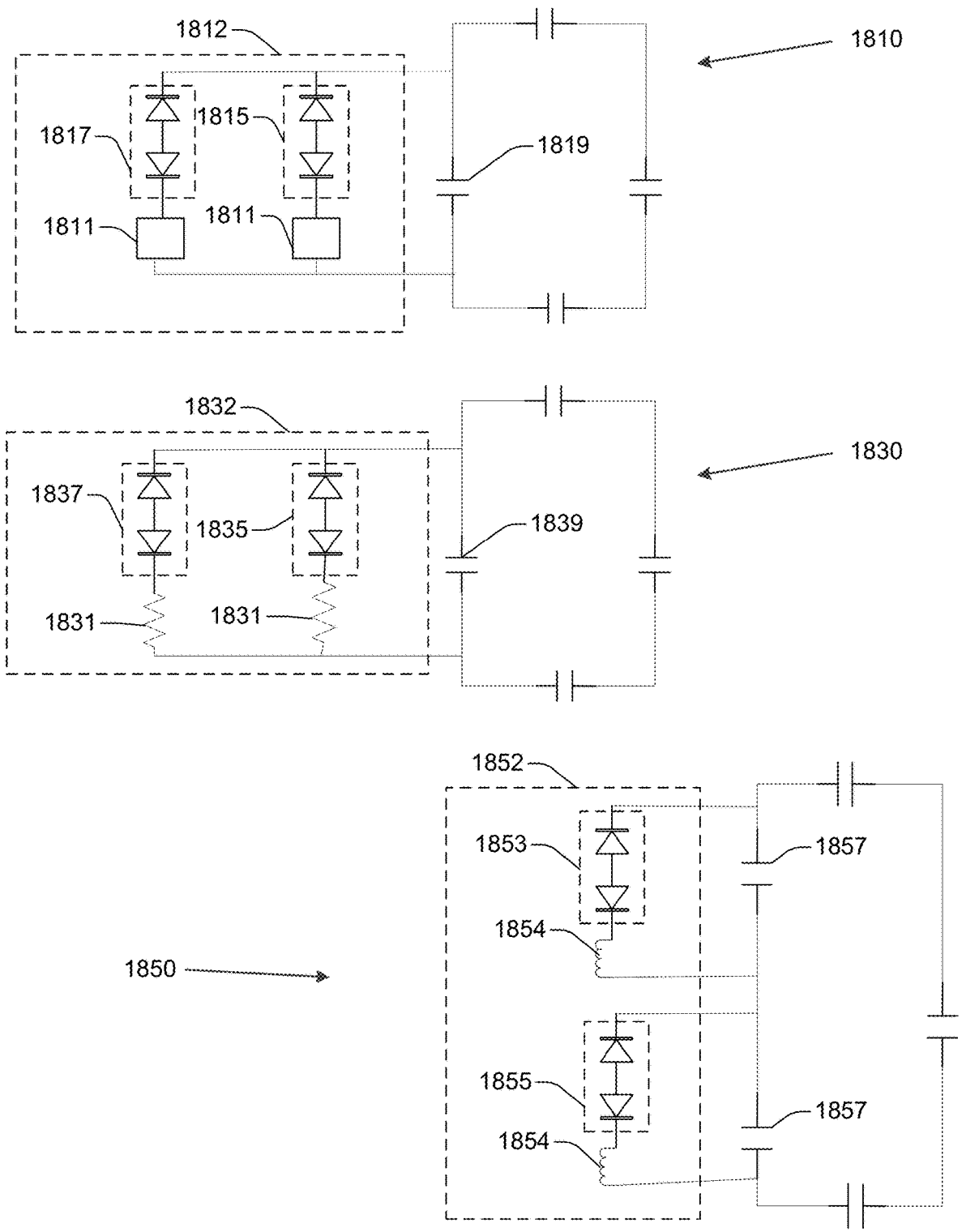
FIG. 18 illustrates example single-layer MRI RF coil elements.

The three approaches to adjust a coil's magnitude and phase described above may be employed together to create a mode selection approach for different induced current magnitudes and phases for the same coil in Tx mode. This approach is shown in FIG. 18. FIG. 18 illustrates single-layer MRI RF coil array elements 1810, 1830, and 1850. For clarity of illustration, FIG. 18 does not include matching and Tx/Rx switch circuitry or a preamplifier or other Rx electronics. FIG. 18 illustrates magnitude/phase control circuit 1812, 1832, and 1852 which are configured to provide two mode switching. Mode switching is conducted by applying a bias to PIN diode pairs 1815 and 1817, 1835 and 1837, or 1853 and 1855. Each of PIN diode pairs 1815 and 1817, 1835 and 1837, or 1853 and 1855 includes a pair of back-to-back PIN diodes. In other embodiments, three or more modes switching may be implemented by adding more back to back diodes into the path. The back to back diodes in PIN diode pairs 1815 and 1817, 1835 and 1837, or 1853 and 1855 have reverse polarization from each other. The PIN diodes' breakdown voltage may be greater than the induced voltage across the capacitor 1819, 1839, or 1857 respectively when operating in Tx mode. In Tx mode only one pair of diodes (e.g., either PIN diode pair 1815 or PIN diode pair 1817) will be ON (short). For example, PIN diode pair 1815 can be ON (short) and PIN diode pair 1817 can be OFF (open) or vice versa in Tx mode. The PIN diode pair 1815 pair path and the PIN diode pair 1817 pair path will have different induced magnitude and phase. These different magnitudes and phases may be used for different purposes depending on particular clinical scanning requirements. If one of the PIN diode pairs is not ON while the other one is ON, the breakdown voltage that is greater than the induced voltage across the capacitor will ensure the not-ON PIN diode pair path is not part of the coil and the pair of PIN diodes survives the currents generated when operating in Tx mode. The approach may be expanded to more than two modes, such as three modes, four modes, or more modes.

Magnitude/phase control circuit 1812 is configured to provide control of two different switchable magnitudes and phases by frequency shifting using reactance. Reactance components 1811 may include a capacitor or an inductor.

Magnitude/phase control circuit 1832 is configured to provide control of two different switchable magnitudes and phases using coil losses generated with the resistor-based approach described with respect to FIG. 16. Thus, magnitude/phase control circuit 1832 is similar to magnitude/phase control circuit 1812, but includes resistors 1831 instead of reactance components 1811.

Magnitude/phase control circuit 1852 is configured to provide control of two different switchable magnitudes and phases control using coil loss produced by LC parallel resonance. Magnitude/phase control circuit 1852 includes PIN diode pairs 1853 and 1855, and inductors 1854. One exemplary LC parallel resonance approach is described with respect to FIG. 17 which may be extended to the embodiment illustrated in FIG. 18.

Example embodiments thus provide circuits, components, means, or techniques to facilitate independent magnitude and phase control for an MRI RF coil by solving the magnitude and phase equation with the controllable variables as described above. Furthermore, example embodiments facilitate choosing more than one different magnitude and phase combination, i.e., more than one different Tx field pattern for different scanning or different anatomical region imaging requirements. In embodiments described herein, these approaches create Tx fields in Tx mode. In Rx mode, coils described herein operate as a phased array coil at the nominal working frequency.

Figure 19:
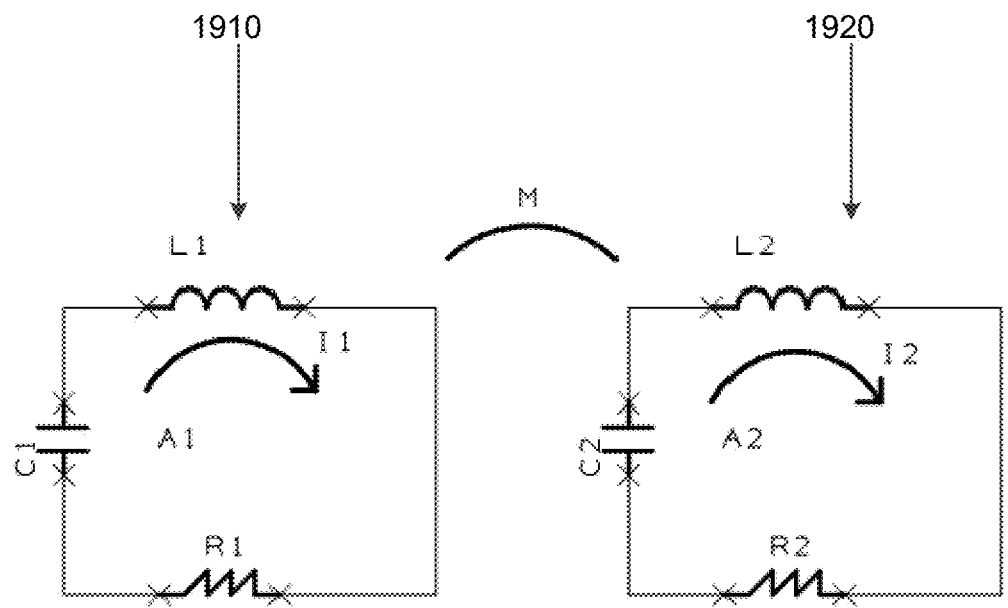
FIG. 19 illustrates inductively coupled resonant RF coils.

In addition to an induced current from a WBC field, an MRI RF coil array element as described herein may experience induced current from other MRI RF coil array elements due to non-trivial mutual inductance among the MRF RF coil array element and the other MRI RF coil array elements. FIG. 19 demonstrates this induced current. Two MRI RF coil array elements 1910 and 1920 are exposed in a uniform $B_1$ field of a WBC are shown in FIG. 19. In this example, the uniform $B_1$ field is perpendicular to MRI RF coil array elements 1910 and 1920. The two coil elements 1910 and 1920 have areas A1 and A2 respectively. The two coil elements 1910 and 1920 have non-trivial mutual inductance between them. The self inductances L1 and L2, capacitances C1 and C2, coil losses R1 and R2, current flow I1 and I2, and projected areas A1 and A2 for coil elements 1910 and 1920 respectively are illustrated as shown in FIG. 19.

From FIG. 19, equations 19 and 20 may be defined:

$$j\omega_0 B_1 A_1 = j\omega_0 L_1 I_1 + \frac{1}{j\omega_0 C_1} I_1 + R_1 I_1 + j\omega_0 M I_2 \quad \text{Eq. 19}$$

$$j\omega_0 B_1 A_2 = j\omega_0 L_2 I_2 + \frac{1}{j\omega_0 C_2} I_2 + R_2 I_2 + j\omega_0 M I_1 \quad \text{Eq. 20}$$

In one embodiment, assuming that both coil 1910 and coil 1920 also resonate at $\omega_0$ in Tx mode, then Eq. 19(3) and 20(4) can be simplified as below:

$$j\omega_0 B_1 A_1 = R_1 I_1 + j\omega_0 M I_2 \quad \text{Eq. 21}$$

$$j\omega_0 B_1 A_2 = R_2 I_2 + j\omega_0 M I_1 \quad \text{Eq. 22}$$

Solving equations 21 and 22 results in:

$$I_1 = \frac{j\omega_0 B_1 A_1 - j\omega_0 B_1 A_2 \frac{j\omega_0 M}{R_2}}{\frac{(\omega_0 M)^2}{R_2} + R_1} \quad \text{Eq. 23}$$

$$I_2 = \frac{j\omega_0 B_1 A_2 - j\omega_0 B_1 A_1 \frac{j\omega_0 M}{R_1}}{\frac{(\omega_0 M)^2}{R_1} + R_2} \quad \text{Eq. 24}$$

If mutual inductance is not trivial, i.e., $\omega_0 M \gg R_1$ and $R_2$, and if the values $A_1$ and $A_2$ are not significantly different, then Eq. 23 and 24 can be simplified as:

$$I_1 \cong \frac{-j\omega_0 B_1 A_2 \frac{j\omega_0 M}{R_2}}{\frac{(\omega_0 M)^2}{R_2} + R_1} \quad \text{Eq. 25}$$

$$I_2 \cong \frac{-j\omega_0 B_1 A_1 \frac{j\omega_0 M}{R_1}}{\frac{(\omega_0 M)^2}{R_1} + R_2} \quad \text{Eq. 26}$$

Thus, $I_1$ is determined by the WBC induced voltage in coil 1920, that is, by its neighbor coil 1910 instead of itself coil 1920 itself, and vice versa. Consequently, the local mutual inductance coupled modes among local array coils are dominant if the mutual inductances are not trivial. Therefore, the final induced field of the array coils (e.g., 1910 and 1920) from the WBC is the sum of the WBC induced fields from coils with trivial mutual inductance from other elements and the local coupled modes among the coils having non-trivial mutual inductances. In particular the local coupled modes may have multiple different frequencies and different Tx field patterns. Depending on the application in which coil 1910 and coil 1920 are being employed, (e.g., for a first anatomy, for a second, different anatomy) the appropriate local coupled mode or modes may be adjusted in such a way that its or their frequencies must be close to or the same as the working frequency $\omega_0$.

Figure 20:
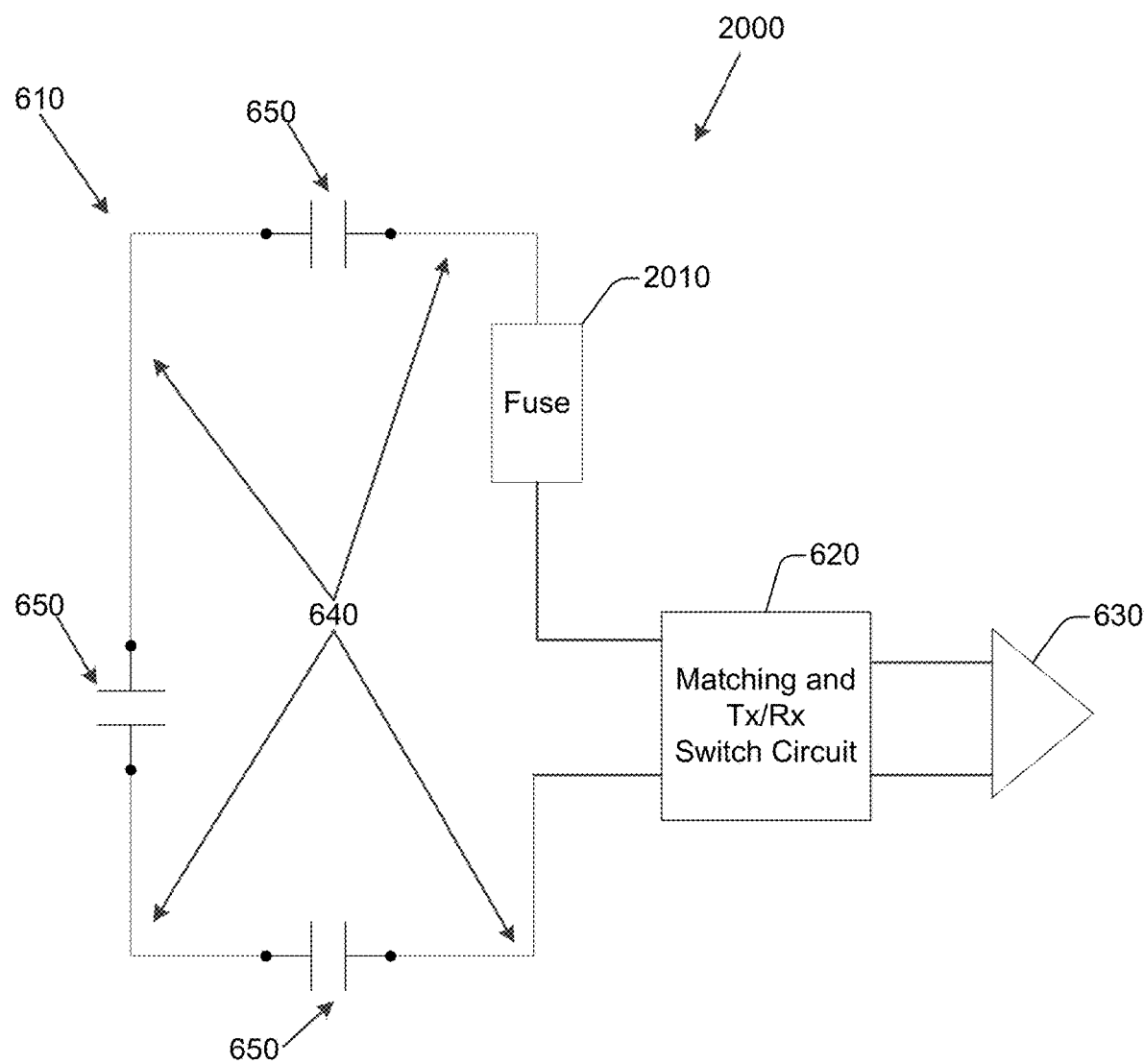
FIG. 20 illustrates an example single-layer MRI RF coil element having a fuse.

FIG. 20 illustrates a single-layer MRI RF coil element 2000 that is similar to MRI RF coil element 600 but that includes additional details and elements. Single-layer MRI RF coil element 2000 is configured to operate in a Tx mode or in an Rx mode. Single-layer MRI RF coil element 2000 is further configured to provide failsafe protection from induced current experienced by single-layer MRI RF coil element 2000. In one embodiment, single-layer MRI RF coil array element 2000 may be part of a single-layer MRI RF coil array. A single-layer MRI RF coil array comprises at least one single-layer RF coil element (e.g., single-layer MRI RF coil element 2000).

Single-layer MRI RF coil element 2000 includes an LC coil 610, a matching and Tx/Rx switch circuit 620 operably connected to LC coil 610, a preamplifier 630 operably connected to matching and Tx/Rx circuit 620. Single-layer MRI RF coil array element 2000 further includes a fuse 2010 electrically connected to LC coil 610. Single-layer MRI RF coil element 2000 may be operably connected to an MRI system, and may receive a DC bias current from the MRI system. In some situations, single-layer MRI RF coil element 2000 may become disconnected from the MRI system.

LC coil 610 includes at least one inductor 640 and at least one capacitor 650. The at least one inductor 640 and the at least one capacitor 650 resonate at a first frequency (i.e., a resonant frequency). The at least one inductor 640 may be, for example, a co-axial cable, a copper wire, a copper foil soldered to a circuit board, or other conductor. In one embodiment, the LC coil 610 includes at least one conductor, where the at least one conductor is a conductive metal trace or a flexible co-axial cable.

In one embodiment, single-layer MRI RF coil array element 2000 further includes a magnitude/phase control circuit (not illustrated) operably connected to the LC coil 610 according to embodiments described herein. The magnitude/phase control circuit may be connected across one of at least one capacitor 650.

Matching and Tx/Rx switch circuit 620, when operating in Tx mode, electrically isolates LC coil 610 from preamplifier 630 upon LC coil 610 resonating with a primary coil. The primary coil has a working frequency. LC coil 610, upon resonating with the primary coil, generates a local amplified Tx field based on an induced current in LC coil 610. The induced current is generated by inductive coupling between LC coil 610 and the primary coil. A magnitude of the induced current or a phase of the induced current is independently adjustable. The magnitude of the induced current or the phase of the induced current is configured to be varied over a range of magnitudes or phases respectively using techniques described herein.

Matching and Tx/Rx switch circuit 620, when operating in Rx mode, electrically connects LC coil 610 with preamplifier 630. In one embodiment, matching and Tx/Rx switch circuit 620 is a capacitive matching and Tx/Rx switch circuit that uses capacitive matching. FIG. 8 illustrates an example capacitive matching and Tx/Rx switch circuit 820 suitable for implementation with embodiments described herein. For example, capacitive matching and Tx/Rx switch circuit 820 may be implemented as matching and Tx/Rx switch circuit 620 in single-layer MRI RF coil array element 2000. In one embodiment, capacitive matching and Tx/Rx switch circuit 820 includes: a matching capacitor Cm having a first terminal and a second terminal; a first inductor Ld having a first terminal and a second terminal; a first capacitor Cd having a first terminal connected to the first terminal of the first inductor Ld; and a first PIN diode D1 having a first terminal and a second terminal, the first terminal of the first PIN diode D1 connected to the second terminal of the first capacitor Cd, and the second terminal of the first PIN diode D1 connected to the second terminal of the first inductor Ld. In this embodiment, the second terminal of the first inductor Ld is connected to a first input terminal of the pre-amplifier 630, and the second terminal of the matching capacitor Cm is connected to a second input terminal of the preamplifier 630. In this embodiment, matching and Tx/Rx switch circuit 820, upon application of a forward bias to the first PIN diode D1, electrically isolates the preamplifier 630 from voltage induced in the LC coil 610 by mutual inductance with the primary coil.

In another embodiment, matching and Tx/Rx switch circuit 620 is an inductive matching and Tx/Rx switch circuit. FIG. 11 illustrates an exemplary inductive matching and Tx/Rx switch circuit 1120 suitable for use by embodiments described herein. In this embodiment, inductive matching and Tx/Rx switch circuit 1120 includes: a matching capacitor Cm having a first terminal and a second terminal; a matching inductor Lm having a first terminal and a second terminal, the first terminal of matching inductor Lm connected to the first terminal of matching capacitor Cm; a first inductor Ld having a first terminal and second terminal, where the first terminal of first inductor Ld is connected to the first terminal of matching inductor Lm; a first PIN diode D1 having a first terminal and a second terminal, the first terminal of first PIN diode D1 connected to the second terminal of the first inductor Ld, and the second terminal of the first PIN diode D1 connected to the second terminal of matching capacitor Cm. In this embodiment, the second terminal of the matching capacitor Cm is connected to a first input terminal of preamplifier 630, and the second terminal of matching inductor Ld is connected to a second input terminal of preamplifier 630. In this embodiment, matching and Tx/Rx switch circuit 1120, upon application of a forward bias to the first PIN diode D1, isolates the preamplifier 630 from voltage induced in the LC coil 1110 by mutual inductance with the primary coil.

The LC circuit 610 (e.g. Rx coil) in this embodiment further includes a fuse 2010. The fuse 2010 is rated at a safety related threshold root mean square (RMS) current. The fuse 2010 will open if an induced current in LC circuit 610 is greater than the current at which fuse 2010 is rated (e.g., the threshold RMS current). Upon opening, fuse 2010 presents increased resistance, reducing the magnitude of the induced current, thus preventing overheating of single-layer MRI RF coil 2000 or elements thereof, and reducing the chance of injury to persons who may come into contact with the single-layer MRI RF coil 2000. The fuse 2010 may be an auto-resettable fuse that facilitates recovering coil function after the fuse 2010 cools off. In another embodiment, other types of fuses may be employed. The RMS current may be selected based on the maximum safe induced current for a particular MRI application, on a maximum Tx field strength that single-layer MRI RF coil array element 2000 may be exposed to from an MRI system, on a property of the single-layer MRI RF coil, or on other parameters.

When fuse 2010 is open, it provides high resistance. High resistance may be, for example, resistance in the mega-Ohm range. Therefore, the induced voltage of the coil 610 will be almost fully applied to fuse 2010 when fuse 2010 is open. Because of the high impedance of fuse 2010, the current through coil 610 may be considered to be zero or approaching zero when fuse 2010 is open. Thus, an open fuse 2010 will prevent coil 610 from resonating. Fuse 2010 is configured such that it will only open when the RMS current through fuse 2010 is greater than the threshold. The threshold value is determined by other safety control parameters, such as the maximum SAR value a human may be subjected to, or the highest coil surface temperature that safety standards may allow.

The magnitude/phase control circuit is not illustrated for clarity. The magnitude/phase control circuit is configured to adjust the magnitude of the induced current or the phase of the induced current. The magnitude/phase control circuit is configured to, upon single-layer MRI RF coil array element 2000 operating in Tx mode, adjust the magnitude of the induced current or the phase of the induced current using techniques described herein. For example, the magnitude/phase control circuit may adjust the magnitude or phase of the induced current by controlling a coil loss resistance of the primary coil, by controlling a coil loss resistance of single-layer MRI RF coil array element 2000, or by controlling a difference between the working frequency of the primary coil and the first frequency. The magnitude of the induced current or a phase of the induced current is a function of a coil loss resistance of the primary coil, a coil loss resistance of single-layer MRI RF coil array element 2000, or a difference between the working frequency of the primary coil and the first frequency. The magnitude/phase control circuit is configured to adjust the magnitude of the induced current or the phase of the induced current by adjusting at least one of a coil loss resistance of the primary coil, a coil loss resistance of the at least one RF coil element, or a difference between the working frequency of the primary coil and the first frequency, according to techniques described herein. Exemplary magnitude/phase control components are illustrated in FIGS. 16-18.

Figure 21:
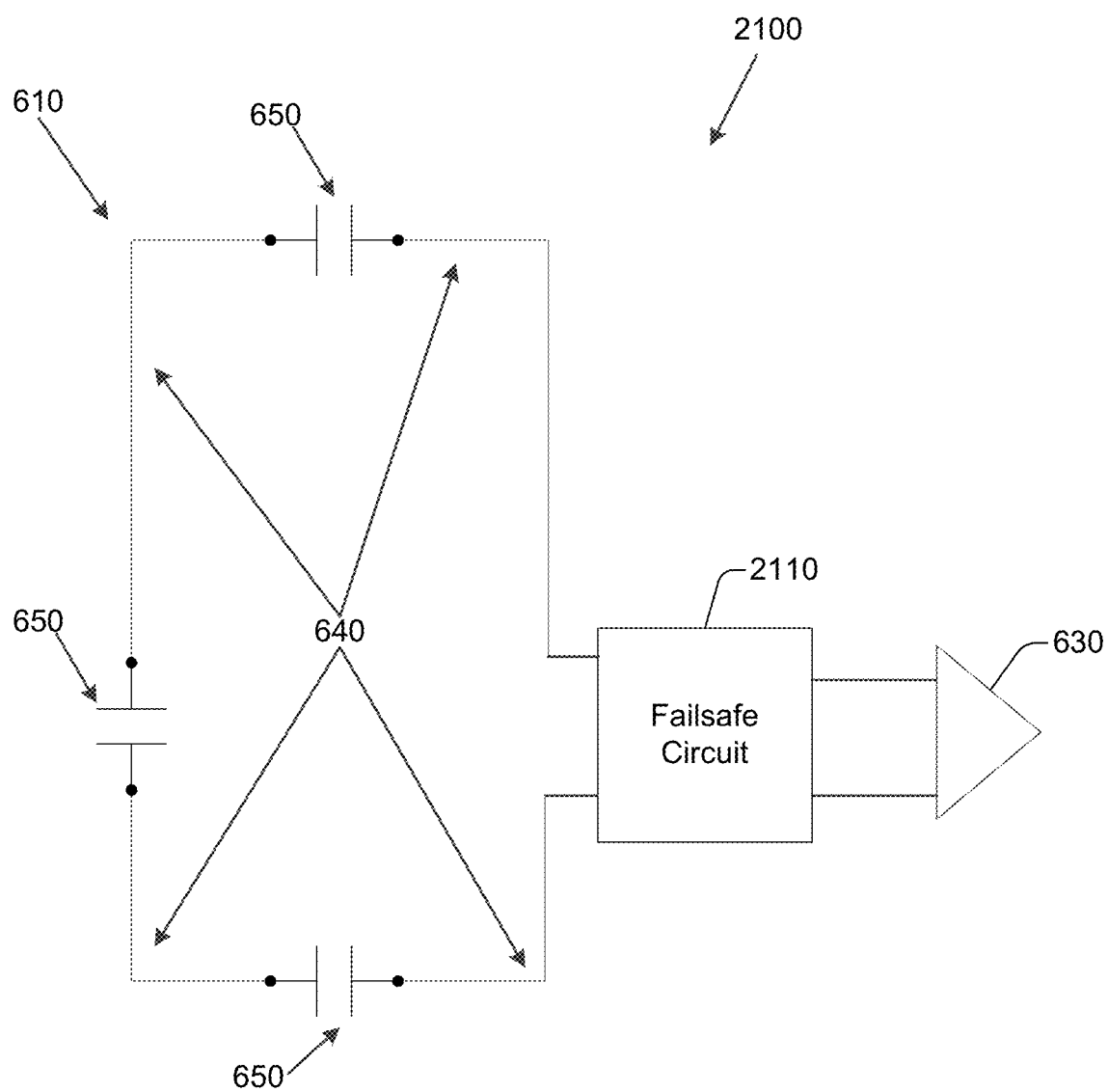
FIG. 21 illustrates an example single-layer MRI RF coil element having a failsafe circuit.

FIG. 21 illustrates a single-layer MRI RF coil element 2100 for use in an MRI system. Single-layer MRI RF coil element 2100 may be operably connected with the MRI system. Single-layer MRI RF coil element 2100 is configured to operate in a Tx mode and an Rx mode. Single-layer MRI RF coil element 2100 is further configured to provide failsafe protection from current induced in single-layer MRI RF coil array element caused by inductive coupling with a primary coil. Single-layer MRI RF coil element 2100 includes, an LC coil 610, a failsafe circuit 2110 electrically connected with LC coil 610, where failsafe circuit 2110 is configured as a failsafe circuit and as a matching and Tx/Rx switch circuit; and preamplifier 630 electrically connected with the failsafe component 2110. LC coil 610 includes at least one inductor 640 and at least one capacitor 650. The at least one inductor 640 and the at least one capacitor 650 resonate at a first frequency. In one embodiment, LC coil 610 includes at least one conductor, where the at least one conductor is a conductive metal trace or a flexible co-axial cable.

Failsafe circuit 2110 is configured to provide functionality similar to that of matching and Tx/Rx switch 620 when single-layer MRI RF coil array element 2100 is operably connected with an MRI system. For example, when operating in Tx mode, failsafe circuit 2210 electrically isolates LC coil 610 from preamplifier 630 upon LC coil 610 resonating with a primary coil, where the primary coil has a working frequency. LC coil 610, upon resonating with the primary coil, generates a local amplified Tx field based on an induced current in LC coil 610, the induced current generated by inductive coupling between the LC coil 610 and the primary coil. In one embodiment, the primary coil is a whole body coil (WBC). A magnitude of the induced current or a phase of the induced current is independently adjustable. The magnitude of the induced current or the phase of the induced current is configured to be varied over a range of magnitudes or phases respectively. Failsafe circuit 2110, when operating in Rx mode, electrically connects LC coil 610 with preamplifier 630.

Failsafe circuit 2110 is further configured to provide failsafe protection against induced current in single-layer MRI RF coil array element 2100 upon the single-layer MRI RF coil array element becoming disconnected from an MRI system. Failsafe circuit 2110, upon the single-layer MRI RF coil array element 2100 being disconnected from the MRI system, reduces the magnitude of the induced current. When single-layer MRI RF coil element 2100 is operably connected with the MRI system, failsafe circuit 2110 is able to receive a DC bias current from the MRI system. When single-layer MRI RF coil array element 2100 is not connected with the MRI system, however, the DC bias current is no longer able to reach single-layer MRI RF coil array element 2100, and consequently failsafe circuit 2110 also does not receive the DC bias current. During the absence of the DC bias current to the single-layer MRI RF coil array element 2100 that failsafe circuit 2110 operates to protect single-layer MRI RF coil array element 2100 from excess induced current by providing an increased impedance to the induced current. In one embodiment, failsafe circuit 2110 is a capacitive matching failsafe circuit. In another embodiment, failsafe circuit 2110 is an inductive matching failsafe circuit.

Figure 22:
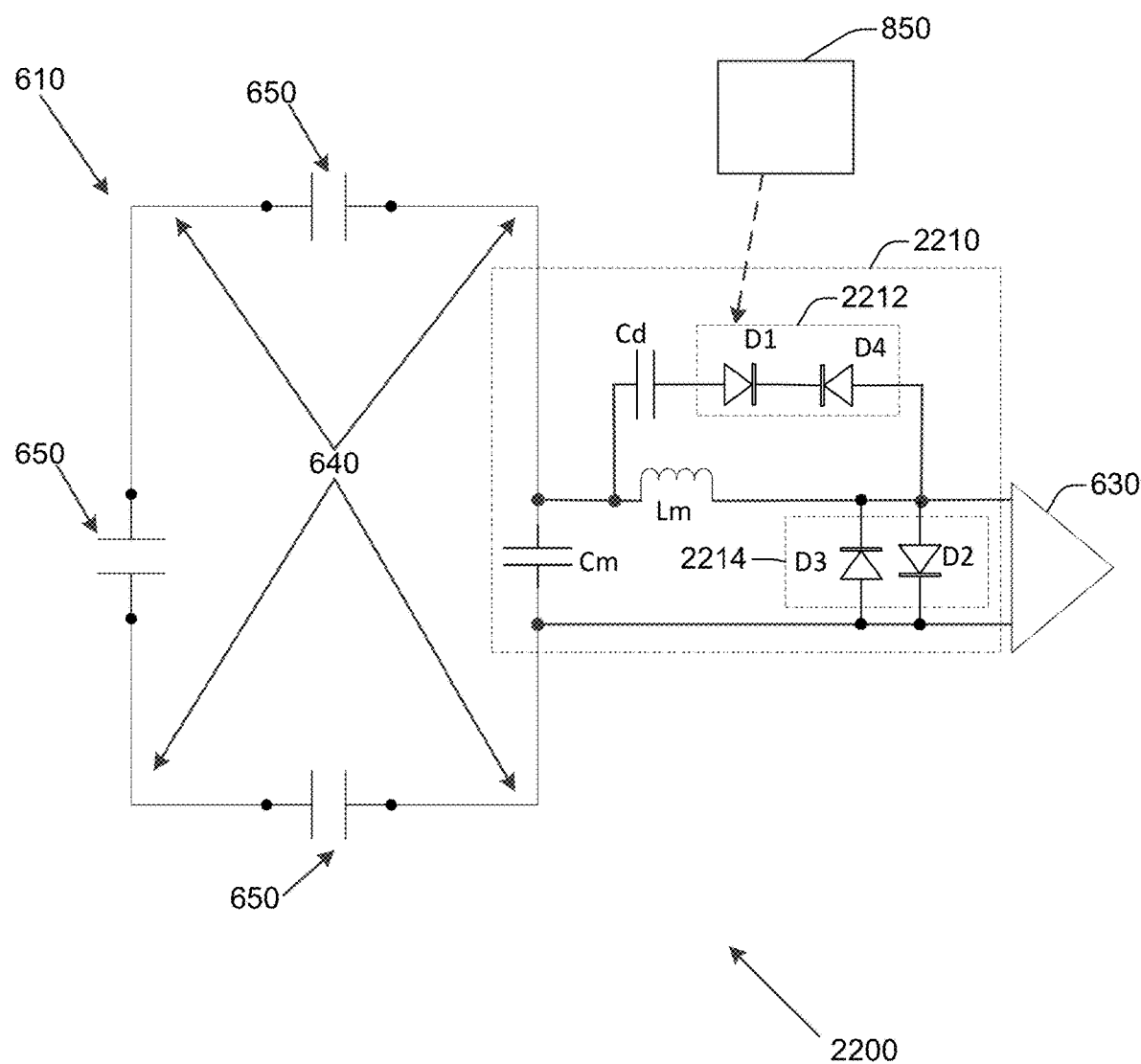
FIG. 22 illustrates an example single-layer MRI RF coil element having a failsafe circuit.

FIG. 22 illustrates an example single-layer MRI RF coil array element 2200 that is similar to single-layer MRI RF coil array element 2100 but that includes additional details and elements. Single-layer MRI RF coil array element includes failsafe circuit 2210. Failsafe circuit 2210 is configured as a capacitive matching failsafe circuit 2210. Failsafe circuit 2210 includes a matching capacitor Cm having a first terminal and a second terminal, a first inductor Lm having a first terminal and a second terminal. The first terminal of first inductor Lm is connected to the first terminal of the matching capacitor Cm. Failsafe circuit 2210 also includes a first capacitor Cd having a first terminal and a second terminal, where first capacitor Cd is connected at the first terminal to the first terminal of first inductor Lm.

Failsafe circuit 2210 also includes at least one pair of PIN diodes 2212. In this embodiment, the at least one pair of PIN diodes 2212 includes a first PIN diode D1 having a first terminal and a second terminal, the first terminal of first PIN diode D1 connected to the second terminal of capacitor Cd. The at least one pair of PIN diodes 2212 also includes a second PIN diode D4 having a first terminal and a second terminal, the second terminal of second PIN diode D4 connected to the second terminal of first PIN diode D1, and the first terminal of second PIN diode D4 connected to the second terminal of first inductor Lm. In this embodiment, the second terminal of first inductor Lm is connected to a first input terminal of preamplifier 630, and the second terminal of matching capacitor Cm is connected to a second input terminal of preamplifier 630.

Failsafe circuit 2210 also includes at least one pair of signal diodes 2214. In this embodiment, the at least one pair of signal diodes 2214 includes a first signal diode D3 having a first terminal and a second terminal. The first terminal of first signal diode D3 is connected at a first node between the second terminal of matching capacitor Cm and the second input terminal of preamplifier 630. The second terminal of first signal diode D3 is connected at a first node between the second terminal of first inductor Lm and the first input terminal of preamplifier 630. The at least one pair of signal diodes 2214 also includes a second signal diode D2 having a first terminal and a second terminal, the second terminal of second signal diode D2 connected at a second node between the second terminal of matching capacitor Cm and the second input terminal of preamplifier 630. The first terminal of second signal diode D2 is connected at a second node between the second terminal of first inductor Lm and the first input terminal of preamplifier 630. In this example, first signal diode D3 and second signal diode D2 are arranged together in a parallel cross protection configuration. In another embodiment, first signal diode D3 and second signal diode D2 may be arranged in other, different configurations to provide similar protection. In one embodiment, first signal diode D3 and second signal diode D2 are RF limiting diodes. In another embodiment, first signal diode D3 and second signal diode D2 are passive diodes.

In this embodiment, the at least one pair of signal diodes 2214, including first signal diode D3 and second signal diode D2, upon the application of an induced voltage across matching capacitor Cm to the at least one pair of signal diodes 2214, passively decouples the MRI RF coil array element 2200 from the primary coil.

In this embodiment, the at least one pair of PIN diodes 2212 (e.g., first PIN diode D1 and second PIN diode D4), when forward biased (i.e., when single-layer MRI RF coil element 2200 is connected with the MRI system), present a first, low impedance. The at least one pair of PIN diodes 2212, when not forward biased, (i.e., when single-layer MRI RF coil element 2200 is disconnected with the MRI system, or when reverse biased) present a second, larger impedance that reduces the magnitude of the induced current. Thus, failsafe circuit 2210 provides protection from induced current in single-layer MRI RF coil element 2200 when single-layer MRI RF coil element 2200 is disconnected from an MRI system. While first PIN diode D1 and second PIN diode D4 are illustrated in a back-to-back configuration, in another embodiment, other configurations of first PIN diode D1 and second PIN diode D4 may be employed that provide similar protection.

Single-layer MRI RF coil element 2200 illustrated in FIG. 22 also includes PIN diode control circuit 850 which is similar to PIN diode control circuit 850 described above with respect to FIG. 8. PIN diode control circuit 850 facilitates selective control of the at least one pair of PIN diodes 2212, including first PIN diode D1 and second PIN diode D4. For example, PIN diode control circuit 850 may control a forward bias applied to first PIN diode D1 and second PIN diode D4. PIN diode control circuit 850 may be operably connected to, for example, first diode D1, or the pair of PIN diodes 2212. In another embodiment, PIN diode control circuit 850 facilitates selective control of other, different diodes. PIN diode control circuit 850 may be included as part of single-layer MRI RF coil array elements described herein, or may be operably connected to embodiments of single-layer MRI RF coil array elements described herein. PIN diode control circuit 850 may be operably connected with an MRI system, or controlled by the MRI system.

When the single-layer MRI RF coil array element 2200 illustrated in FIG. 22 is exposed to a Tx field from a WBC or other primary coil, and single-layer MRI RF coil array element 2200 is not connected to the MRI system, then there will be no forward bias through first PIN diode D1 and second PIN diode D4. Thus, first PIN diode D1 and second PIN diode D4 create a high impedance. The high impedance of first PIN diode D1 and second PIN diode D4 in this (e.g., disconnected) state substantially obstruct the flow of the induced current. The induced high voltage across matching capacitor Cm will turn on first signal diode D3 and second signal diode D2 through inductor Lm. Thus, any voltage greater than the forward bias voltage of first signal diode D3 and second signal diode D2 turn on first signal diode D3 and second signal diode D2, making them effectively shorted. Thus, inductor Lm and matching capacitor Cm will resonate with each other through first signal diode D3 and second signal diode D2, and passively decouple single-layer MRI RF coil array element 2200 from the primary coil in unplugged (i.e., disconnected) situations. Therefore, no excessive current runs through single-layer MRI RF coil array element 2200 when it is disconnected but subject to a Tx field from the primary coil, and the safety of single-layer MRI RF coil array element 2200 is increased.

In this embodiment, when forward biased, the at least one pair of PIN diodes 2212, including first PIN diode D1 and second PIN diode D4, presents a very small impedance to induced current. For example, in one embodiment, first PIN diode D1 and second PIN diode D4 may present a total impedance of 1 Ohm. As a result of the very small impedance presented by first PIN diode D1 and second PIN diode D4, first capacitor Cd and first inductor Lm may resonate with each other and create a high impedance to isolate LC coil 610 from the preamplifier 630. When first PIN diode D1 and second PIN diode D4 are not forward biased (i.e., single-layer MRI RF coil element 2200 is disconnected) or are reverse biased (i.e., single-layer MRI RF coil element 2200 is connected and in Rx mode), there is a high impedance across matching capacitor Cm. That is, matching capacitor Cm and first inductor Lm will resonate when single-layer MRI RF coil array element 2200 is connected to the MRI system and operating in Rx mode because preamplifier 630 has a low input impedance. Furthermore, the at least one pair of signal diodes, including first signal diode D3 and second signal diode D2, becomes shorted when single-layer MRI RF coil array element 2200 is not connected to the MRI system and the MRI system is operated in Tx mode and disconnected single-layer MRI RF coil array element 2200 is subjected to the Tx field generated by the primary coil. First signal diode D3 and second signal diode D2 can be shorted when the MRI system is operated in Tx mode and when single-layer MRI RF coil array element 2200 is not connected because first PIN diode D1 and second PIN diode D4 will not be shorted in this situation to isolate the LC coil 610 from the preamplifier 630. As a result high voltage will go to the preamplifier 630's side of the circuit. Then, first signal diode D3 and second signal diode D2 will experience sufficient voltage across them to become shorted. When first signal diode D3 and second signal diode D2 are shorted, then matching capacitor Cm and first inductor Lm resonate together and present a high impedance across matching capacitor Cm. Thus, the induced current through LC coil 610 is eliminated or reduced significantly when single-layer MRI RF coil 2200 is disconnected from the MRI system and subject to a Tx field. The capacitance values of first capacitor Cd and matching capacitor Cm are the same, or within a threshold of each other, since both first capacitor Cd and matching capacitor Cm resonate with first inductor Lm during the situations described above.

In another embodiment, multiple pairs of PIN diodes may be employed to provide failsafe protection. For example, while single-layer MRI RF coil array element 2200 is illustrated with one pair 2212 of PIN diodes, another embodiment may include two, three, or more pairs 2212 of PIN diodes. In this embodiment, the multiple pairs 2212 of PIN diodes may be arranged in series, or may be arranged in parallel. In another embodiment, other arrangements of PIN diodes may be employed. For example, while in the embodiment illustrated in FIG. 22, first PIN diode D1 and second PIN diode D4 are illustrated in a back-to-back configuration, in another embodiment, first PIN diode D1 and second PIN diode D4 could be arranged in a front-to-front configuration.

While in this example first inductor Lm, the at least one pair of PIN diodes 2212, and capacitor Cd are illustrated on a connection path between the first terminal of matching capacitor Cm and a first input terminal of preamplifier 630, in another embodiment, first inductor Lm, the at least one pair of PIN diodes 2212, and capacitor Cd may be connected instead between the second terminal of matching capacitor Cm and the second input terminal of preamplifier 630.

Figure 23:
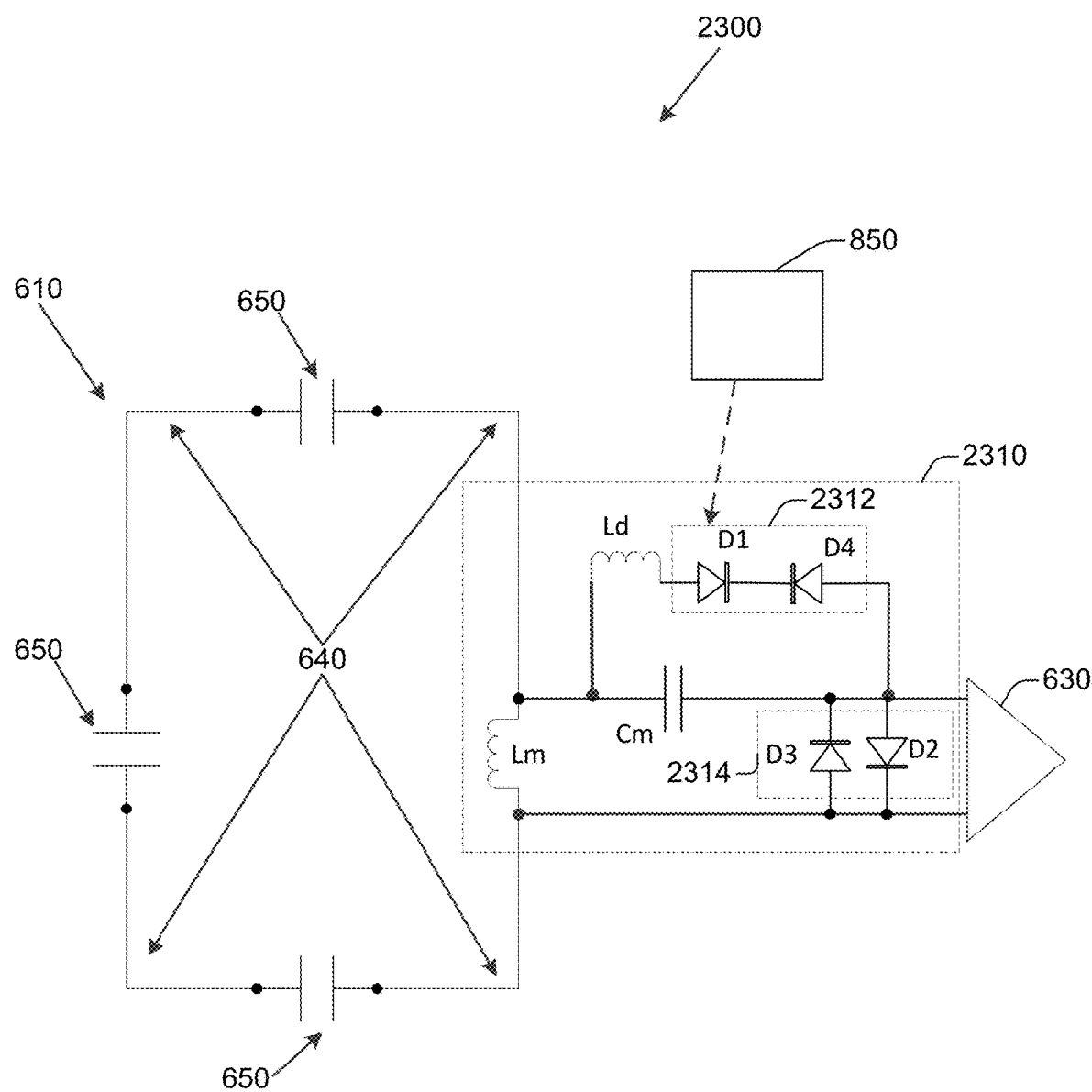
FIG. 23 illustrates an example single-layer MRI RF coil element having a failsafe circuit.

FIG. 23 illustrates an example single-layer MRI RF coil element 2300 that is similar to single-layer MRI RF coil 2100 and 2200 but that includes additional details and elements. Single-layer MRI RF coil element 2300 includes failsafe circuit 2310. Failsafe circuit 2310 is configured as an inductive matching failsafe circuit. Failsafe circuit 2310 includes a matching inductor Lm having a first terminal and a second terminal. Failsafe circuit 2310 also includes a first capacitor Cm having a first terminal and a second terminal. First capacitor Cm is connected at the first terminal with the first terminal of matching inductor Lm. Failsafe circuit 2310 also includes a first inductor Ld having a first terminal and a second terminal. The first inductor Ld is connected at the first terminal to the first terminal of first capacitor Cm.

Failsafe circuit 2310 also includes at least one pair of PIN diodes 2312. The at least one pair of PIN diodes 2312 includes a first PIN diode D1 having a first terminal and a second terminal, the first terminal of first PIN diode connected to the second terminal of first inductor Ld. The at least one pair of PIN diodes 2312 also includes a second PIN diode D4 having a first terminal and a second terminal, the second terminal of second PIN diode D4 connected to the second terminal of first PIN diode D1, and the first terminal of second PIN diode D4 connected to the second terminal of first capacitor Cm. The second terminal of first capacitor Cm is connected to a first input terminal of preamplifier 630, and the second terminal of matching inductor Lm is connected to a second input terminal of preamplifier 630.

Failsafe circuit 2310 also includes at least one pair 2314 of signal diodes. The at least one pair 2314 of signal diodes includes a first signal diode D3 having a first terminal and a second terminal. The first terminal of first signal diode D3 is connected at a first node between the second terminal of the matching inductor and the second input terminal of the preamplifier. The second terminal of the first signal diode D3 connected at a first node between the second terminal of first capacitor Cm and the first input terminal of preamplifier 630. The at least one pair 2314 of signal diodes also includes a second signal diode D2 having a first terminal and a second terminal. The first terminal of second signal diode D2 is connected at a second node between the second terminal of first capacitor Cm and the first input terminal of preamplifier 630. The second terminal of second signal diode D2 is connected at a second node between the second terminal of matching inductor Lm and the second input terminal of preamplifier 630. The at least one pair of signal diodes 2314, including first signal diode D3 and the second signal diode D2, upon the application of an induced voltage across the at least one pair of signal diodes 2314, where the induced voltage exceeds a threshold level, passively decouples the MRI RF coil array element 2300 from the primary coil. In one embodiment, the at least one pair of signal diodes 2314 includes RF limiter diodes. In another embodiment, the at least one pair of signal diodes 2314 includes passive diodes.

In this embodiment, the at least one pair of PIN diodes 2312 (e.g., first PIN diode D1 and second PIN diode D4), when forward biased (i.e., when single-layer MRI RF coil element 2300 is connected with the MRI system and a DC bias current is applied), present a first, low impedance. The at least one pair of PIN diodes 2312 (e.g., first PIN diode D1 and second PIN diode D4), when not forward biased, (i.e., when single-layer MRI RF coil element 2300 is disconnected with the MRI system) present a second, larger impedance that reduces the magnitude of the induced current. Thus, failsafe circuit 2310 provides failsafe protection to single-layer MRI RF coil element 2300, and to people who may come into contact with single-layer MRI RF coil element 2300, by reducing the induced current, and thereby reducing temperatures generated in single-layer MRI RF coil element 2300.

FIG. 23 also illustrates PIN diode control circuit 850 which is similar to PIN diode control circuit 850 described above with respect to FIGS. 8 and 22. PIN diode control circuit 850 facilitates selective control of the at least one pair of PIN diodes 2312, including first PIN diode D1 and second PIN diode D4. For example, PIN diode control circuit 850 may control a forward bias applied to first diode D1. PIN diode control circuit 850 may be operably connected to, for example, first diode D1, or the at least one pair of PIN diodes 2312. In another embodiment, PIN diode control circuit 850 facilitates selective control of other, different diodes that comprise single-layer MRI RF coil array element 2300. In one embodiment, single-layer MRI RF coil array element 2300 may include PIN diode control circuit 850, or PIN diode control circuit 850 may be operably connected to embodiments of single-layer MRI RF coil array elements described herein.

While in this example first inductor Ld, the at least one pair of PIN diodes 2312, and capacitor Cm are illustrated on a connection path between the first terminal of matching inductor Lm and a first input terminal of preamplifier 630, in another embodiment, first inductor Ld, the at least one pair of PIN diodes 2312, and capacitor Cm may be connected instead between the second terminal of matching inductor Lm and the second input terminal of preamplifier 630.

Figure 24:
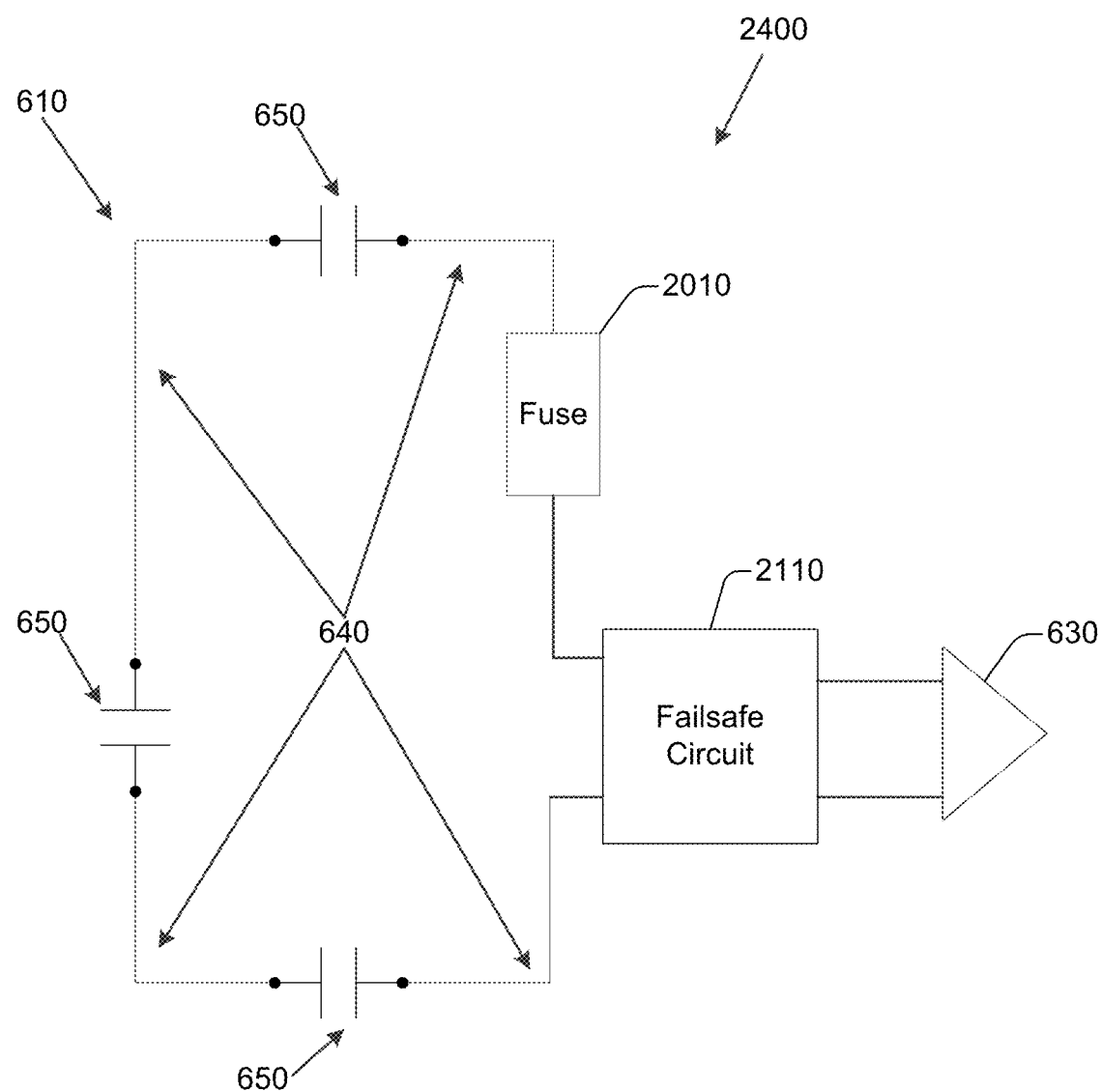
FIG. 24 illustrates an example single-layer MRI RF coil element having a fuse and a failsafe circuit.

FIG. 24 illustrates a single-layer MRI RF coil element 2400 that is similar to single-layer MRI RF coil elements 2100, 2200, and 2300, but that includes additional details and elements. Single-layer MRI RF coil element 2400 is configured to operate in a transmit (Tx) mode and a receive (Rx) mode. Single-layer MRI RF coil element 2400 includes LC coil 610, failsafe circuit 2110, and in this embodiment, LC coil 610 further includes a fuse 2010 connected to the at least one inductor 640 or the at least one capacitor 650. Similar to the operation of fuse 2010 described with respect to FIG. 21, fuse 2010, in this embodiment, upon the induced current exceeding a threshold magnitude, opens. Fuse 2010 being open reduces the magnitude of the induced current. Fuse 2010 being reduces the magnitude of the induced current by preventing the LC coil 610 from resonating with the primary coil. Thus, single-layer MRI RF coil array element 2400 provides an additional layer of failsafe protection from induced current than that provided by single-layer MRI RF coil array element 2000 or single-layer MRI RF coil array elements 2100-2300.

Figure 25:
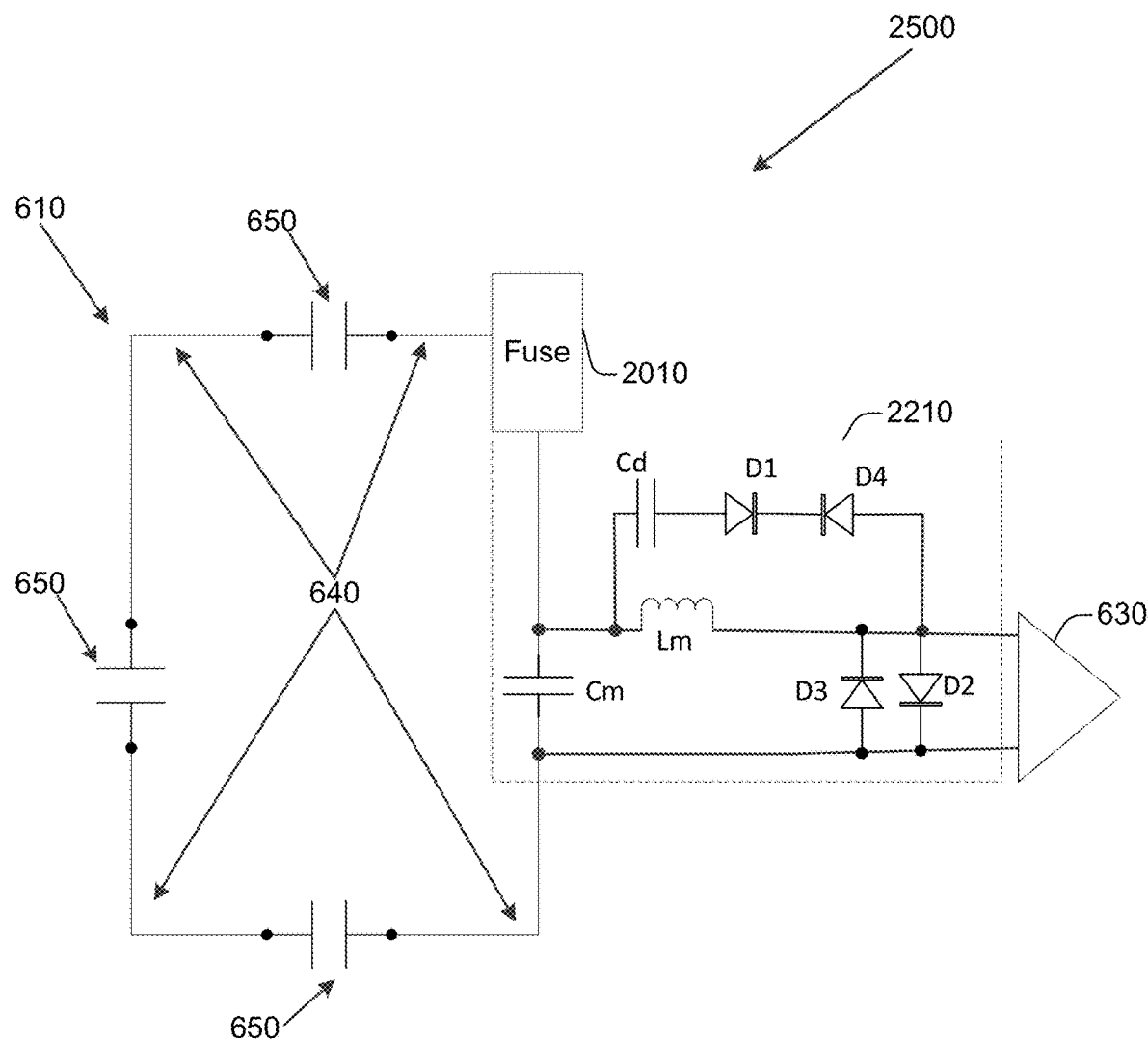
FIG. 25 illustrates an example single-layer MRI RF coil element having a fuse and a failsafe circuit.

FIG. 25 illustrates an exemplary single-layer MRI RF coil array element 2500 that is similar to single-layer MRI RF coil array element 2400, but where the failsafe circuit is a capacitive matching failsafe circuit 2210.

Figure 26:
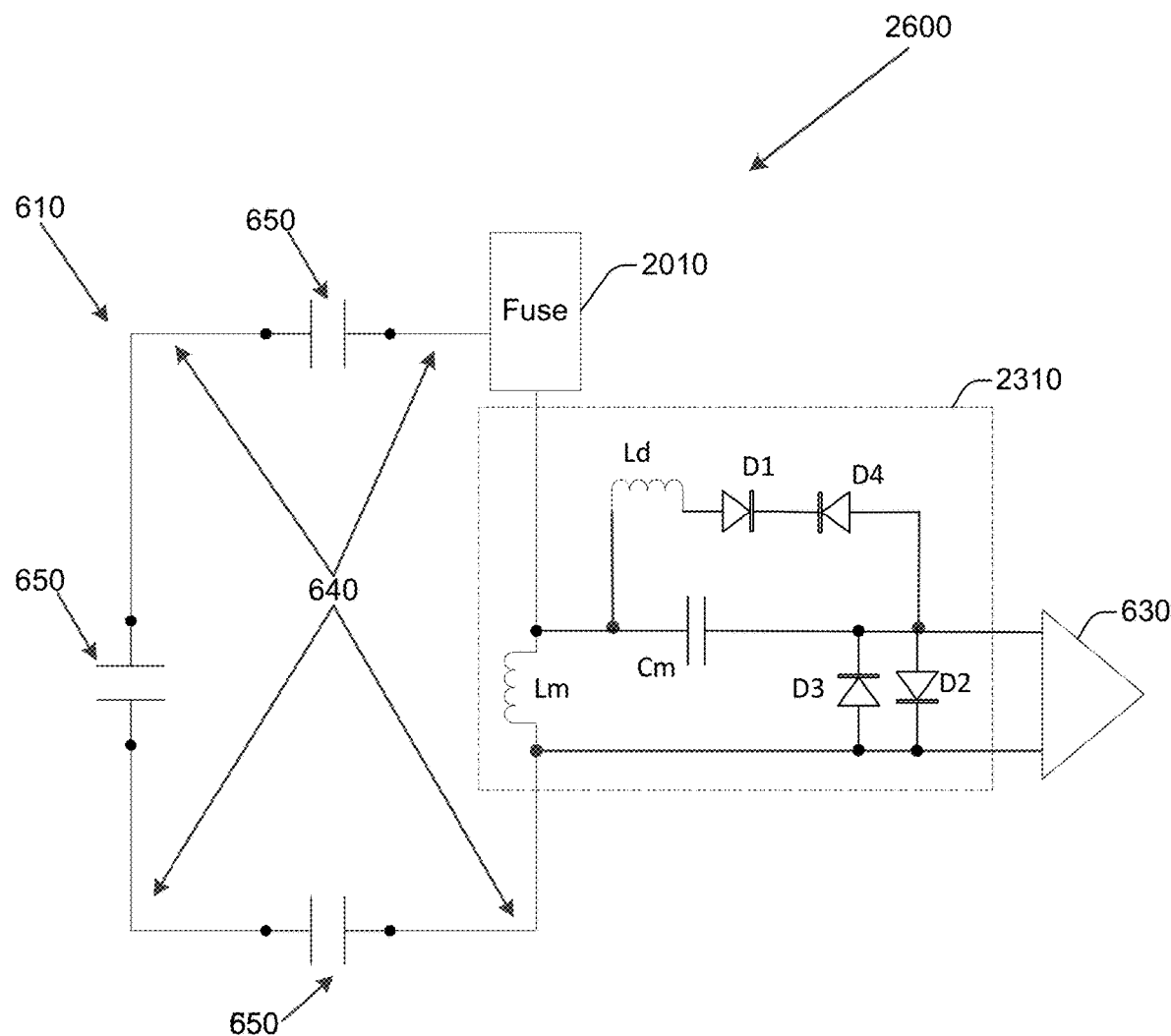
FIG. 26 illustrates an example single-layer MRI RF coil element having a fuse and a failsafe circuit.

FIG. 26 illustrates an exemplary single-layer MRI RF coil array element 2600 that is similar to single-layer MRI RF coil array element 2400, but where the failsafe circuit is an inductive matching failsafe circuit 2310.

Figure 27:
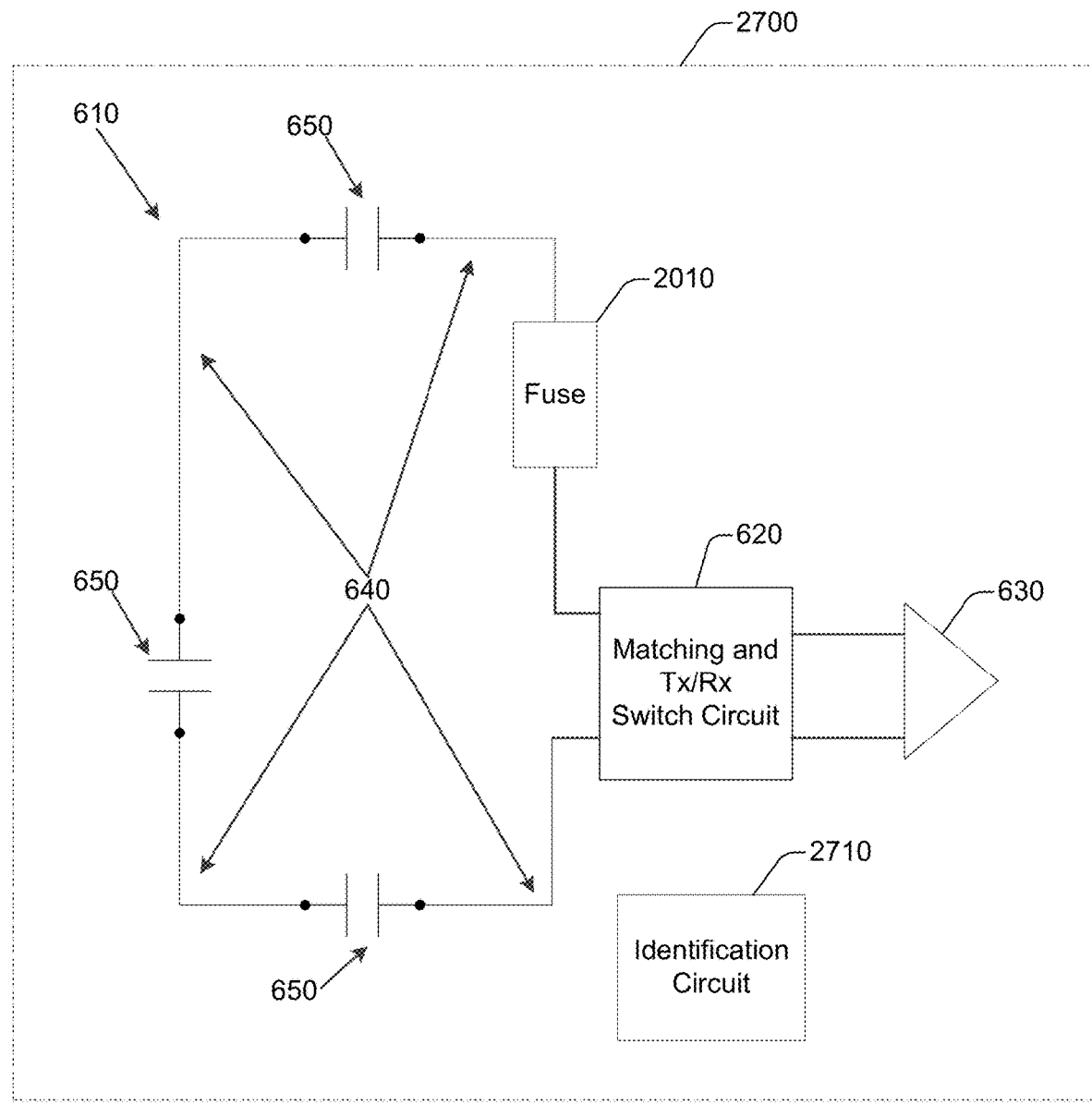
FIG. 27 illustrates an example single-layer MRI RF coil element having an identification circuit.

FIG. 27 illustrates a single-layer magnetic resonance imaging (MRI) radio frequency (RF) coil element 2700 for use in an MRI system. Single-layer MRI RF coil element 2700 is configured to operate in a transmit (Tx) mode and a receive (Rx) mode. Single-layer MRI RF coil element 2700 provides failsafe protection from induced current in single-layer MRI RF coil element 2700 upon single-layer MRI RF coil element 2700 being disconnected from the MRI system. Single-layer MRI RF coil element 2700 includes an LC coil 610, a matching and Tx/Rx switch circuit 620 electrically connected with the LC coil 610, a preamplifier electrically 630 connected with the matching and Tx/Rx switch circuit 620, and an identification circuit 2710.

LC coil 610 includes at least one inductor 640 and at least one capacitor 650, where the at least one inductor 640 and the at least one capacitor 650 resonate at a first frequency. Matching and Tx/Rx switch circuit 620, when operating in Tx mode, electrically isolates the LC coil 610 from the preamplifier 630 upon the LC coil 610 resonating with a primary coil. The primary coil has a working frequency. The primary coil generates a Tx field when operating in Tx mode. LC coil 610, upon resonating with the primary coil, generates a local amplified Tx field based on an induced current in the LC coil 610, the induced current generated by inductive coupling between LC coil 610 and the primary coil. A magnitude of the induced current or a phase of the induced current is independently adjustable. The magnitude of the induced current or the phase of the induced current is configured to be varied over a range of magnitudes or phases respectively. Matching and Tx/Rx switch circuit 620, when operating in Rx mode, electrically connects the LC coil 610 with the preamplifier.

Identification circuit 2710 is configured to provide a signal to the MRI system. The signal includes location information about the location of the single-layer MRI RF coil element 2700 in relation to the primary coil of the MRI system. For example, the signal may indicate that single-layer MRI RF coil element 2700 is within a threshold distance of the primary coil. The signal may indicate that single-layer MRI RF coil element 2700 is within a threshold distance of the primary coil and subject to a Tx field produced by the primary coil that has a threshold magnitude. The threshold distance may be determined as a function of the magnitude of the Tx field produced by the primary coil, or by other operating parameters of the MRI system.

In one embodiment of single-layer MRI RF coil element 2700, identification circuit 2710 is an RFID device. An RFID device in this embodiment may be, for example, and RFID tag, or an RFID transponder. In this embodiment, identification circuit 2710 includes an antenna, a memory, and a circuit configured to control the antenna to transmit a signal. The signal may include information about the location of the single-layer MRI RF coil element 2700. The signal may be receivable by an RFID sensor or RFID controller. The RFID device may be a passive RFID device, or an active RFID device.

In one embodiment of single-layer MRI RF coil element 2700, the matching and Tx/Rx switch circuit 620 is further configured as a failsafe circuit. For example, matching and Tx/Rx switch circuit 620 may be configured according to embodiments described herein, including failsafe circuit 2210, or failsafe circuit 2310. In this embodiment, matching and Tx/Rx switch circuit 620 is configured to, upon the single-layer MRI RF coil array element 2700 being disconnected from the MRI system: present an increased impedance to the induced current according to techniques described herein. Presenting an increased impedance to the induced current reduces the magnitude of the induced current.

In one embodiment of single-layer MRI RF coil element 2700, the LC coil 610 further includes a fuse 2010 connected to the at least one inductor 640 or the at least one capacitor 650. Fuse 2010, upon the induced current exceeding a threshold magnitude, opens. Fuse 2010 being open reduces the magnitude of the induced current according to techniques described herein.

Figure 28:
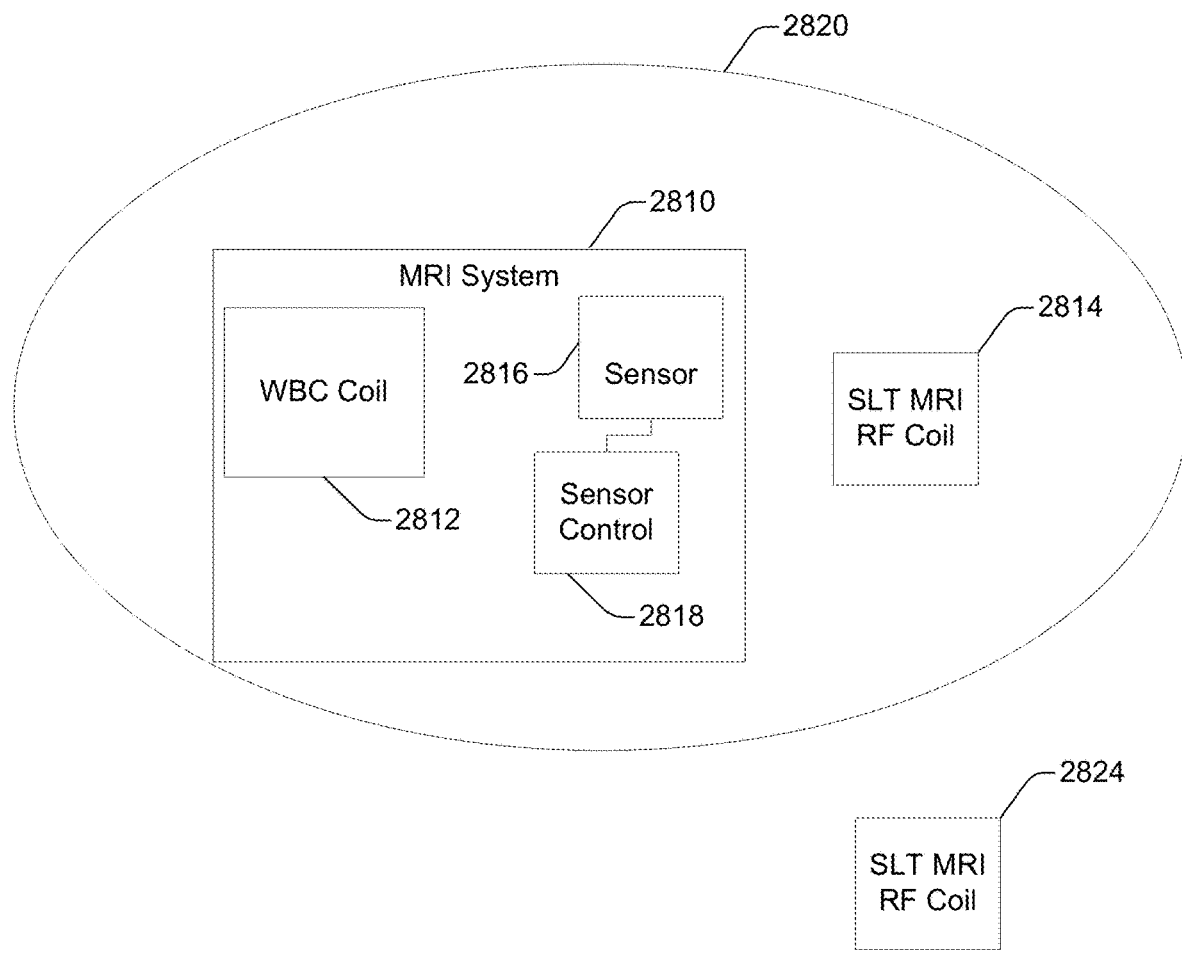
FIG. 28 illustrates an example MRI system.

FIG. 28 illustrates a simplified schematic of an MRI system 2810. MRI system 2810 includes a primary coil 2812, a single-layer MRI radio frequency (RF) coil 2814 configured to operate in a transmit (Tx) or receive (Rx) mode, the single-layer MRI RF coil 2814 including a location circuit configured to provide a location signal. The location circuit may include, for example, an RFID tag. For example, in one embodiment, single-layer MRI RF coil 2814 may include single-layer MRI RF coil array element 2700 configured with an RFID tag. MRI system 2810 also includes a sensor 2816 configured to receive the location signal from single-layer MRI RF coil 2814; and a sensor control circuit 2818 operably connected to the sensor 2816. Sensor control circuit 2818 is configured to, upon determining that the single-layer MRI RF coil 2814 is not connected to the MRI system and that the single-layer MRI RF coil 2814 is within a threshold distance of the primary coil 2812: control the MRI system 2810 to terminate a Tx mode. The sensor control circuit 2818 may be further configured to reduce power provided to the primary coil 2812, or shut down the MRI system 2810. Sensor 2816 may be, in one embodiment, an RFID sensor configured to receive a signal from single-layer MRI RF coil 2814.

For example, primary coil 2812, which may, in some embodiments, be a whole body coil, may generate a Tx field. The generated Tx field may have a range 2820. In this example, single-layer MRI RF coil 2814 is illustrated as within the range 2820 and disconnected from MRI system 2810. Thus, sensor 2816 may receive the location signal from single-layer MRI RF coil 2814, and sensor control circuit 2818 may, upon determining, based on the location signal, that single-layer MRI RF coil 2814 is within range 2820, control MRI system 2810 to terminate a Tx mode or to shut down.

In another example situation, a second single-layer MRI RF coil 2824 that is similar to single-layer MRI RF coil 2814, is located outside the range 2820. Sensor 2816 may receive the location signal from single-layer MRI RF coil 2824, and sensor control circuit 2818 may determine, based on the location signal, that single-layer MRI RF coil 2824 is outside the range 2820, and thus is not subject to harmful induced current generated by the Tx field. Upon determining that single-layer MRI RF coil 2824 is outside the range 2820, sensor control circuit may decide to allow MRI system 2810 to continue a Tx mode or to otherwise continue operating, because, based on the determination that single-layer MRI RF coil 2824 is outside the range, it is safe to continue operating.

Figure 29:
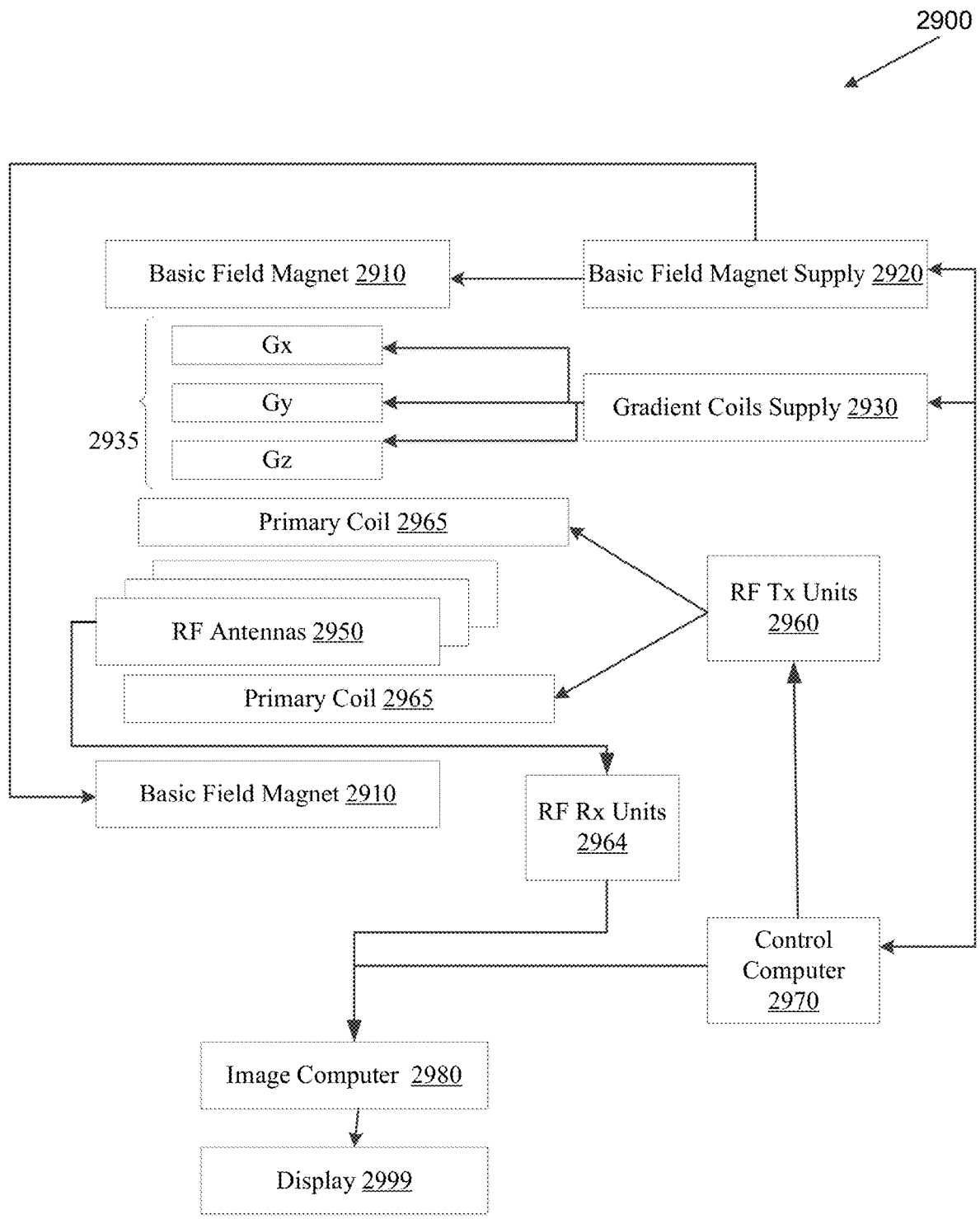
FIG. 29 illustrates an example MRI system.

FIG. 29 illustrates an example MRI apparatus 2900 that may be configured with a set of example single-layer MRI RF coils, coil elements, or arrays as described herein. Apparatus 2900 includes a basic field magnet(s) 2910 and a basic field magnet supply 2920. Ideally, the basic field magnets 2910 would produce a uniform $B_0$ field. However, in practice, the $B_0$ field may not be uniform, and may vary over an object being imaged by the MRI apparatus 2900. MRI apparatus 2900 may include gradient coils 2935 configured to emit gradient magnetic fields like $G_x$, $G_y$ and $G_z$. The gradient coils 2935 may be controlled, at least in part, by a gradient coils supply 2930. In some examples, the timing, strength, and orientation of the gradient magnetic fields may be controlled, and thus selectively adapted during an MRI procedure.

MRI apparatus 2900 may include a primary coil 2965 configured to generate RF pulses. The primary coil 2965 may be a whole body coil. The primary coil 2965 may be, for example, a birdcage coil. The primary coil 2965 may be controlled, at least in part, by an RF transmission unit 2960. RF transmission unit 2960 may provide a signal to primary coil 2965.

MRI apparatus 2900 may include a set of RF antennas 2950 that are configured to inductively couple with primary coil 2965 and generate RF pulses and to receive resulting magnetic resonance signals from an object to which the RF pulses are directed. In one embodiment, a member of the set of RF antennas 2950 may be fabricated from flexible coaxial cable. The set of RF antennas 2950 may be connected with an RF receive unit 2964.

The gradient coils supply 2930 and the RF transmission units 2960 may be controlled, at least in part, by a control computer 2970. The magnetic resonance signals received from the set of RF antennas 2950 can be employed to generate an image, and thus may be subject to a transformation process like a two dimensional fast Fourier transform (FFT) that generates pixilated image data. The transformation can be performed by an image computer 2980 or other similar processing device. The image data may then be shown on a display 2999. RF Rx Units 2964 may be connected with control computer 2970 or image computer 2980. While FIG. 29 illustrates an example MRI apparatus 2900 that includes various components connected in various ways, it is to be appreciated that other MRI apparatus may include other components connected in other ways.

In one embodiment, MRI apparatus 2900 includes control computer 2970. In one example, a member of the set of RF antennas 2950 may be individually controllable by the control computer 2970. A member of the set of RF antennas 2950 may be an example single-layer MRI RF coil array element, or an example single-layer MRI RF coil array. For example, MRI RF coil element 600, 800-1200, 1500, or 2000-2700, may be implemented as part of RF antennas 2950 illustrated in FIG. 29 or FIG. 30. In another embodiment, RF antennas 2950 may include a single-layer MRI RF array 1300, or single-layer MRI RF array 1400. In another embodiment, the set of RF antennas 2950 may include other, different combinations of example embodiments of single-layer MRI RF coil elements or example embodiments of single-layer MRF RF coil arrays.

An MRI apparatus may include, among other components, a controller (e.g., control computer 2970) and an RF coil (e.g., primary coil 2965) operably connected to the controller. The controller may provide the RF coil with a current, a voltage, or a control signal. The coil may be a whole body coil. The coil may inductively couple with an example MRI RF coil element or single-layer MRI coil array, as described herein, including MRI RF coil element 600, 800-1200, 1500, or 2000-2700, or single-layer MRI coil array 1300 or single-layer MRI coil array 1400. Control computer 2970 may provide a DC bias current, or control a DC bias control circuit (e.g., 850) to control the application of a DC bias current to single-layer MRI RF coil array elements or single-layer MRI RF coil arrays that may be part of antennas 2950.

Figure 30:
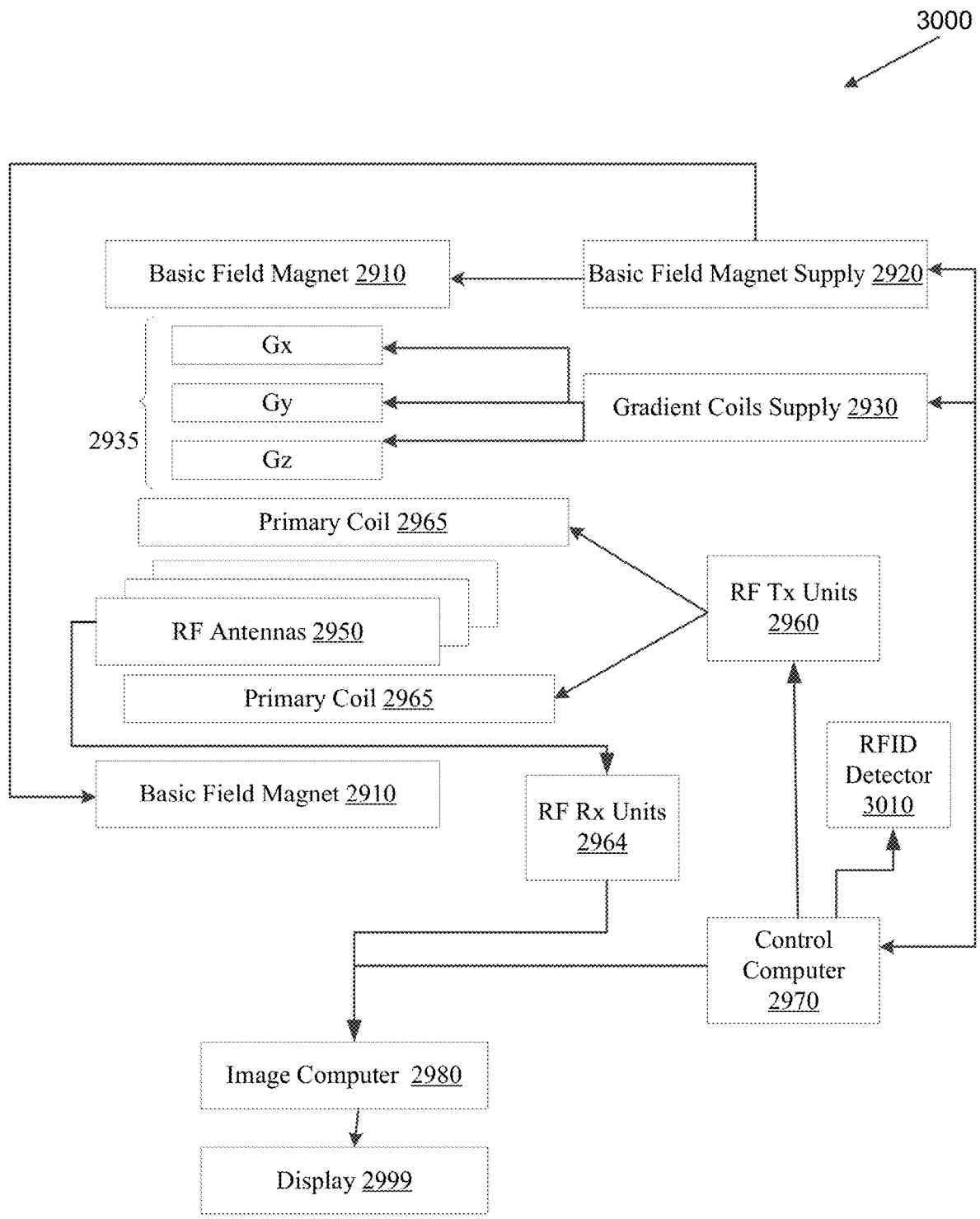
FIG. 30 illustrates an example MRI system.

FIG. 30 illustrates an embodiment of MRI apparatus 3000 that is similar to MRI apparatus 2900, but that includes additional elements and details. In this embodiment, MRI apparatus 3000 further includes detector 3010. In this embodiment, a member of antennas 2965 may be configured with a location device, as described with respect to single-layer MRI RF coil 2700 or 2814. In one embodiment, detector 3010 includes a sensor control circuit 2818 operably connected to the sensor 2816 as illustrated in FIG. 28. In this embodiment, detector 3010 is configured to receive a location signal from a member of antennas 2965 (e.g., single-layer MRI RF coil 2700 or 2814). Detector 3010 is configured to, upon determining that the member of antennas 2965 is not connected to MRI apparatus 3000 and that the member of antennas 2965 is within a threshold distance of primary coil 2965: control MRI apparatus 3000 to terminate a Tx mode. Detector 3010 may be further configured to reduce power provided to the primary coil 2965, or shut down MRI system 3000. Detector 3010 may be, in one embodiment, and RFID detector configured to receive a signal from an RFID tag. In another embodiment, detector 3010 may be another type of detector configured to receive a signal from another type of identification circuit or device.

Circuits, apparatus, systems, elements, coils, single-layer MRI RF coil elements, arrays, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Circuit", as used herein, includes but is not limited to hardware, firmware, or combinations of each to perform a function(s) or an action(s), or to cause a function or action from another circuit, logic, method, or system. Circuit may include a software controlled microprocessor, a discrete logic (e.g., ASIC), an analog circuit, a digital circuit, a programmed logic device, a memory device containing instructions, and other physical devices. A circuit may include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A single-layer magnetic resonance imaging (MRI) radio frequency (RF) coil element configured to operate in a transmit (Tx) mode and a receive (Rx) mode, the single-layer MRI RF coil element comprising:
    an LC coil;
    a matching and Tx/Rx switch circuit electrically connected with the LC coil;
    a preamplifier electrically connected with the matching and Tx/Rx switch circuit;
    where the LC coil includes at least one inductor and at least one capacitor, and a fuse electrically connected to the at least one inductor or the at least one capacitor, where the at least one inductor and the at least one capacitor resonate at a first frequency;
    where the matching and Tx/Rx switch circuit, when operating in Tx mode, electrically isolates the LC coil from the preamplifier upon the LC coil resonating with a primary coil, where the primary coil has a working frequency;
    where the LC coil, upon resonating with the primary coil, generates a local amplified Tx field based on an induced current in the LC coil, the induced current generated by inductive coupling between the LC coil and the primary coil;
    where a magnitude of the induced current or a phase of the induced current is independently adjustable;
    where the magnitude of the induced current or the phase of the induced current is configured to be varied over a range of magnitudes or phases respectively;
    where the matching and Tx/Rx switch circuit, when operating in Rx mode, electrically connects the LC coil with the preamplifier; and
    where the fuse, upon the induced current exceeding a threshold magnitude, opens,
    where the fuse being open prevents the LC coil from resonating with the primary coil.

2. The single-layer MRI RF coil element of claim 1, where the fuse is an auto-resettable fuse.

3. The single-layer MRI RF coil element of claim 1, where the primary coil is a whole body coil (WBC).

4. The single-layer MRI RF coil element of claim 1, where the LC coil includes at least one conductor, where the at least one conductor is a conductive metal trace or a flexible co-axial cable.

5. The single-layer MRI RF coil element of claim 1, where the matching and Tx/Rx switch circuit is a capacitive matching and Tx/Rx switch circuit.

6. The single-layer MRI RF coil element of claim 5, where the capacitive matching and Tx/Rx switch circuit comprises:
    a matching capacitor having a first terminal and a second terminal;
    a first inductor having a first terminal and a second terminal;
    a first capacitor having a first terminal connected to the first terminal of the first inductor; and
    a first PIN diode having a first terminal and a second terminal, the first terminal of the first PIN diode connected to the second terminal of the first capacitor, and the second terminal of the first PIN diode connected to the second terminal of the first inductor,
    where the second terminal of the first inductor is connected to a first input terminal of the preamplifier, and where the second terminal of the matching capacitor is connected to a second input terminal of the preamplifier,
    where the matching and Tx/Rx switch circuit, upon application of a forward bias to the first PIN diode, electrically isolates the preamplifier from voltage induced in the LC coil by mutual inductance with the primary coil.

7. The single-layer MRI RF coil element of claim 1, where the matching and Tx/Rx switch circuit is an inductive matching and Tx/Rx switch circuit.

8. The single-layer MRI RF coil element of claim 7, where the inductive matching and Tx/Rx switch circuit comprises:
    a matching capacitor having a first terminal and a second terminal;
    a matching inductor having a first terminal and a second terminal, the first terminal of the matching inductor connected to the first terminal of the matching capacitor;
    a first inductor having a first terminal and a second terminal, where the first terminal of the first inductor is connected to the first terminal of the matching inductor;
    a first PIN diode having a first terminal and a second terminal, the first terminal of the first PIN diode connected to the second terminal of the first inductor, and the second terminal of the first PIN diode connected to the second terminal of the matching capacitor;
    where the second terminal of the matching capacitor is connected to a first input terminal of the preamplifier, and where the second terminal of the matching inductor is connected to a second input terminal of the preamplifier, and
    where the matching and Tx/Rx switch circuit, upon application of a forward bias to the first PIN diode, isolates the preamplifier from voltage induced in the LC coil by mutual inductance with the primary coil.

9. A single-layer magnetic resonance imaging (MRI) radio frequency (RF) coil element for an MRI system, the single-layer MRI RF coil element configured to operate in a transmit (Tx) mode and a receive (Rx) mode, the single-layer MRI RF coil element comprising:
    an LC coil;
    a failsafe circuit electrically connected with the LC coil, where the failsafe circuit provides, upon injection of a forward DC bias current into the failsafe circuit, a first impedance, and upon the absence of the forward DC bias current, a second, higher impedance; and a preamplifier electrically connected with the failsafe circuit;

where the LC coil includes at least one inductor and at least one capacitor, where the at least one inductor and the at least one capacitor resonate at a first frequency;

where the failsafe circuit, when operating in Tx mode, electrically isolates the LC coil from the preamplifier upon the LC coil resonating with a primary coil, where the primary coil has a working frequency;

where the LC coil, upon resonating with the primary coil, generates a local amplified Tx field based on an induced current in the LC coil, the induced current generated by inductive coupling between the LC coil and the primary coil;

where a magnitude of the induced current or a phase of the induced current is independently adjustable;

where the magnitude of the induced current or the phase of the induced current is configured to be varied over a range of magnitudes or phases respectively;

where the failsafe circuit, when operating in Rx mode, electrically connects the LC coil with the preamplifier;

where the failsafe circuit, upon the single-layer MRI RF coil element being disconnected from the MRI system: provides the second, higher impedance, and reduces the magnitude of the induced current;

where the failsafe circuit comprises a first reactive element and a second reactive element, where the first and second reactive elements are configured to resonate with each other in response to the injection of the forward DC bias current, thereby increasing impedance from a first coil terminal of the LC coil to a first input terminal of the preamplifier, and where the first and second reactive elements are respectively an inductor and a capacitor or vice versa.

10. The single-layer MRI RF coil element of claim 9, where the LC coil includes at least one conductor, where the at least one conductor is a conductive metal trace or a flexible co-axial cable.

11. The single-layer MRI RF coil element of claim 9, the failsafe circuit comprising:
  a matching capacitor having a first terminal and a second terminal;
  a first inductor having a first terminal and a second terminal, the first terminal of the first inductor connected to the first terminal of the matching capacitor;
  a first capacitor having a first terminal connected to the first terminal of the first inductor;
  at least one pair of PIN diodes, the at least one pair of PIN diodes comprising:
    a first PIN diode having a first terminal and a second terminal, the first terminal of the first PIN diode connected to the second terminal of the first capacitor,
    a second PIN diode having a first terminal and a second terminal, the second terminal of the second PIN diode connected to the second terminal of the first PIN diode, and the first terminal of the second PIN diode connected to the second terminal of the first inductor,
  where the second terminal of the first inductor is connected to the first input terminal of the preamplifier, and where the second terminal of the matching capacitor is connected to a second input terminal of the preamplifier;
  at least one pair of signal diodes comprising:
    a first signal diode having a first terminal and a second terminal, the first terminal of the first signal diode connected at a first node between the second terminal of the matching capacitor and the second input terminal of the preamplifier, and the second terminal of the first signal diode connected at a first node between the second terminal of the first inductor and the first input terminal of the preamplifier; and
    a second signal diode having a first terminal and a second terminal, the second terminal of the second signal diode connected at a second node between the second terminal of the matching capacitor and the second input terminal of the preamplifier, and the first terminal of the second signal diode connected at a second node between the second terminal of the first inductor and the first input terminal of the preamplifier;
  where the at least one pair of signal diodes, upon the application of an induced voltage across the matching capacitor to the at least one pair of signal diodes, passively decouples the single-layer MRI RF coil element from the primary coil;
  where the at least one pair of PIN diodes, when forward biased, presents the first impedance;
  where the at least one pair of PIN diodes, when not forward biased, presents the second, higher impedance that prevents the first capacitor and the first inductor from resonating; and
  where the matching capacitor is distinct from the first and second reactive elements, where the first capacitor is the first reactive element, and where the first inductor is the second reactive element.

12. The single-layer MRI RF coil element of claim 11, where the first signal diode and the second signal diode are RF limiting diodes, or passive diodes.

13. The single-layer MRI RF coil element of claim 9, where the failsafe circuit comprises:
  a matching inductor having a first terminal and a second terminal;
  a first capacitor having a first terminal and a second terminal, the first capacitor connected at the first terminal of the first capacitor with the first terminal of the matching inductor;
  a first inductor having a first terminal and a second terminal, the first inductor connected at the first terminal of the first inductor to the first terminal of the first capacitor;
  at least one pair of PIN diodes, comprising:
    a first PIN diode having a first terminal and a second terminal, the first terminal of the first PIN diode connected to the second terminal of the first inductor,
    a second PIN diode having a first terminal and a second terminal, the second terminal of the second PIN diode connected to the second terminal of the first PIN diode, and the first terminal of the second PIN diode connected to the second terminal of the first capacitor,
  where the second terminal of the first capacitor is connected to the first input terminal of the preamplifier, and where the second terminal of the matching inductor is connected to a second input terminal of the preamplifier;
  at least one pair of signal diodes, comprising:
    a first signal diode having a first terminal and a second terminal, the first terminal of the first signal diode connected at a first node between the second terminal of the matching inductor and the second input terminal of the preamplifier, and the second terminal of the first signal diode connected at a first node between the second terminal of the first capacitor and the first input terminal of the preamplifier; and a second signal diode having a first terminal and a second terminal, the first terminal of the second signal diode connected at a second node between the second terminal of the first capacitor and the first input terminal of the preamplifier, and the second terminal of the second signal diode connected at a second node between the second terminal of the matching inductor and the second input terminal of the preamplifier;

where the at least one pair of signal diodes, upon the application of an induced voltage across the matching inductor to the at least one pair of signal diodes, passively decouples the single-layer MRI RF coil element from the primary coil;

where the at least one pair of PIN diodes, when not forward biased, presents the second, higher impedance that prevents the first inductor and the first capacitor from resonating; and where the matching inductor is distinct from the first and second reactive elements, where the first inductor is the first reactive element, and where the first capacitor is the second reactive element.

14. The single-layer MRI RF coil element of claim 9, where the LC coil further includes a fuse connected to the at least one inductor or the at least one capacitor;

where the fuse, upon the induced current exceeding a threshold magnitude, opens; and where the fuse being open prevents the LC coil from resonating with the primary coil.

15. The single-layer MRI RF coil element of claim 9, where the failsafe circuit further comprises a third reactive element configured to resonate with the second reactive element in response to the absence of the forward DC bias current and a voltage across the third reactive element exceeding a threshold, thereby increasing impedance from the first coil terminal to a second coil terminal of the LC coil, and where the first and third reactive elements are capacitors, and the second reactive element is an inductor, or vice versa.

16. The single-layer MRI RF coil element of claim 15, where the second and third reactive elements are directly connected from the first coil terminal respectively to the first input terminal and the second coil terminal.

17. The single-layer MRI RF coil element of claim 15, where the first and second reactive elements are configured so as not to resonate with each other in response to the absence of the forward DC bias current, thereby decreasing the impedance from the first coil terminal to the first input terminal, and where the second and third reactive elements are configured so as not to resonate with each other in response to the voltage being less than the threshold, thereby decreasing the impedance from the first coil terminal to the second coil terminal.

18. A magnetic resonance imaging (MRI) system comprising:

a primary coil;

a single-layer MRI radio frequency (RF) coil configured to operate in a transmit (Tx) or receive (Rx) mode, the single-layer MRI RF coil including:
an LC coil;
a failsafe circuit electrically connected with the LC coil, where the failsafe circuit provides, upon injection of a forward DC bias current into the failsafe circuit, a first impedance, and upon the absence of the forward DC bias current, a second, higher impedance; and a preamplifier electrically connected with the failsafe circuit;

where the LC coil includes at least one inductor and at least one capacitor, where the at least one inductor and the at least one capacitor resonate at a first frequency;

where the failsafe circuit, when operating in Tx mode, electrically isolates the LC coil from the preamplifier upon the LC coil resonating with the primary coil, where the primary coil has a working frequency;

where the LC coil, upon resonating with the primary coil, generates a local amplified Tx field based on an induced current in the LC coil, the induced current generated by inductive coupling between the LC coil and the primary coil;

where a magnitude of the induced current or a phase of the induced current is independently adjustable;

where the magnitude of the induced current or the phase of the induced current is configured to be varied over a range of magnitudes or phases respectively;

where the failsafe circuit, when operating in Rx mode, electrically connects the LC coil with the preamplifier;

where the failsafe circuit, upon the single-layer MRI RF coil being disconnected from the MRI system:
provides the second, higher impedance, and
reduces the magnitude of the induced current;

where the LC coil further includes a fuse connected to the at least one inductor or the at least one capacitor;

where the fuse, upon the induced current exceeding a threshold magnitude, opens; and where the fuse being open prevents the LC coil from resonating with the primary coil.

19. The MRI system of claim 18, wherein the single-layer MRI RF coil further comprises:

an identification circuit configured to provide a location signal, the location signal including location information about the location of the single-layer MRI RF coil in relation to the primary coil.

20. The MRI system of claim 19, where the identification circuit is an RFID device.

21. The MRI system of claim 19, further comprising:

an RFID sensor configured to receive the location signal; and an RFID control circuit operably connected to the RFID sensor, the RFID control circuit configured to, upon determining that the single-layer MRI RF coil is not connected to the MRI system and that the single-layer MRI RF coil is within a threshold distance of the primary coil:

control the MRI system to terminate a Tx mode, reduce power provided to the primary coil, or shut down the MRI system.

22. A single-layer magnetic resonance imaging (MRI) radio frequency (RF) coil element comprising:

an LC coil having a first coil terminal and a second coil terminal, where the LC coil includes at least one inductor and at least one capacitor;

a preamplifier having a first input terminal and a second input terminal; and a failsafe circuit comprising:
a circuit leg comprising a first diode switch and a first reactive element electrically coupled in series, where the circuit leg is connected from the first coil terminal to the first input terminal;

a second reactive element and a third reactive element directly connected from the first coil terminal respectively to the first input terminal and the second coil terminal; and a second diode switch connected from the first input terminal to both the second input terminal and the second coil terminal;

where the first diode switch is configured to electrically couple the first and second reactive elements in parallel in response to a direct current (DC) signal, whereby the first and second reactive elements resonate to increase impedance from the first coil terminal to the first input terminal and to isolate the preamplifier;

where the second diode switch is configured to electrically couple the second and third reactive elements in parallel in response to a voltage across the second diode switch exceeding a threshold, whereby the second and third reactive elements resonate to increase impedance from the first coil terminal to the second coil terminal and to decrease a magnitude of current induced in the LC coil;

where the first and third reactive elements are capacitors, and the second reactive element is an inductor, or vice versa.

23. The single-layer MRI RF coil element of claim 22, where the first diode switch is configured to electrically decouple the first and second reactive elements from in parallel in response to an absence of the direct current (DC) signal, whereby the first and second reactive elements do not resonate and the impedance from the first coil terminal to the first input terminal decreases; and where the second diode switch is configured to electrically decouple the second and third reactive elements from in parallel in response to the voltage across the second diode switch being less than the threshold, whereby the second and third reactive elements do not resonate and the impedance from the first coil terminal to the second coil terminal decreases.

* * * * *